(12) United States Patent
Setta et al.

(10) Patent No.: US 8,349,540 B2
(45) Date of Patent: Jan. 8, 2013

(54) SEMICONDUCTOR DEVICE MANUFACTURING METHOD

(75) Inventors: Yuji Setta, Kawasaki (JP); Hiroki Futatsuya, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 631 days.

(21) Appl. No.: 11/698,062

(22) Filed: Jan. 26, 2007

(65) Prior Publication Data

US 2007/0178411 A1 Aug. 2, 2007

(30) Foreign Application Priority Data

Jan. 27, 2006 (JP) .................................. 2006-019549
Dec. 28, 2006 (JP) .................................. 2006-355162

(51) Int. Cl.
*G03F 7/20* (2006.01)
(52) U.S. Cl. ........................................................ 430/311
(58) Field of Classification Search ............... 430/5, 311
See application file for complete search history.

(56) References Cited

U.S. PATENT DOCUMENTS

| | | | |
|---|---|---|---|
| 5,621,498 A | 4/1997 | Inoue et al. | |
| 5,879,838 A * | 3/1999 | Lee | 430/5 |
| 7,436,491 B2 | 10/2008 | Fukuhara | |
| 7,659,040 B2 | 2/2010 | Setta | |
| 7,790,335 B2 | 9/2010 | Minami | |
| 2003/0008216 A1* | 1/2003 | Bula et al. | 430/5 |
| 2005/0076321 A1* | 4/2005 | Smith | 716/19 |
| 2005/0164129 A1 | 7/2005 | Minami | |
| 2006/0051979 A1* | 3/2006 | Yoshinaga | 438/795 |
| 2006/0072095 A1 | 4/2006 | Kudo et al. | |
| 2006/0132748 A1 | 6/2006 | Fukuhara | |
| 2006/0269848 A1 | 11/2006 | Setta | |

FOREIGN PATENT DOCUMENTS

| | | |
|---|---|---|
| JP | 5-326370 | 12/1993 |
| JP | 2002-122976 A | 4/2002 |
| JP | 2003-234285 A | 8/2003 |
| JP | 2006-179516 | 7/2006 |
| JP | 2006-337474 | 12/2006 |
| WO | WO-2004-077155 A1 | 9/2004 |
| WO | WO-2004/090952 A1 | 10/2004 |

OTHER PUBLICATIONS

Japanese Office Action mailed Sep. 6, 2011 for corresponding Japanese Application No. 2006-355162, with partial English-language translation. Japanese Office Action mailed Mar. 27, 2012 for corresponding Japanese Application No. 2006-355162 with partial English-language translation.
USPTO, [DUDA] Non-Final Office Action mailed May 25, 2012, in related U.S. Appl. No. 13/218,585 [pending].
USPTO, [DUDA] Notice of Allowance and Fees Due, Oct. 17, 2012, in related U.S. Appl. No. 13/218,585 [allowed].

* cited by examiner

*Primary Examiner* — Kathleen Duda
(74) *Attorney, Agent, or Firm* — Fujitsu Patent Center

(57) ABSTRACT

The semiconductor device manufacturing method comprises the step of transferring patterns formed on a reticle to a semiconductor substrate by an exposure with oblique incidence illumination. In the step of making the exposure with oblique incidence illumination, the exposure is made with an aperture stop 16 including a first ring-shaped aperture 22, and a plurality of second apertures 24a1-24a4 formed around the first ring-shaped aperture 22. The exposure is made with an aperture stop 16 having the first ring-shaped aperture 22 which can transfer patterns arranged at a medium pitch to a relatively large pitch with a relatively high resolution and the second aperture 24a1-24a4 which can transfer patterns arranged at a relatively small pitch with a relatively high resolution, whereby even when the patterns are arranged at various pitch values, the DOF can be surely sufficient, and the patterns can be stably transferred.

13 Claims, 48 Drawing Sheets

SEMICONDUCTOR DEVICE MANUFACTURING METHOD

CROSS-REFERENCE TO RELATED APPLICATION

This application is based upon and claims the benefit of priorities from the prior Japanese Patent Application No. 2006-19549, filed on Jan. 27, 2006, and the prior Japanese Patent Application No. 2006-355162, filed on Dec. 28, 2006, the entire contents of which are incorporated herein by reference.

BACKGROUND OF THE INVENTION

The present invention relates to a semiconductor device manufacturing method, more specifically, a semiconductor device manufacturing method using oblique incidence illumination.

Semiconductor devices have been continuously required to be micronized, and recently, patterns of a line width shorter than a wavelength of the exposure light source used in the manufacturing process of a semiconductor device are required to be formed.

Accompanying this, recently various illumination techniques for improving the resolution for transferring patterns are proposed. As such illumination technique, oblique incidence illumination (off-axis illumination), for example, is proposed. The oblique incidence illumination is largely divided in modified illumination and annular illumination. As major types of the modified illumination, e.g., two-point illumination (double polar illumination), wherein two apertures are formed in the aperture stop of the illumination system, is known, and four-point illumination (quadrupole illumination), wherein four apertures are formed in the aperture stop of the illumination system, is known. On the other hand, in the annular illumination, an annular aperture is provided in the aperture stop of the illumination system. The size of the aperture of the annular illumination is expressed by the outer sigma ($\sigma_{out}$) the inner sigma ($\sigma_{in}$) or others. FIG. 18 is a plan view of the conventional aperture stop of the annular illumination. In FIG. 18, the outer border indicates the border of the effective region of the aperture stop. As illustrated in FIG. 18, a ring-shaped aperture 122 is formed in the annular illumination stop. FIG. 19 is a graph of the relationship between the pitch of patterns and the depth of focus (DOF). In FIG. 19, the pitch of patterns is taken on the horizontal axis, and on the vertical axis, the DOF is taken. In FIG. 19, the DOF is the value with the exposure latitude is 4%.

In FIG. 19, the ● marks indicate the DOF given when the conventional annular illumination stop 116 illustrated in FIG. 18 is used in the illumination system. As indicated by the ● marks in FIG. 19, when the exposure is made with the conventional annular illumination stop, the DOF cannot be always sufficiently large in the range where the pitch of the patterns is about 300 nm or over.

FIG. 20A is a plan view of the layout of the mask pattern for forming holes. In FIG. 20A, on the left side of the drawing, patterns 118a for forming holes are formed on the reticle with high density. On the other hand, on the right side of the drawing of FIG. 20A, an isolated pattern 118b for forming a hole is formed on the reticle.

FIG. 20B is a graph of critical dimension-focus (CD-FOCUS) curves (Part 1). In FIG. 20B, the □ marks indicate the CD-FOCUS curve of the case of the left side of the drawing of FIG. 20A, i.e., the patterns 118a for forming holes are formed relatively densely. In FIG. 20B, the ○ marks indicate the case of the right side of the drawing of FIG. 20A, i.e., the pattern 118b for forming a hole is formed isolated. Such CD-FOCUS curves show what influences changes of the DOF give on the resist size. In FIG. 20B, the shift of the focus in exposing the patterns is taken on the horizontal axis. On the vertical axis, the size of the patterns transferred on a resist is taken, and relative pattern sizes to the maximum size of the patterns which is set at 100 are plotted. The inclination of an upward parabola being relatively blunt means that the DOF is relatively wide, and the focus margin is relatively large. On the other hand, the inclination of an upward parabola being relatively acute means that the DOF is relatively narrow, and the focus margin is relatively small. The focus value at the summit of a parabola is called a best focus, and generally the resist size is largest at the best focus. Generally, in comparing the DOF, the focus range where the resist size is 90% or above of the resist size at the best focus is used as the effective DOF.

In FIG. 20B, as indicated by the ○ marks, when the pattern 118b for forming a hole is isolated, the focus margin is considerably small.

As a technique of making the focus margin larger, it is proposed to use the exposure technique using together the annular illumination stop and the sub-resolution assist feature (SRAF) technique.

FIG. 21A is a plan view of the mask pattern having assist patterns for increasing the DOF. FIG. 21B a graph of CD-FOCUS curves (Part 2). As illustrated in FIG. 21A, the patterns 121 for increasing the DOF are formed around a pattern for forming a hole.

The □ marks in FIG. 21B are the same as the □ marks in FIG. 20B, i.e., the left side of the drawing of FIG. 20A, i.e., the case that the patterns 118a for forming holes are formed with relative high density. In FIG. 21B, the ○ marks are the same as the ○ marks in FIG. 20B, i.e., the right side of the drawing of FIG. 20A, i.e., the case that the pattern 118b for forming a hole is formed isolated. In FIG. 21B, the △ marks indicate the case of FIG. 21A, i.e., the case that the assist patterns 121 are formed around the pattern 118c for forming a hole.

As seen in FIG. 21B, the assist patterns 121 are suitably provided (see FIG. 21A), whereby the focus margin can be increased in comparison with the case that the pattern for forming a hole is isolated (see FIG. 20A).

In FIG. 19, the ○ marks indicate the graph of the case that the assist patterns are suitably formed on the reticle over the region where the patterns are dense to the region where the patterns are rare. As indicated by the ○ marks in FIG. 19, the use of the SRAF technique could somewhat increase the DOF.

Following references disclose the background art of the present invention.

[Patent Reference 1]
Specification of Japanese Patent Application Unexamined Publication No. 2002-122976

[Patent Reference 2]
Specification of Japanese Patent Application Unexamined Publication No. 2003-234285

However, as indicated by the ○ marks in FIG. 19, even the combined use of the oblique incidence illumination technique and the SRAF technique cannot always give sufficiently large DOF in the range of, e.g., about 300 nm-600 nm pattern pitch. Then, a technique which can transfer with a high resolution all patterns which are formed on a reticle at various pitches is expected.

SUMMARY OF THE INVENTION

An object of the present invention is to provide a semiconductor device manufacturing method which can transfer stably with a high resolution all patterns which are formed on a reticle at various pitches.

According to one aspect of the present invention, there is provided a semiconductor device manufacturing method comprising the step of transferring patterns formed on a reticle to a semiconductor substrate by the exposure using oblique incidence illumination, in the step of making the exposure with oblique incidence illumination, the exposure is made with an aperture stop including a first ring-shaped aperture, and a plurality of second apertures formed around the first ring-shaped aperture.

According to another aspect of the present invention, there is provided a semiconductor device manufacturing method comprising the step of transferring patterns formed on a reticle to a semiconductor substrate by an exposure using oblique incidence illumination, the step of making the exposure with oblique incidence illumination comprising the steps of: making an exposure with a first aperture stop including a first ring-shaped aperture formed in a center part; and making an exposure with a second aperture stop including a plurality of second apertures formed in a peripheral part.

According to further another aspect of the present invention, there is provided a semiconductor device manufacturing method comprising the step of transferring patterns formed on a reticle to a semiconductor substrate by an exposure using oblique incidence illumination, in the step of making the exposure with oblique incidence illumination, the exposure is made with an aperture stop including a first aperture, a second ring-shaped aperture formed around the first aperture, and a third ring-shaped aperture formed around the second aperture.

According to further another aspect of the present invention, there is provided a semiconductor device manufacturing method comprising the step of transferring patterns formed on a reticle to a semiconductor substrate by an exposure using oblique incidence illumination, the step of making the exposure with oblique incidence illumination comprises the steps of: making an exposure with a first aperture stop including a first aperture; making an exposure with a second aperture including a second ring-shaped aperture having an inner diameter which is larger than an outer diameter of the first aperture; and making an exposure with a third aperture stop including a third ring-shaped aperture having an inner diameter which is larger than an outer diameter of the second aperture.

According to the present invention, the exposure is made with an aperture stop having the first ring-shaped aperture which can transfer patterns arranged at a medium pitch to a relatively large pitch with a relatively high resolution and the second aperture which can transfer patterns arranged at a relatively small pitch with a relatively high resolution, whereby even when the patterns are arranged at various pitch values, the DOF can be surely sufficient, and the patterns can be stably transferred.

According to the present invention, the first exposure is made with the first aperture stop having the first ring-shaped aperture which can transfer patterns arranged at a medium pitch to a relatively large pitch with a relatively high resolution, and the second exposure is made with a second aperture stop having the second aperture which can transfer patterns arranged at a relatively small pitch with a relatively high resolution, whereby even when the patterns are arranged at various pitch values, the DOF can be surely sufficient, and the patterns can be stably transferred.

According to the present invention, patterns are transferred with an aperture stop further having the third ring-shaped aperture formed around the first ring-shaped aperture, whereby even when the patterns for forming holes are arranged in various directions, the DOF can be surely sufficient, and the patterns can be stably transferred.

According to the present invention, patterns are transferred with an aperture stop having the first circular aperture formed in the center, the second ring-shaped aperture formed around the first aperture and the third ring-shaped aperture formed around the second aperture. The first aperture contributes to transferring isolated patterns with a relatively high resolution. The second aperture contributes to transferring patterns arranged at a medium pitch to a relatively large pitch with a relatively high resolution. The third aperture contributes to transferring patterns arranged at a relatively small pitch with a relatively high resolution. The third aperture also contributes to transferring patterns arranged in a various direction with a relatively high resolution. Thus, according to the present invention, even when patterns for forming holes are set at various pitch values in various direction, the DOF can be surly sufficient, and the patterns can be stably transferred.

BRIEF DESCRIPTION OF THE DRAWINGS

FIG. 7 is a plan view of a reticle with assist patterns formed on.

DETAILED DESCRIPTION OF THE INVENTION

A First Embodiment

Figure 1:
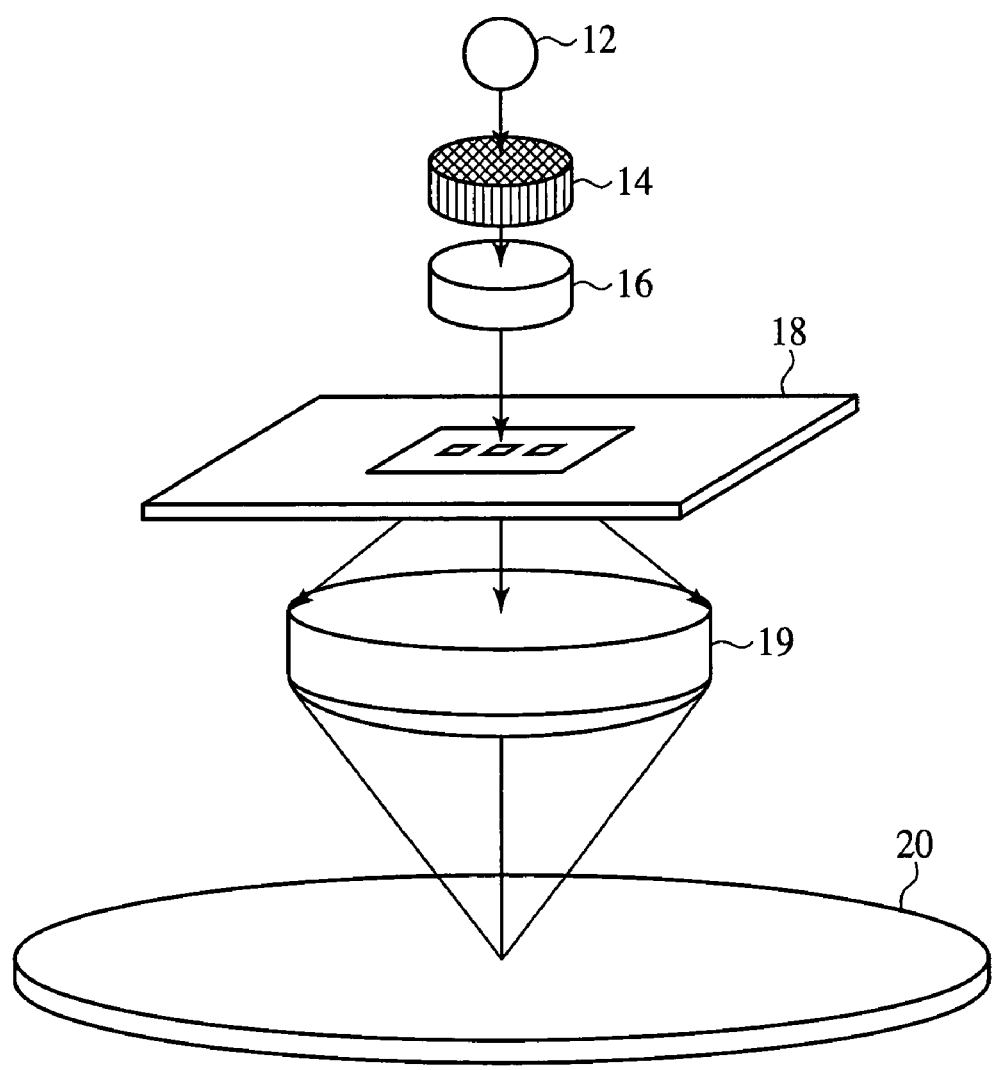
FIG. 1 is a conceptual view of the aligner used in the semiconductor device manufacturing method according to a first embodiment of the present invention.
Figure 2:
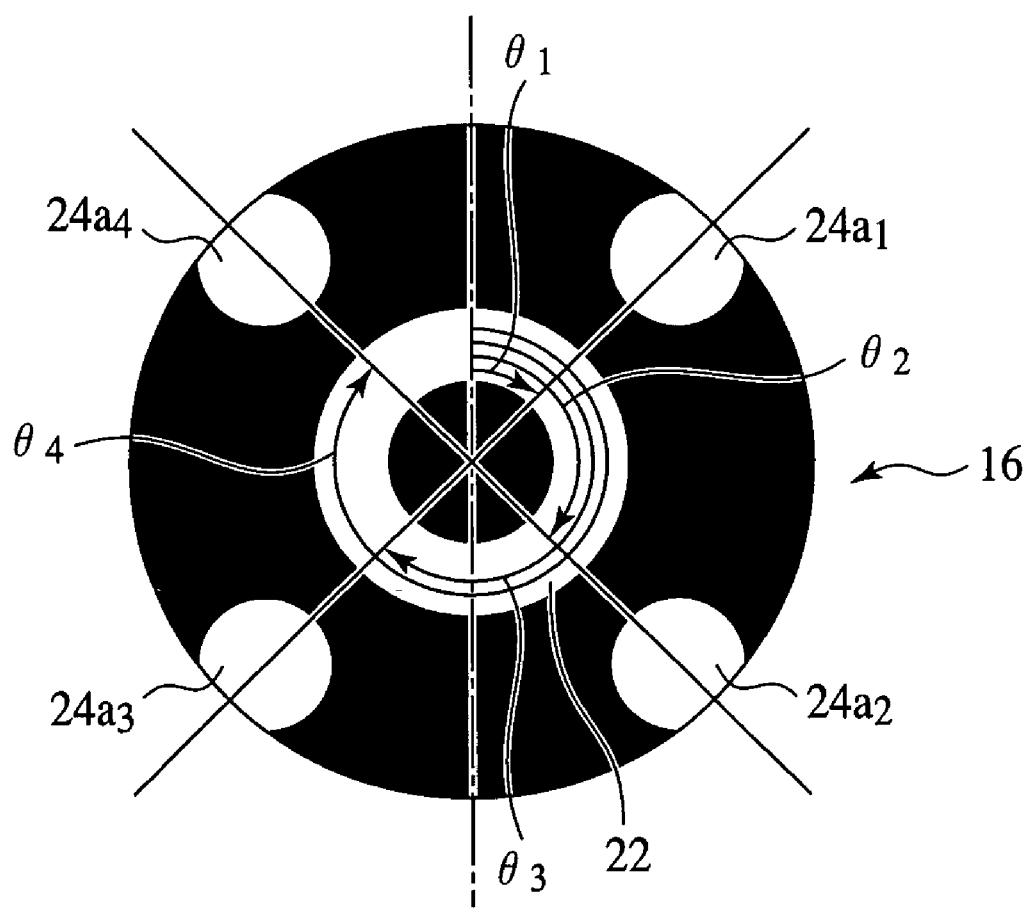
FIG. 2 is a plan view of an aperture stop used in the semiconductor device manufacturing method according to the first embodiment of the present invention.
Figure 3A:
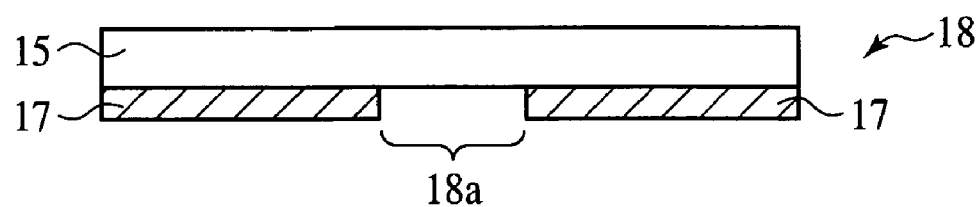
FIGS. 3A and 3B are conceptual views of the principle of the halftone phase shift mask.
Figure 3B:
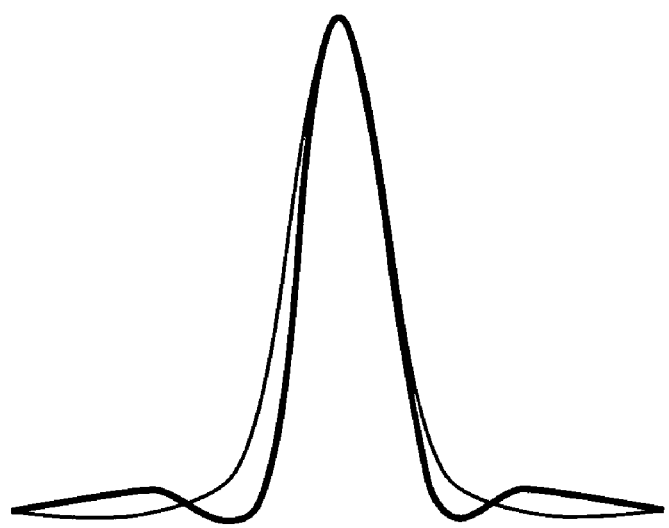

The semiconductor device manufacturing method according to a first embodiment of the present invention will be explained with reference to FIGS. 1 to 5B. FIG. 1 is a conceptual view of the aligner used in the semiconductor device manufacturing method according to the present embodiment. FIG. 2 is a plan view illustrating the aperture stop used in the semiconductor device manufacturing method according to the present embodiment. FIGS. 3A and 3B are conceptual views illustrating the principle of a halftone phase shift mask.

Figure 4:
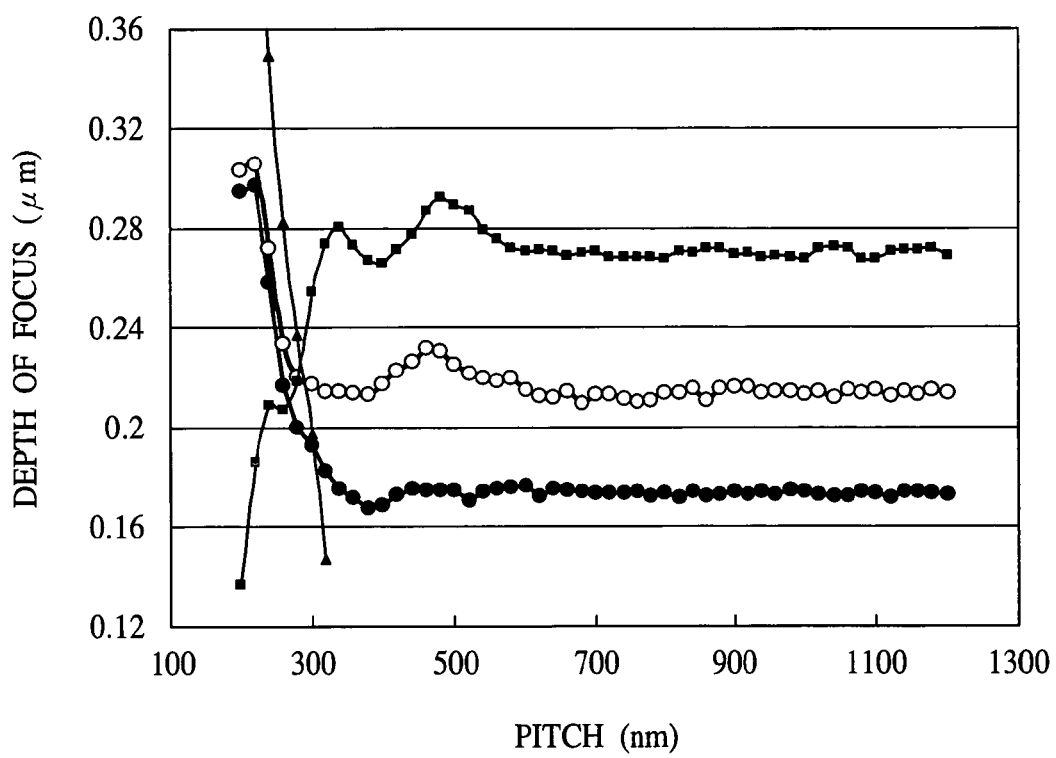
FIG. 4 is a graph (Part 1) of the relationship between the pattern pitch and the DOF.
Figure 5A:
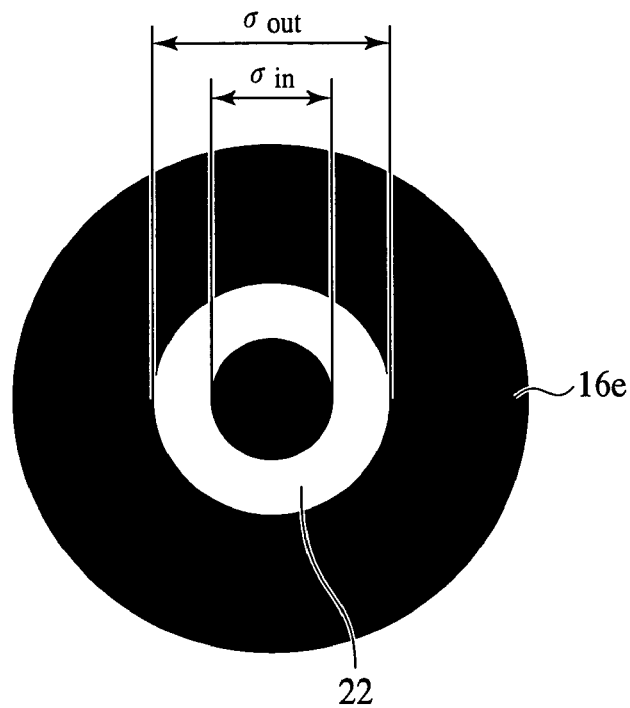
FIGS. 5A and 5B are plan views of the annular illumination stop and the quadrupole illumination stop.
Figure 5B:
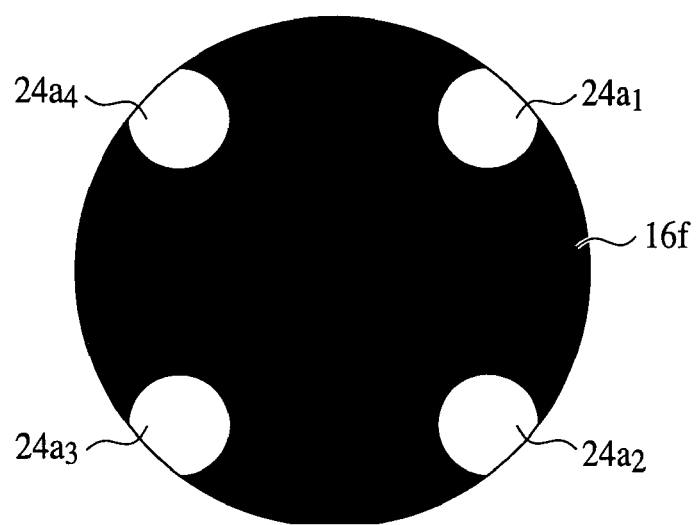

FIG. 4 is a graph of the relationship between the pattern pitch and the DOF. FIGS. 5A and 5B are plan views of the annular illumination stop and the quadrupole illumination stop.

First, the aligner used in the exposure step of the present embodiment will be explained with reference to FIG. 1.

As illustrated in FIG. 1, a light source 12 is, e.g., an ArF excimer laser. In FIG. 1, the light source 12 is schematically illustrated.

Below the light source 12, a fly eye 14 for aligning light from the light source 12 in the same direction is provided.

Below the fly eye 14, an aperture stop 16 is provided.

The aperture stop 16 used in the present embodiment is an aperture stop whose aperture is not positioned on the optical axis, i.e., an aperture stop for the oblique incidence illumination. In other words, the aperture stop 16 used in the present embodiment, as illustrated in FIG. 2, includes a first ring-shaped aperture 22 formed at the center, and a plurality of second apertures 24a1-24a4 formed around the first aperture 22. The outer sigma ($\sigma_{out}$) of the first aperture 22 and the inner sigma ($\sigma_{in}$) are set respectively smaller than the outer sigma % out and the inner sigma $\sigma_{in}$ of the aperture 122 of the conventional annular illumination stop. The second aperture 24a1-24a4 are arranged in square directions of the aperture stop 16 respectively corresponding to the directions from the center of a reticle 18 to the four corners thereof. The second apertures 24a1-24a4 are arranged with parts thereof being outside an effective region (the outermost border in FIG. 2) of the aperture stop 16. The effective region of the aperture stop is a region which can actually function as the stop. In FIG. 2, the outside of the effective region of the stop is not illustrated, but actually, the outside of an effective region of an aperture stop is generally shaded.

The respective sizes of the aperture stop 16 are as exemplified below. The outer diameter of the effective region of the aperture stop 16 is, e.g., 1.0. The size of the outer sigma ($\sigma_{out}$) of the first aperture 22 is, e.g., 0.4-0.5. The size of the inner sigma ($\sigma_{in}$) of the first aperture 22 is, e.g., 0.2-0.3. The distance between the center of the aperture stop 16 and the centers of the second apertures 24a1-24a4 is, e.g., 0.8-0.9. These sizes are values given by normalizing the outer diameter of the effective region of the aperture stop 16 to be 1.0. The apertures 24a1-24a4 are formed in the directions as exemplified below with a straight line (hereinafter called a center line) which is parallel with one side of the reticle 18 and passes the center of the aperture stop 16 set as the reference. For example, the angle θ1 formed by the line segment interconnecting the center of the aperture stop 16 and the center of the aperture 24a1 and the center line of the aperture stop 16 is set at, e.g., 45 degrees. The angle θ2 formed by the line segment interconnecting the center of the aperture stop 16 and the center of the aperture 24a2 and the center line of the aperture stop 16 is set at, e.g., 135 degrees. The angle θ3 formed by the line segment interconnecting the center of the aperture stop 16 and the center of the aperture 24a3 and the center line of the aperture stop 16 is set at, e.g., 225 degrees. The angle θ4 formed by the line segment interconnecting the center of the aperture stop 16 and the center of the aperture 24a and the center line of the aperture stop 16 is set at, e.g., 315 degrees.

The area S1 of the aperture 22 and the total S2 of the areas of the apertures 24a1-24a4 are substantially equal to each other.

The diameter of the apertures 24a1-24a4 is set smaller than the outer sigma $\sigma_{out}$ of the aperture 22.

Preferably, the central position $R_p$ of the respective apertures 24a1-24a4 is set as follows when a wavelength of the light source used in the exposure is λ, and an arrangement pitch is P.

$$R_p = \sin^{-1}\{\lambda/[(\sqrt{2}) \times P]\}$$

Such aperture stop 16 is used in the present embodiment for the reason which will be detailed later.

Below the aperture stop 16, the reticle (photo mask) 18 having patterns for forming, e.g., holes formed on is provided.

As illustrated in FIGS. 3A and 3B, the reticle 18 is a halftone phase shift mask 18, e.g., having semi-transmissive metal thin film patterns 17 of MoSi or others formed on a quartz dry plate 15.

FIG. 3A is a sectional view of the halftone phase shift mask, and FIG. 3B shows the intensity distribution of the light transmitted by the reticle. In FIG. 3B, the thick line indicates the light intensity distribution given by using the halftone phase shift mask, and the thin line in FIG. 3B indicates the light intensity distribution given by a binary mask.

The halftone phase shift mask 18 is a mask wherein slight light passes through the semi-transmissive metal thin film patterns 17 while the phase of light in the aperture 18a is reversed with respect to the parts of the metal thin film patterns 17, whereby the light intensity is decreased at the edge part where the respective light is superimposed on each other. As indicated by the thick line in FIG. 3B, at the edge part of the aperture 18a, slight light transmitted by the semi-transmissive metal thin film patterns 17 and the light which has passed through the aperture 18a null each other, whereby the light intensity distribution is decreased. Accordingly, the halftone phase shift mask 18 is advantageous in obtaining high resolutions.

The reticle 18 can be a binary mask which is a mask, e.g., having patterns of shade film of chrome or others formed on a quartz dry plate. The reticle 18 can be a Levinson phase shift mask having the effect that when specific light is transmitted by the quart dry plate, the light has the phases of 0 degree and 180 degrees.

Below the reticle 18, a projection lens 19 is disposed.

Below the projection lens 19, a semiconductor substrate (semiconductor wafer) 22 is disposed.

By the exposure by such aligner, the patterns formed on the reticle 18 are transferred on the semiconductor substrate 20.

In the present embodiment, the aperture stop illustrated in FIG. 2 is used for the following reason.

FIG. 4 is a graph of the relationship between the pitch of the patterns and the DOF. In FIG. 4, the pitch of the patterns is taken on the horizontal axis, and the DOF is taken on the vertical axis. The DOF in FIG. 4 is the value with the exposure latitude being 4%.

Figure 18:
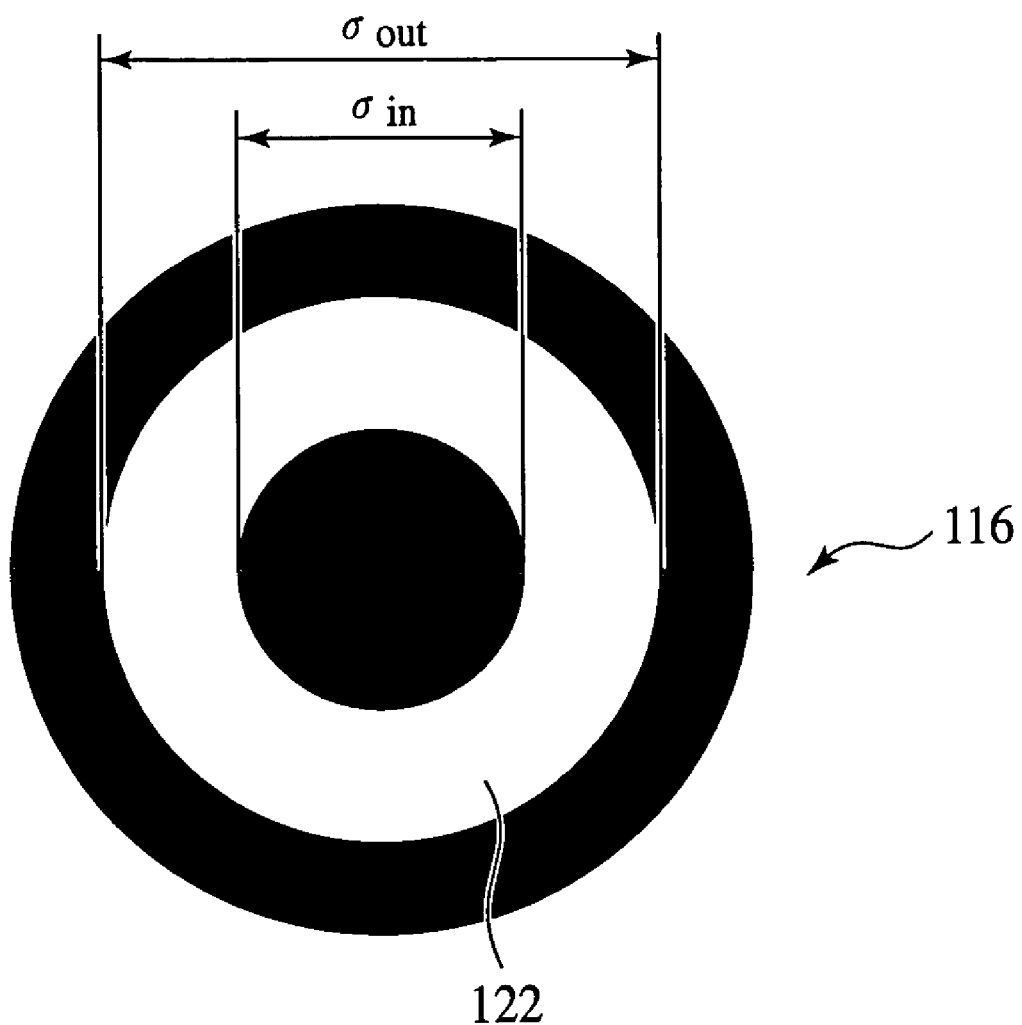
FIG. 18 is a plan view of the aperture stop of the conventional annular illumination.
Figure 19:
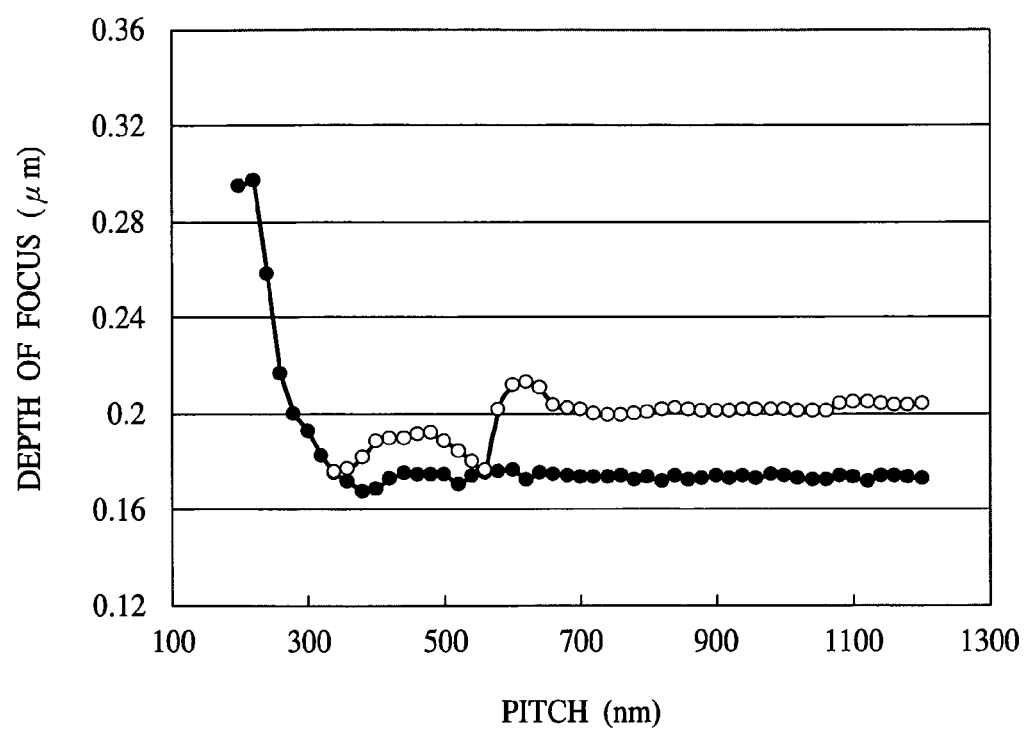
FIG. 19 is a graph of the relationship between the pattern pitch and the DOF.
Figure 20A:
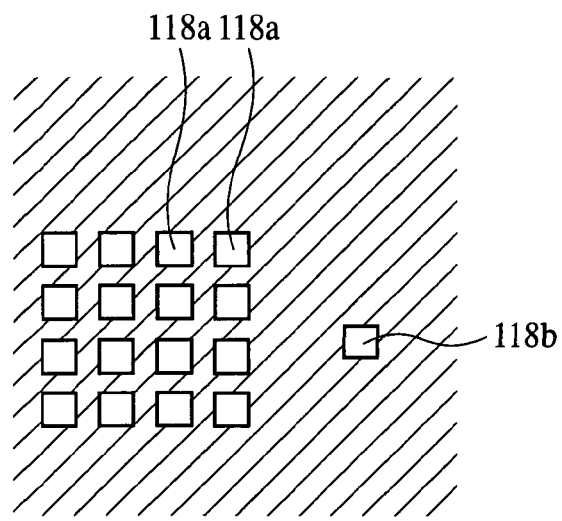
FIGS. 20A and 20B are a plan view of the layout of the patterns for forming holes.
Figure 20B:
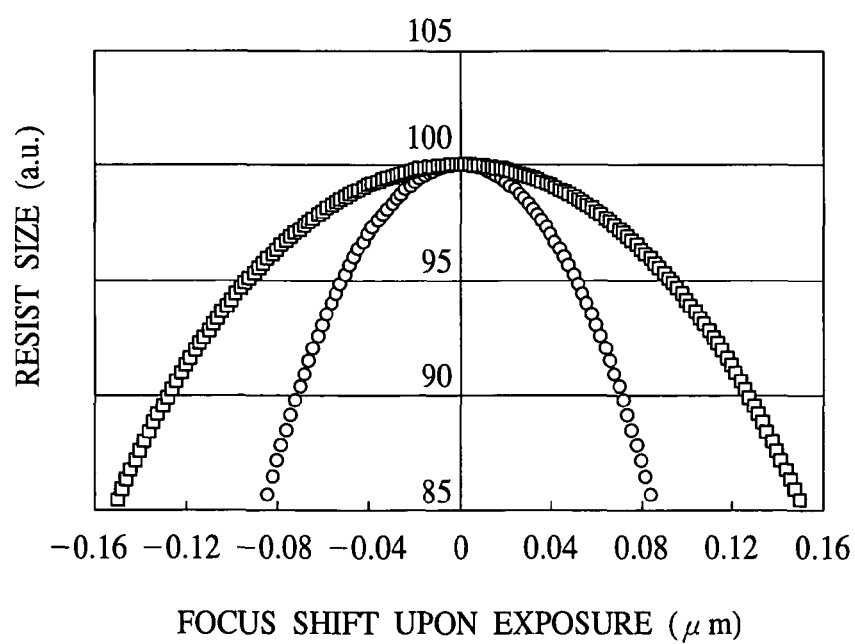
Figure 21A:
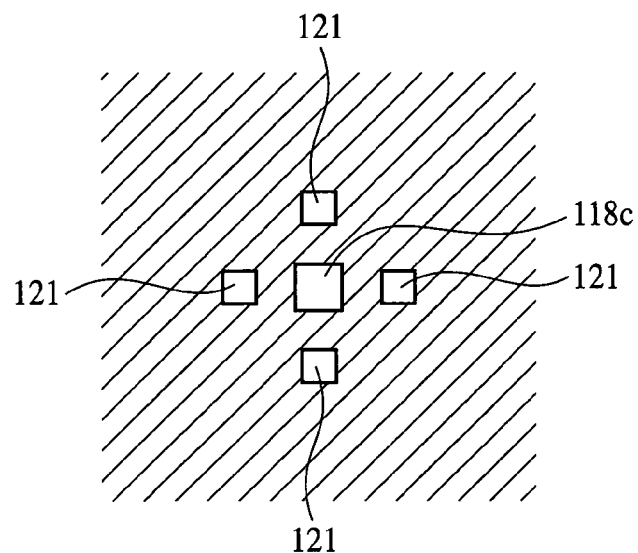
FIGS. 21A and 21B are a plan view of the layout of the pattern with assist patterns provided for the proximity effect correction.
Figure 21B:
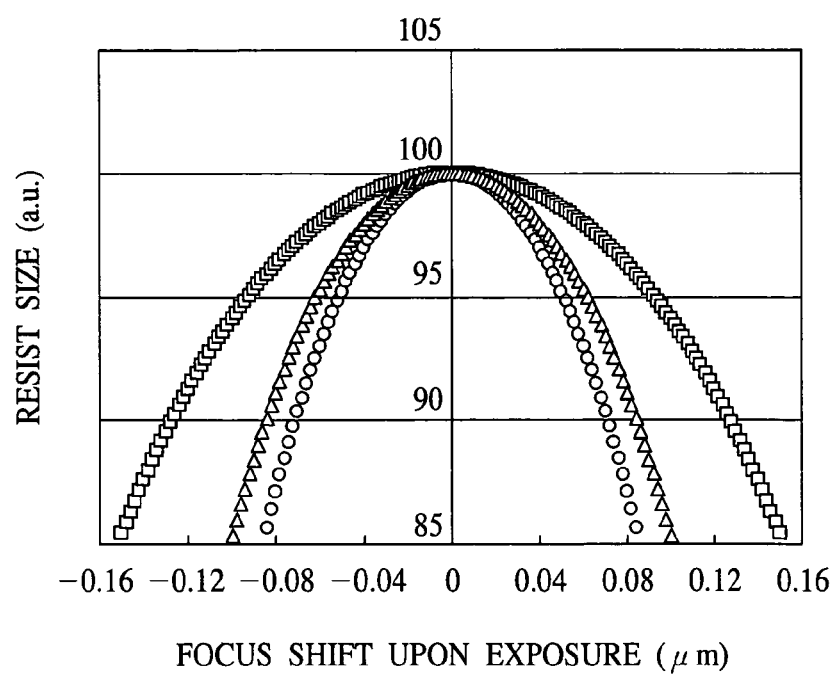

In FIG. 4, the ● marks indicate the DOF given when the exposure is made with the conventional annular illumination stop 116 illustrated in FIG. 18. As indicated by the ● marks in FIG. 4, by the exposure with the conventional annular illumination stop 116, the DOF cannot be always sufficiently large when the pitch of the patterns is about 300 nm or above.

The ■ marks in FIG. 4 indicate the DOF given by the exposure with the annular illumination stop 16e illustrated in FIG. 5A. As seen in the comparison between FIG. 5A and FIG. 18, the inner sigma $\sigma_{in}$ of the ring-shaped aperture 22 in FIG. 5A is set smaller than the inner sigma $\sigma_{in}$ of the ring-shaped aperture 122 in FIG. 18. As seen in the comparison between FIG. 5A and FIG. 18, the outer sigma $\sigma_{out}$ of the ring-shaped aperture 22 in FIG. 5A is set smaller than the outer sigma $\sigma_{out}$ of the ring-shaped aperture 122 in FIG. 18.

As seen in the comparison between the ●-mark plots and the ■-mark plots, it can be seen that the inner sigma $\sigma_{in}$ and the outer sigma $\sigma_{out}$ of the annular illumination stop are varied, whereby the DOF characteristics for the pattern pitch are conspicuously changed.

As indicated by the ■ marks in FIG. 4, when the exposure is made with the annular illumination stop 16e illustrated in FIG. 5A, the DOF is relatively large in the range of the pattern pitch of about 300 nm or over. As indicated by the ■ marks in FIG. 4, when the exposure is made with the annular illumination stop illustrated in FIG. 5B, the DOF is not always sufficiently large in the range of the pattern pitch of 300 nm or less.

The Δ marks in FIG. 4 indicate the DOF given by the exposure with the quadrupole illumination stop 16f illustrated in FIG. 5B. As indicated by the Δ marks in FIG. 4, when the exposure is made with the quadrupole illumination stop 16f illustrated in FIG. 5B, as the pitch of the patterns is increased, the DOF is abruptly decreased. As illustrated by the Δ marks in FIG. 4, the DOF cannot be sufficiently large in the range of the pattern pitch of above about 300 nm.

The inventors of the present application made earnest studies and have obtained the idea that the aperture 22 of the annular illumination stop 16e illustrated in FIG. 5A and the apertures 24a1-24a4 of the quadrupole illumination stop 16f illustrated in FIG. 5B are combined, whereby merits of both can be utilized, and large DOF can be realized at various pitches. That is, the relatively small apertures 24a1-24a4 arranged in square directions with respect to the center of the aperture stop 16 illustrated in FIG. 5A can contribute to transferring the patterns arranged at a relatively small pitch with a relatively high resolution. On the other hand, the ring-shaped aperture 22 illustrated in FIG. 5B contributes to transferring the patterns arranged at a medium pitch to a relatively large pitch with a relatively high resolution.

In FIG. 4, the ○ marks indicate the DOF given by the exposure with the aperture stop 16 illustrated in FIG. 2. As indicated by the ○ marks in FIG. 4, as the pattern pitch increases, the DOF is decreased to some extent, but the DOF can be sufficiently large even in the range of the pattern pitch of 300 nm or above. Based on this, according to the present embodiment, even with the pattern pitch set at various values, the DOF can be sufficiently large, and the patterns can be stably transferred.

Next, the semiconductor device manufacturing method according to the present embodiment will be explained with reference to FIGS. 6A to 6E. FIGS. 6A to 6E are sectional views of a semiconductor device in the steps of the semiconductor device manufacturing method according to the present embodiment, which illustrate the method.

Figure 6A:
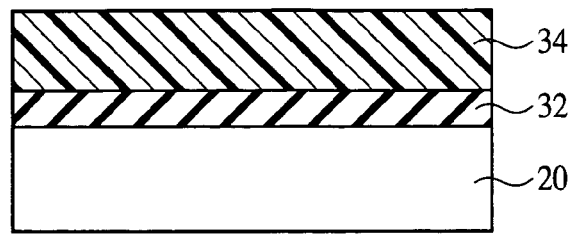
FIGS. 6A to 6E are sectional views of a semiconductor device in the steps of the semiconductor device manufacturing method according to the first embodiment, which illustrate the method.

First, as illustrated in FIG. 6A, a semiconductor substrate 20 is prepared. An inter-layer insulation film 32 is formed on the semiconductor substrate 20. On the inter-layer insulation film 32, a photoresist film 34 is formed. An anti-reflection film is often formed on the upper side or the underside of the photoresist film 34 but is not illustrated in FIGS. 6A to 6E.

Figure 6B:
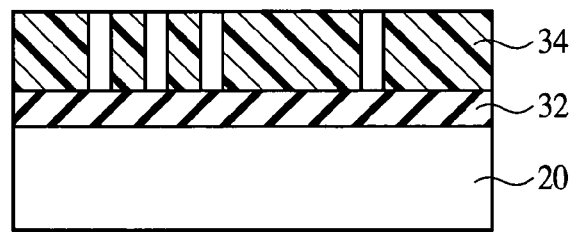

Then, the patterns formed on the reticle 18 are transferred onto the photoresist film 34 with the aligner described above with reference to FIGS. 1 and 2 (see FIG. 6B).

Figure 6C:
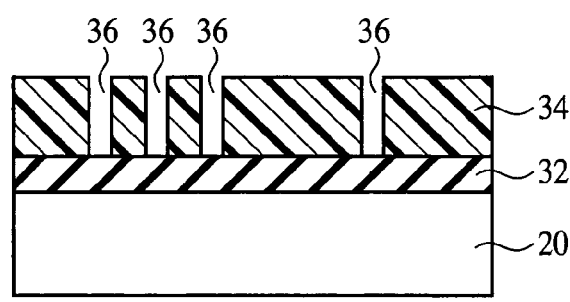

Then, as illustrated in FIG. 6C, the photoresist film 34 is developed.

Figure 6D:
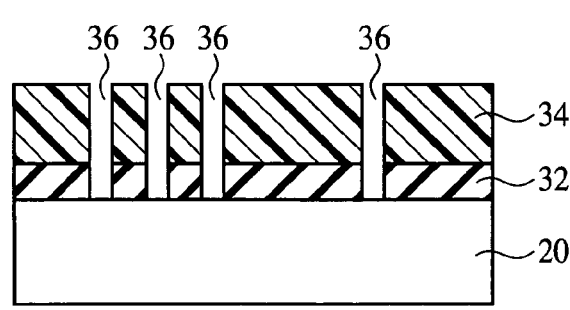

Then, as illustrated in FIG. 6D, the inter-layer insulation film 32 is etched with the photoresist film 34 as the mask. Thus, the patterns of holes, etc. are formed in the inter-layer insulation film 32.

Figure 6E:
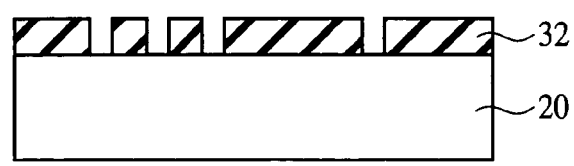

Then, as illustrated in FIG. 6E, the photoresist film 34 is released.

Thus, the semiconductor device according to the present embodiment is manufactured.

Figure 7:
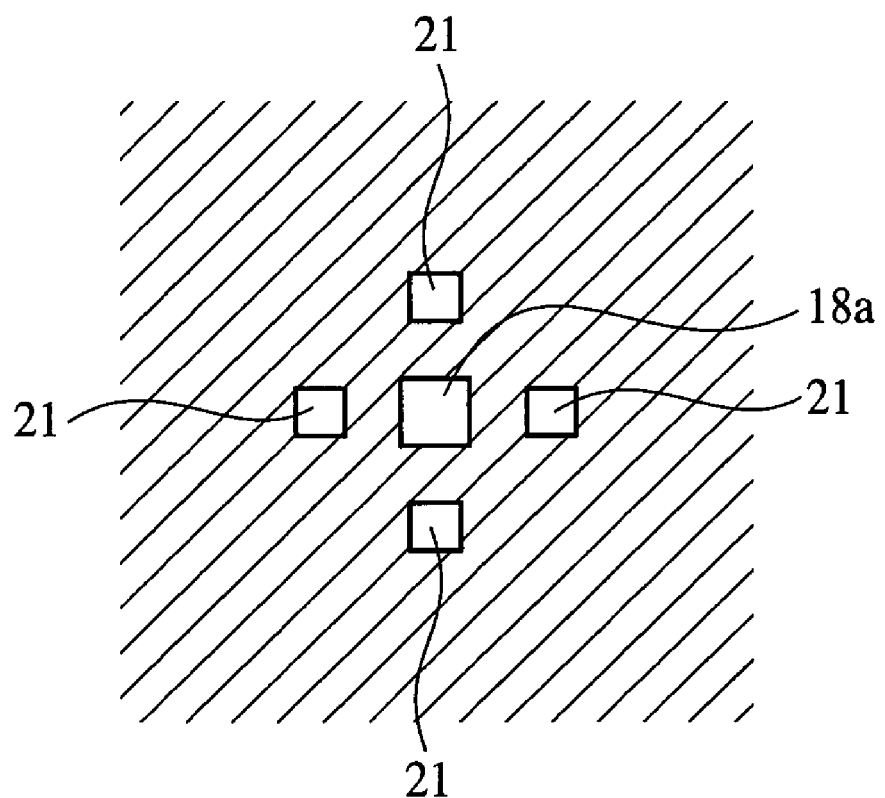

Whether or not assist patterns are provided around the pattern 18a for forming a hole is not explicitly described here, but as illustrated in FIG. 7, assist patterns 21 may be suitably formed around the pattern 18a. FIG. 7 is a plan view of a reticle having assist patterns formed on.

As illustrated in FIG. 7, the assist patterns 21 are formed around the pattern 18a for forming a hole. The assist patterns are provided on the reticle as illustrated in FIG. 7, whereby the required patterns can be stably formed.

(Modification 1)

Figure 8:
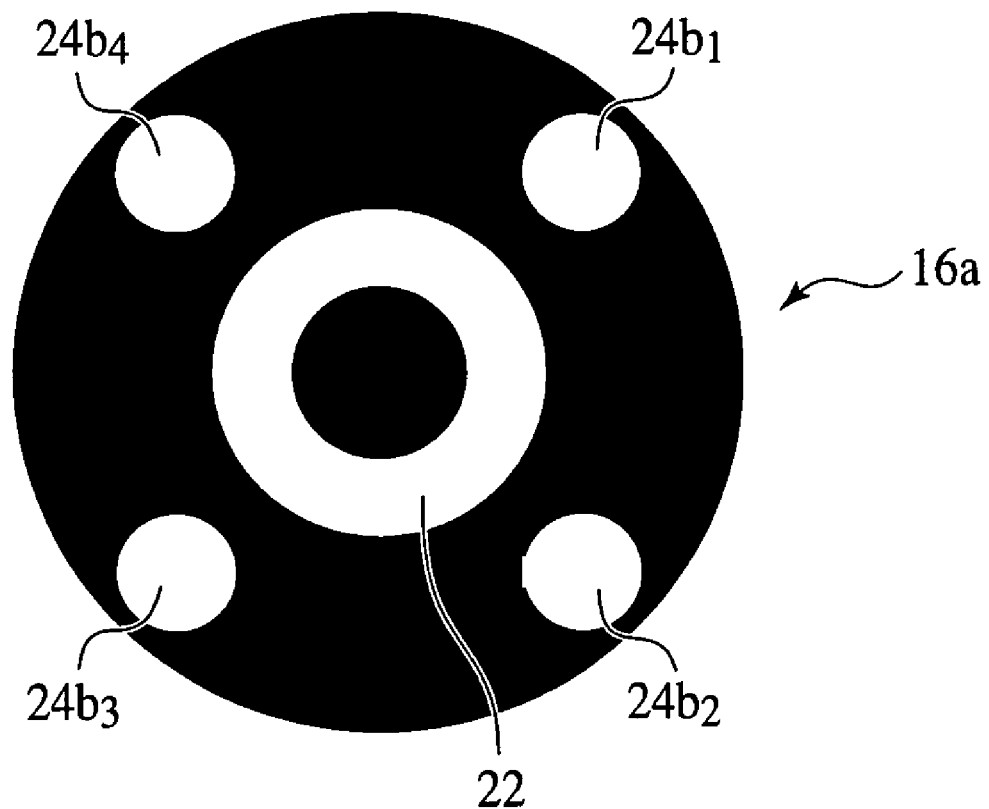
FIG. 8 is a plan view of the aperture stop used in the semiconductor device manufacturing method according to Modification 1 of the first embodiment of the present invention.

Next, the semiconductor manufacturing method according to Modification 1 of the present embodiment will be explained with reference to FIG. 8. FIG. 8 is a plan view of an aperture stop used in the semiconductor device manufacturing method according to the present modification.

The semiconductor device manufacturing method according to the present modification is characterized mainly in that second apertures 24b1-24b4 are arranged all inside the effective region of the aperture stop 16a.

In the aperture stop 16 illustrated in FIG. 2, the second apertures 24a1-24a4 are arranged with parts thereof being outside the effective region of the aperture stop 16, but in the present modification, the second apertures 24b1-24b4 are arranged inside the effective region of the aperture stop 16a. The effective region of the aperture stop is a region which can actually function as an aperture stop.

The second apertures 24b1-24b4 may be thus arranged inside the effective region of the aperture stop 16a.

In the present modification as well as in the semiconductor manufacturing method according to the first embodiment, even with the pattern pitch being set at various values, the DOF can be surely sufficient, and the patterns can be stably transferred.

Whether or not assist patterns are provided around the pattern 18a for forming a hole is not explicitly described here, but as illustrated in FIG. 7, assist patterns 21 may be suitably formed around the pattern 18a. The assist patterns are provided on the reticle as illustrated in FIG. 7, whereby the required patterns can be more stably formed.

(Modification 2)

Figure 9:
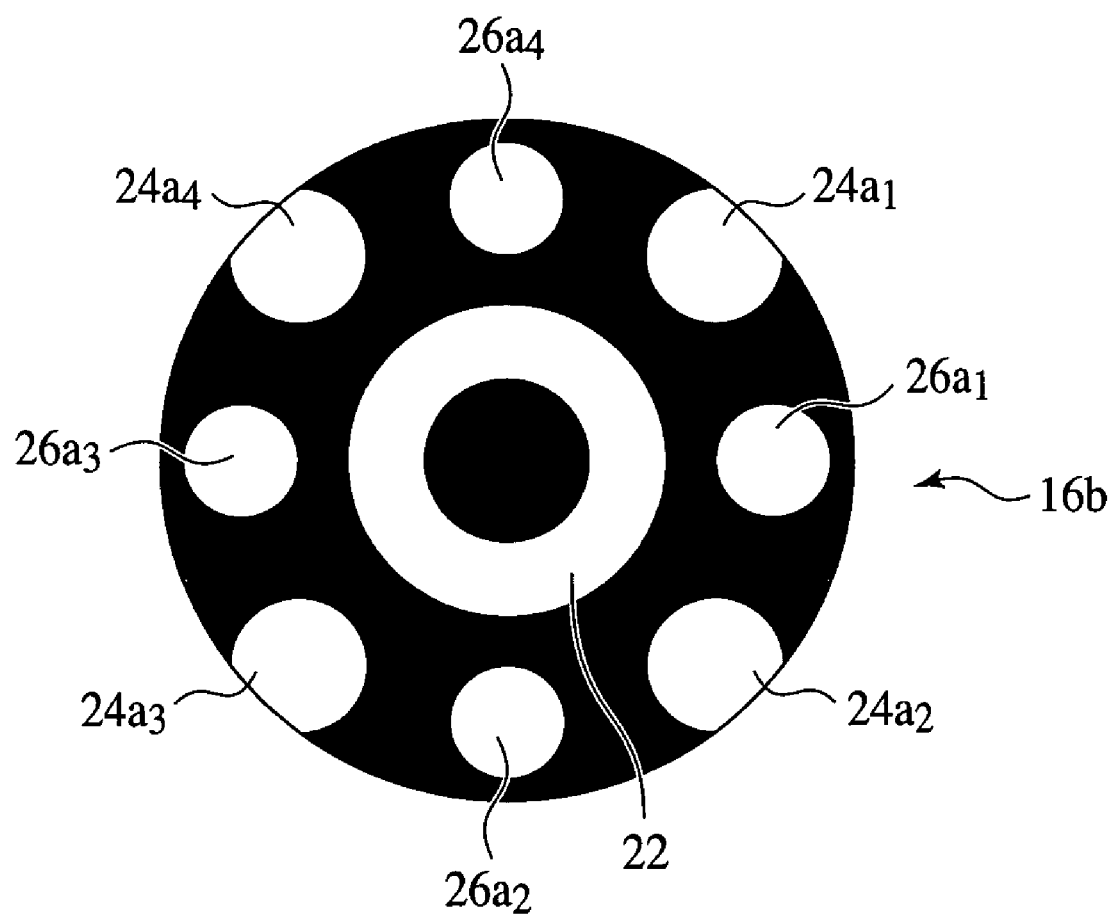
FIG. 9 is a plan view of the aperture stop used in the semiconductor device manufacturing method according to Modification 2 of the first embodiment of the present invention.

Then, the semiconductor device manufacturing method according to Modification 2 of the present embodiment will be explained with reference to FIG. 9. FIG. 9 is a plan view of an aperture stop used in the semiconductor device manufacturing method according to the present modification.

The semiconductor device manufacturing method according to the present modification is characterized mainly in that third apertures 26a1-26a4 are further formed around the ring-shaped aperture 22.

As illustrated in FIG. 9, the third apertures 26a1-26a4 are arranged respectively between the second apertures 24a1-24a4. The third apertures 26a1-26a4 are positioned inside the effective regions of the aperture atop 16b.

In other words, the present modification is characterized in that the relatively small apertures 24a1-24a4, 26a1-26a4 are formed octagonally around the ring-shaped aperture 22.

As described above, the exposure can be made by using the aperture atop 16b having the relatively small apertures 24a1-24a4, 26a1-26a4 octagonally formed around the ring-shaped aperture 22.

In the present modification as well as in the semiconductor device manufacturing method according to the first embodiment, even with the pattern pitch being set at various values, the DOF can be surely sufficient, and the patterns can be stably transferred.

Whether or not assist patterns are provided around the pattern 18a for forming a hole is not explicitly described here, but the assist patterns 21 may be suitably provided around the pattern 18a as illustrated in FIG. 7. The assist patterns are provided on the reticle as illustrated in FIG. 7, whereby the required patterns can be more stably formed.

(Modification 3)

Figure 10:
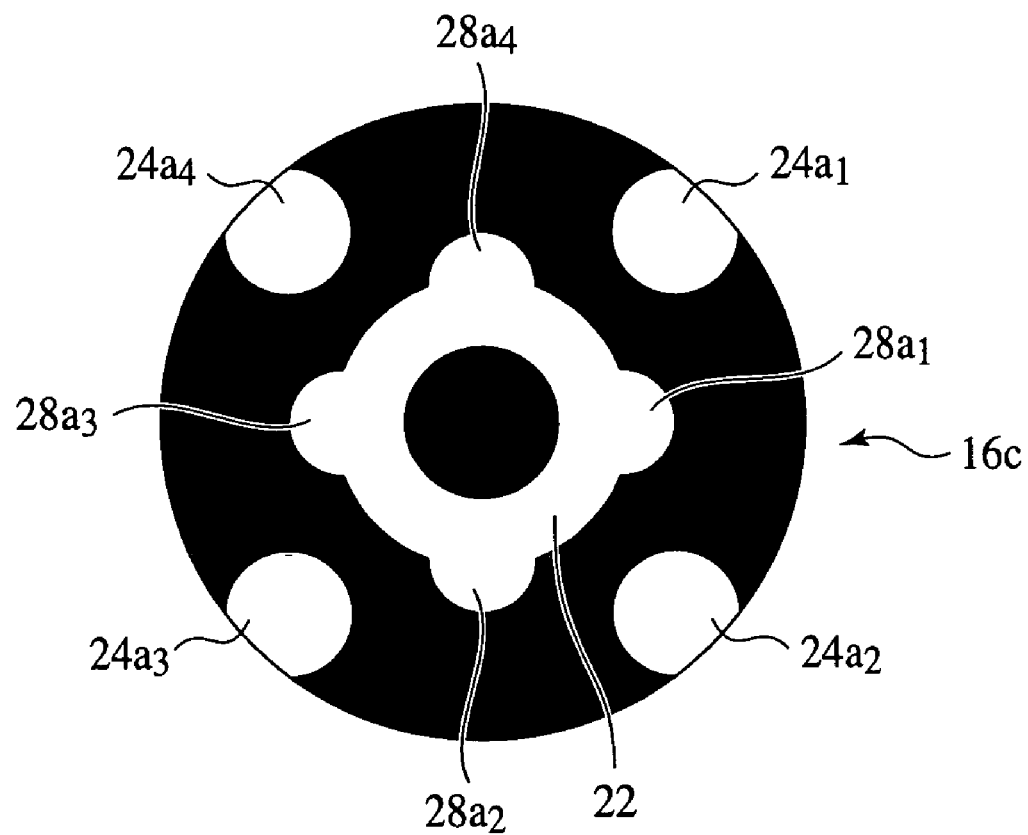
FIG. 10 is a plan view of the aperture stop used in the semiconductor device manufacturing method according to Modification 3 of the first embodiment of the present invention.

Next, the semiconductor device manufacturing method according to a third modification of the present embodiment will be explained with reference to FIG. 10. FIG. 10 is a plan view of an aperture stop used in the semiconductor device manufacturing method according to the present modification.

The semiconductor device manufacturing method according to the present modification is mainly characterized in that third apertures 28a1-28a4 are partially positioned inside the ring-shaped aperture 22. The diameter of the third apertures 28a1-28a4 is set smaller than the diameter of the second apertures 24a1-24a4.

As described above, the third apertures 28a1-28a4 may be partially positioned inside the ring-shaped aperture 22.

In the present modification as well in the semiconductor device manufacturing method according to the first embodiment, even with the pattern pitch set at various values, the DOF can be surely sufficient, and the patterns can be stably transferred.

Whether or not assist patterns are provided around the pattern 18a for forming a hole is not explicitly described here, but the assist patterns 21 may be suitably provided around the pattern 18a as illustrated in FIG. 7. The assist patterns are provided on the reticle as illustrated in FIG. 7, whereby the required patterns can be more stably formed.

(Modification 4)

Figure 11:
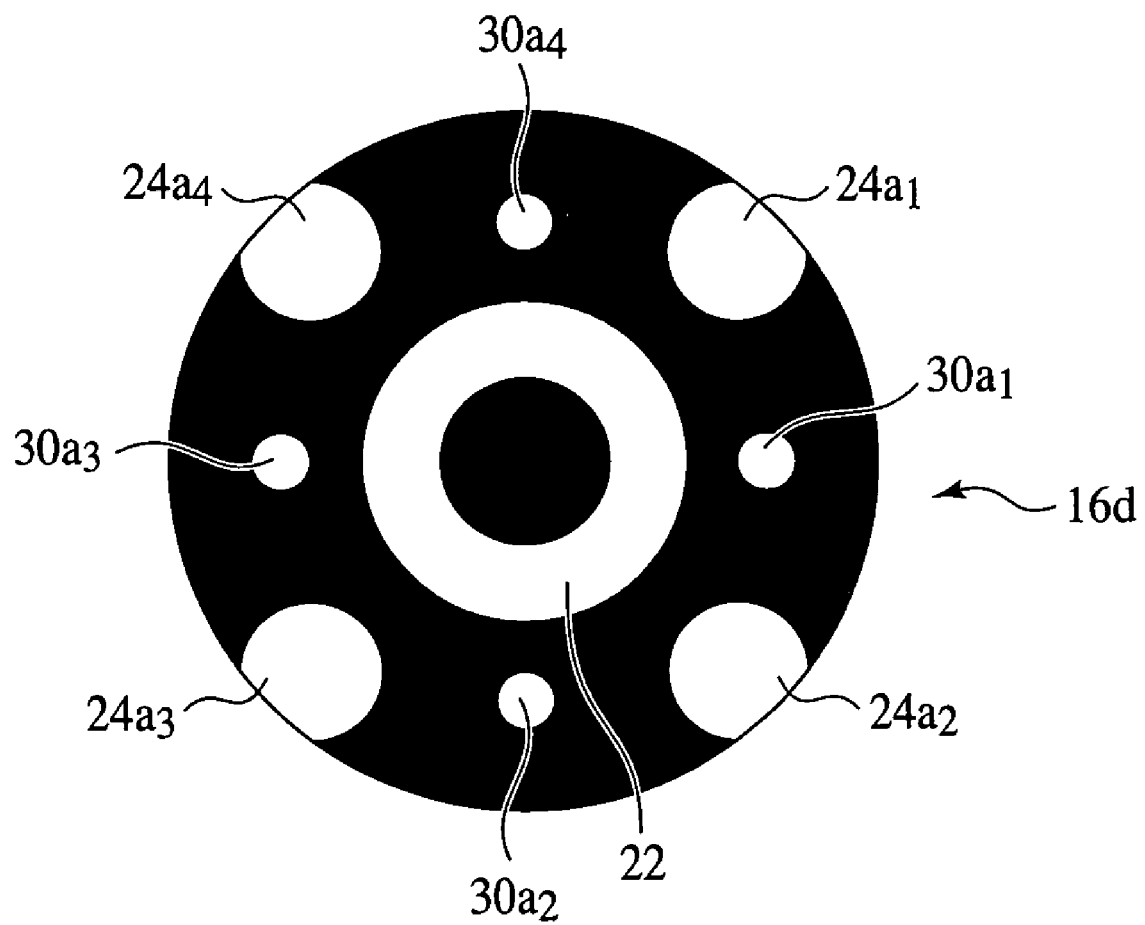
FIG. 11 is a plan view of the aperture stop used in the semiconductor device manufacturing method according to Modification 4 of the first embodiment of the present invention.

Then, Modification 4 of the semiconductor device manufacturing method according to the present embodiment will be explained with reference to FIG. 11. FIG. 11 is a plan view of an aperture stop used in the semiconductor device manufacturing method according to the present modification.

The semiconductor device manufacturing method according to the present modification is characterized mainly in that the diameter of the third apertures 30a1-30a4 are much smaller than the diameter of the second apertures 24a1-24a4. The diameter of the third apertures 30a1-30a4 is, e.g., 0.1-0.2. The size described here is the value given by normalizing the outer diameter of the effective region of the aperture stop 16 to be 1.0.

As described above, the diameter of the third apertures 30a1-30a4 may be made smaller than the diameter of the second apertures 24a1-24a4.

In the present modification as well as in the semiconductor device manufacturing method according to the first embodiment, even with the pitch of the patterns set at various values, the DOF can be surely sufficient, and the patterns can be stably transferred.

Whether or not assist patterns are provided around the pattern 18a for forming a hole is not explicitly described here, but the assist patterns 21 may be suitably provided around the pattern 18a as illustrated in FIG. 7. The assist patterns are provided on the reticle as illustrated in FIG. 7, whereby the required patterns can be more stably formed.

A Second Embodiment

Figure 12A:
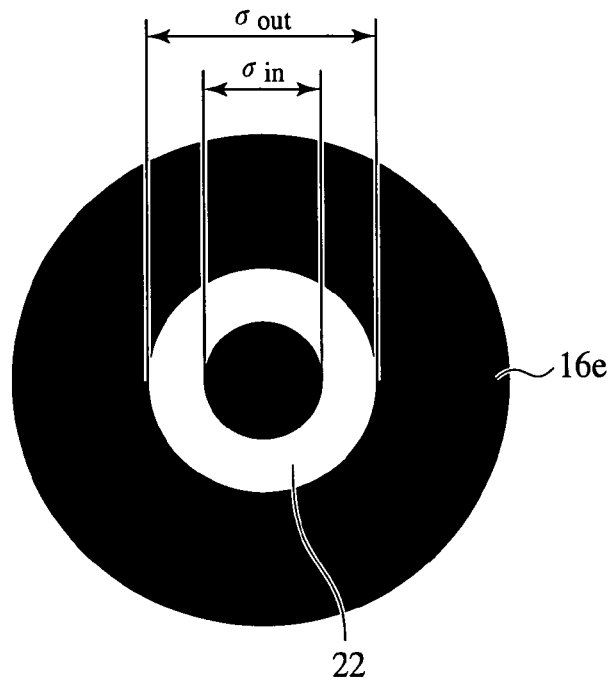
FIGS. 12A and 12B are plan views of an aperture stop used in the semiconductor device manufacturing method according to a second embodiment of the present invention.
Figure 12B:
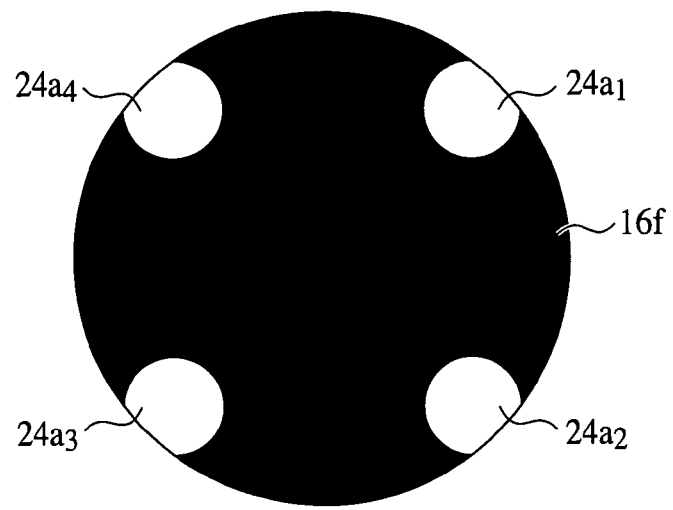

The semiconductor device manufacturing method according to a second embodiment of the present invention will be explained with reference to FIGS. 12A and 12B. FIGS. 12A and 12B are plan views of an aperture stop used in the semiconductor device manufacturing method according to the present embodiment. The same members of the present embodiment as those of the semiconductor device manufacturing method according to the first embodiment illustrated in FIGS. 1 to 11 are represented by the same reference numbers not to repeat or to simplify their explanation.

The semiconductor device manufacturing method according to a second embodiment of the present invention is characterized mainly in that the first exposure is made with the first aperture stop 16e having a ring-shaped aperture 22 formed in the center, and then the second exposure is made with the second aperture stop 16f having apertures 24a1-24a4 formed in square directions with respect to the center of the aperture stop.

FIG. 12A is a plan view of the first aperture stop 16e having the ring-shaped aperture 22 at the center of the aperture stop. The first aperture stop 16e used in the present embodiment has a ring-shaped aperture 22 formed in the center. As seen in comparing FIG. 12A with FIG. 18, the inner sigma Gin of the ring-shaped aperture in FIG. 12A is set smaller than the inner sigma $\sigma_{in}$ of the ring-shaped aperture 122 in FIG. 18. As seen in comparing FIG. 12A with FIG. 18, the outer sigma $\sigma_{out}$ of the ring-shaped aperture in FIG. 12A is set smaller than the outer sigma $\sigma_{out}$ of the ring-shaped aperture 122 in FIG. 18.

The respective sizes of the aperture stop 16e are as exemplified below. The outer diameter of the effective region of the aperture 16e is, e.g., 1.0. The size of the outer sigma $\sigma_{out}$ of the first aperture 22 is, e.g., 0.4-0.5. The size of the inner sigma $\sigma_{in}$ of the first aperture 22 is, e.g., 0.2-0.3. These sizes are value given by normalizing the outer diameter of the effective region of the aperture stop 16e to be 1.0.

FIG. 12B is a plan view of the second aperture stop 16f having the second apertures 24a1-24a4 in square directions with respect to the center. The positions, shape, etc. of the second apertures 24a1-24a4 of the second aperture stop 16f illustrated in FIG. 12B are the same as those of the second apertures 24a1-24a4 of the aperture stop illustrated in FIG. 2.

In the semiconductor device manufacturing method according to the present embodiment, patterns formed on a reticle 18 are exposed by using the first aperture stop 16e and is further exposed by using the second aperture stop 16f. In the present embodiment, the exposure using the first aperture stop 16e contributes to transferring patterns arranged at a middle pitch to a relatively large pitch with a relatively high resolution. On the other hand, the exposure using the second aperture stop 16f contributes to transferring patterns arrange at a relatively small pitch with a relatively high resolution. Thus, the present embodiment as well can produce the same advantageous effect as the exposure using the aperture stop 16 used in the first embodiment, and even with patterns set a various values, the DOF can be surely sufficient, and the patterns can be stably transferred.

Next, the semiconductor device manufacturing method according to the present embodiment will be explained with reference to FIGS. 13A to 13E. FIGS. 13A to 13E are the sectional views of a semiconductor device in the steps of the semiconductor device manufacturing method according to the present embodiment, which illustrate the method.

Figure 13A:
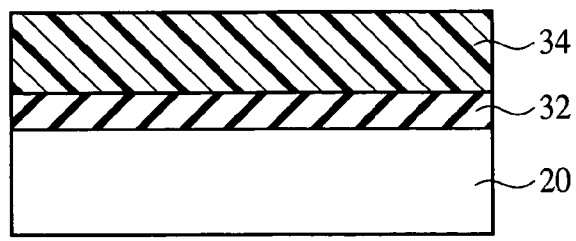
FIGS. 13A to 13E are sectional view of a semiconductor device in the steps of the semiconductor device manufacturing method according to the second embodiment, which illustrate the method.

First, as illustrated in FIG. 13A, a semiconductor substrate 20 is prepared. An inter-layer insulation film 32 is formed on the semiconductor substrate 20. A photoresist film 34 is formed on the inter-layer insulation film 32.

Then, the aperture stop 16e illustrated in FIG. 12A is mounted on the aligner described above with reference to FIG. 1, and patterns formed on a retile 18 are transferred to the photoresist film 34 on the semiconductor substrate 20.

Figure 13B:
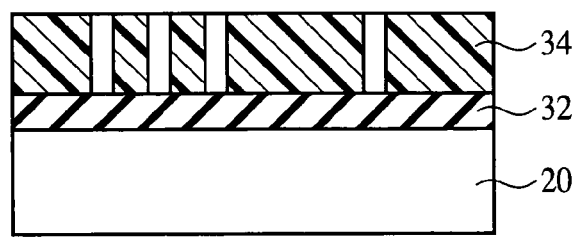

Then, the aperture stop 16f illustrated in FIG. 12B is mounted on the aligner described above with reference to FIG. 1, and the patterns formed on the reticle 18 are transferred to the photoresist film 34 on the semiconductor substrate 20 (see FIG. 13B).

Figure 13C:
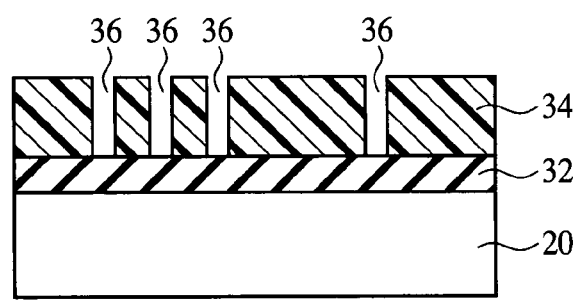

Next, as illustrated in FIG. 13C, the photoresist film 34 is developed.

Figure 13D:
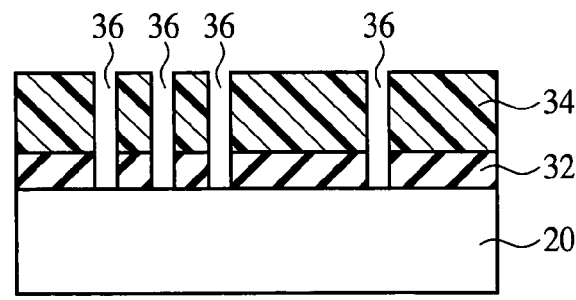

Next, as illustrated in FIG. 13D, the inter-layer insulation film 32 is etched with the photoresist film 34 as the mask. Thus, the patterns of holes, etc., are formed in the inter-layer insulation film 32.

Figure 13E:

Next, as illustrated in FIG. 13E, the photoresist film 34 is released.

Thus, the semiconductor device of the present embodiment is manufactured.

Whether or not assist patterns are provided around the pattern 18a for forming a hole is not explicitly described, but as illustrated in FIG. 7, assist patterns 21 may be suitably formed around the pattern 18a. FIG. 7 is a plan view of the reticle with the assist patterns formed on.

As illustrated in FIG. 7, the assist patterns 21 are formed around the pattern 18a for forming a hole. The assist patterns are provided on the reticle as illustrated in FIG. 7, whereby the required patterns can be more stably formed.

(Modification 1)

Figure 14A:
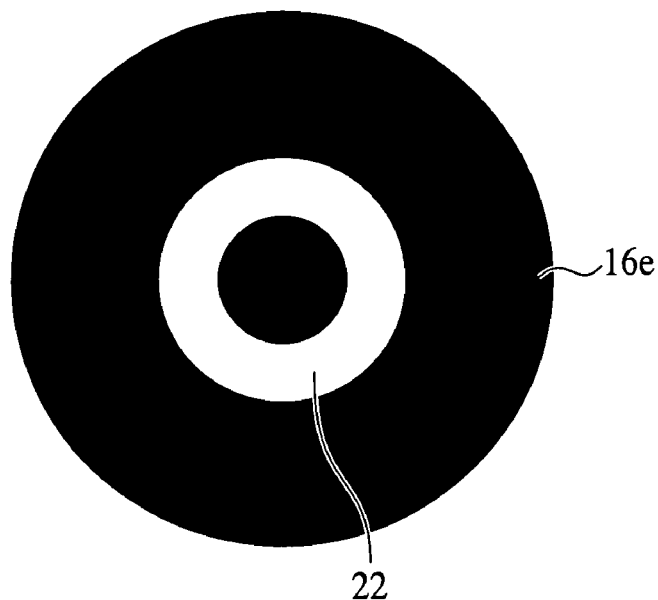
FIGS. 14A and 14B are plan views of the aperture stop used in the semiconductor device manufacturing method according to Modification 1 of the second embodiment of the present invention.
Figure 14B:
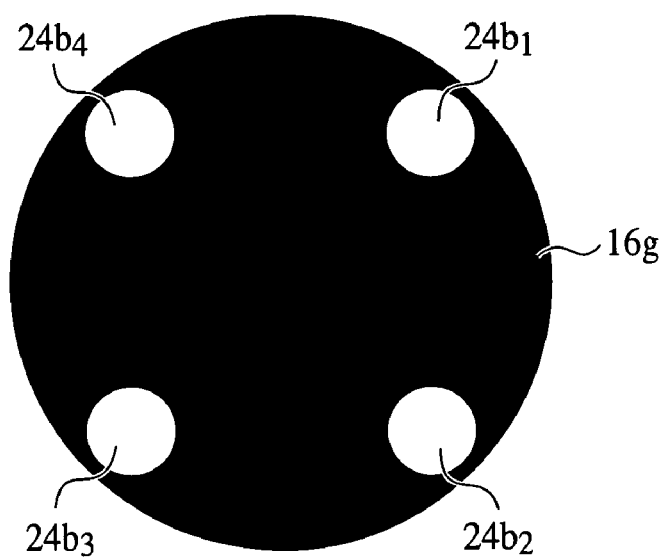

Then, the semiconductor device manufacturing method according to Modification 1 of the present embodiment will be explained with reference to FIGS. 13A to 14B. FIGS. 14A and 14B are plan views of an aperture stop used in the semiconductor device manufacturing method according to the present modification.

The semiconductor device manufacturing method according to the present modification is characterized mainly in that as illustrated in FIG. 14B, the apertures 24b1-24b4 of the second aperture atop 16g for the second exposure are positioned inside the effective region of the aperture stop 16g.

In the aperture stop 16f illustrated in FIG. 12B, the second apertures 24a1-24a4 are partially positioned outside the effective region of the aperture stop 16f, but in the present modification, as illustrated in FIG. 14B, the second apertures 24b1-24b4 are arranged inside the effective region of the aperture stop 16g. The effective region of the aperture stop is a region which can actually function as the stop.

The second apertures 24b1-24b4 may be thus positioned inside the effective region of the aperture stop 16g.

Then, the semiconductor device manufacturing method according to the present embodiment will be explained with reference to FIGS. 13A to 13E. FIGS. 13A to 13E are sectional views of the semiconductor device in the steps of the semiconductor device manufacturing method according to the present embodiment, which illustrate the method.

The aperture stop 16e illustrated in FIG. 14A is mounted on the aligner described above with reference to FIG. 1, and the patterns formed on the reticle 18 are transferred to the photoresist film 34 on the semiconductor substrate 20.

Then, the aperture stop 16g illustrated in FIG. 14B is mounted on the aligner described above with reference to FIG. 1, and patterns formed on the reticle 18 are transferred to the photoresist film 34 on the semiconductor substrate 20 (see FIG. 13B). An anti-reflection film is often formed on the upper side or the underside of the photoresist film 34 but is omitted in FIGS. 13A to 13E.

Next, as illustrated in FIG. 13C, the photoresist film 34 is developed.

Next, as illustrated in FIG. 13D, the inter-layer insulation film 32 is etched with the photoresist film 34 as the mask. Thus, the patterns of holes, etc. are formed in the inter-layer insulation film 32.

Then, as illustrated in FIG. 13E, the photoresist film 34 is released.

Thus, the semiconductor device of the present embodiment is manufactured.

In the present modification as well in the semiconductor device manufacturing method according to the first embodiment, even with the pattern pitch set at various values, the DOF can be surely sufficient, and the patterns can be stably transferred.

Whether or not assist patterns are provided around the pattern 18a for forming hole is not explicitly explained here, but as illustrated in FIG. 7, the assist patterns 21 may be suitably formed around the pattern 18a. The assist patterns are provided on the reticle as illustrated in FIG. 7, whereby the required patterns can be stably formed.

(Modification 2)

Figure 15A:
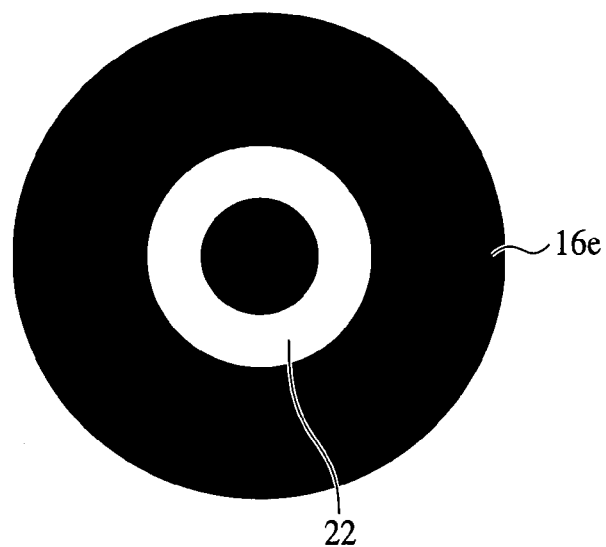
FIGS. 15A and 15B are plan views of the aperture stop used in the semiconductor device manufacturing method according to Modification 2 of the second embodiment of the present invention.
Figure 15B:
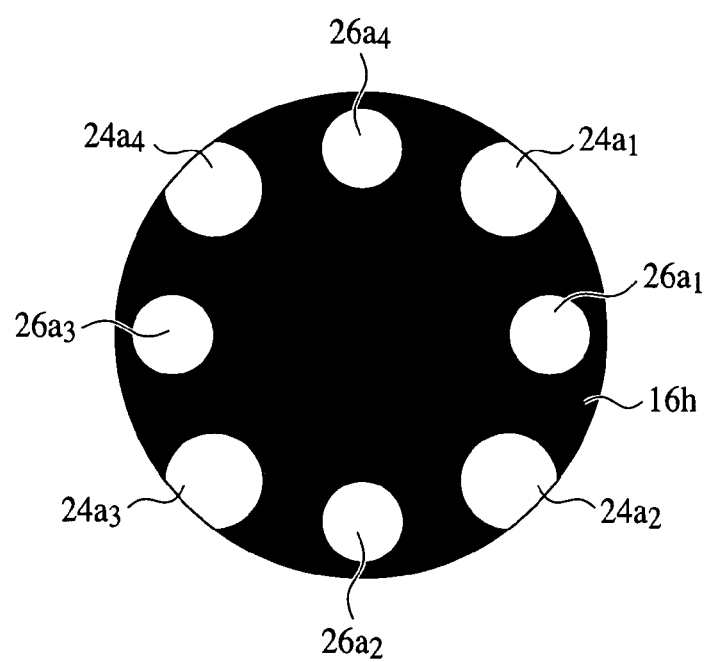

Then, the semiconductor device manufacturing method according to Modification 2 of the present embodiment will be explained with reference to FIGS. 13A to 13E, 15A and 15B. FIGS. 15A and 15B are plan views of an aperture stop used in the semiconductor device manufacturing method according to the present modification.

The semiconductor device manufacturing method according to the present modification is characterized mainly in that as illustrated in FIG. 15B, the second aperture stop 16h for the second exposure further has the third apertures 26a1-26a4 respectively between the second apertures 24a1-24a4.

As illustrated in FIG. 15B, the third apertures 26a1-26a4 are positioned respectively between the second apertures 24a1-24a4. The third apertures 26a1-26a4 are positioned inside the effective region of the aperture stop 16h.

In other words, in the present modification, the relatively small apertures 24a1-24a4, 26a1-26a4 are formed octagonally around the ring-shaped aperture 22.

As described above, the exposure may be made by using the aperture stop 16h having the relatively small apertures 24a1-24a4, 26a1-26a4 thus formed octagonally around the ring-shaped aperture 22.

Then, the semiconductor device manufacturing method according to the present embodiment will be explained with reference to FIGS. 13A to 13E. FIGS. 13A to 13E are sectional views of the semiconductor device in the steps of the semiconductor device manufacturing method according to the present embodiment, which illustrate the method.

The aperture stop 16e illustrated in FIG. 15A is mounted on the aligner described above with reference to FIG. 1, and the patterns formed on the reticle 18 are transferred to the photoresist film 34 on the semiconductor substrate 20. An anti-reflection film is often formed on the upper side or the underside of the photoresist film 34 but is omitted in FIGS. 13A to 13E.

Then, the aperture stop 16h illustrated in FIG. 15B is mounted on the aligner described above with reference to FIG. 1, and the patterns formed on the reticle 18 are transferred to the photoresist film 34 on the semiconductor substrate 20 (see FIG. 13B).

Then, as illustrated in FIG. 13C, the photoresist film 34 is developed.

Next, as illustrated in FIG. 13D, the inter-layer insulation film 32 is etched with the photoresist film 34 as the mask. Thus, the patterns of holes, etc., are formed in the inter-layer insulation film 32.

Then, as illustrated in FIG. 13E, the photoresist film 34 is released.

Thus, the semiconductor device of the present modification is manufactured.

In the present modification as well as in the semiconductor device manufacturing method according to the first embodiment, even with the pattern pitch set at various values, the DOF can be surely sufficient, and the patterns can be stably transferred.

Whether or not assist patterns are provided around the pattern 18a for forming hole is not explicitly explained here, but as illustrated in FIG. 7, the assist patterns 21 may be suitably formed around the pattern 18a. The assist patterns are provided on the reticle as illustrated in FIG. 7, whereby the required patterns can be stably formed.

(Modification 3)

Figure 16A:
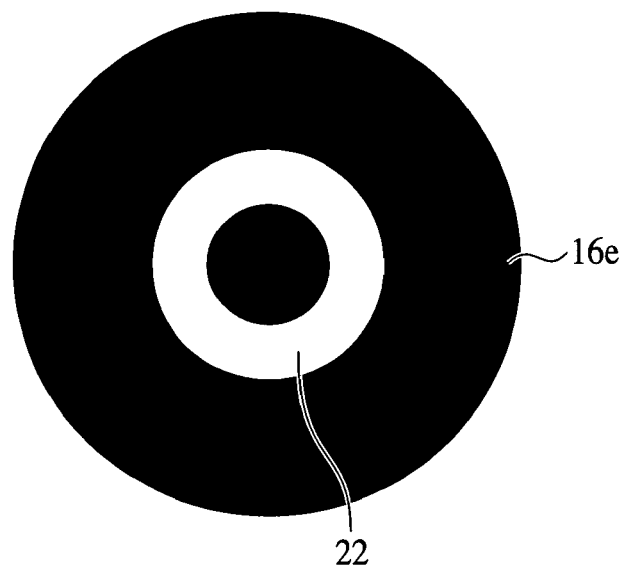
FIGS. 16A and 16B are plan views of the aperture stop used in the semiconductor device manufacturing method according to Modification 3 of the second embodiment of the present invention.
Figure 16B:
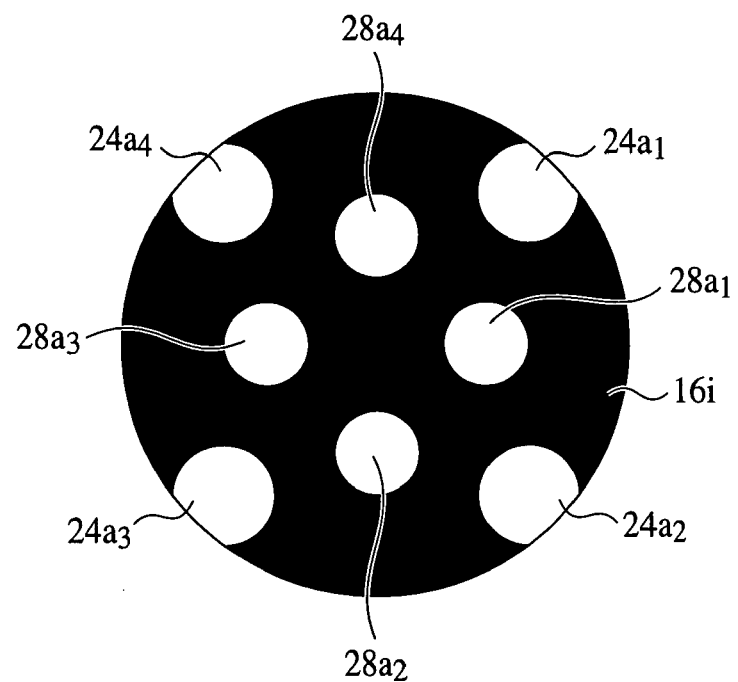

Next, the semiconductor device manufacturing method according to Modification 3 of the present embodiment will be explained with reference to FIGS. 13A to 13E, 16A and 16B. FIGS. 16A and 16B are plan views of an aperture stop used in the semiconductor device manufacturing method according to the present modification.

The semiconductor device manufacturing method according to the present modification is characterized mainly in that the aperture stop 16i used in the second exposure has third apertures 28a1-28a4 relatively inner formed.

When the aperture stops 16e used in the first exposure and the second aperture stops 16i used in the second exposure are superimposed on each other, the third apertures 28a1-28a4 are partially positioned in the aperture 22.

The third apertures 28a1-28a4 of the aperture stop 16i for the second exposure may be positioned relatively nearer the center of the aperture stop 16i.

Then, the semiconductor device manufacturing method according to the present embodiment will be explained with reference to FIGS. 13A to 13E. FIGS. 13A to 13E are sectional views of the semiconductor device in the steps of the semiconductor device manufacturing method according to the present modification, which illustrate the method.

The aperture stop 16e illustrated in FIG. 16A is mounted on the aligner described above with reference to FIG. 1, and the patterns formed on the reticle 18 are transferred to the photoresist film 34 on the semiconductor substrate 20.

Then, the aperture stop 16i illustrated in FIG. 16B is mounted on the aligner described above with reference to FIG. 1, and the patterns formed on the reticle 18 are transferred to the photoresist film 34 on the semiconductor substrate 20 (see FIG. 13B).

Then, as illustrated in FIG. 13C, the photoresist film 34 is developed.

Then, as illustrated in FIG. 13D, the inter-layer insulation film 32 is etched with the photoresist film 34 as the mask. Thus, the patterns of holes, etc. are formed in the inter-layer insulation film 32.

Then, as illustrated in FIG. 13E, the photoresist film 34 is released.

Thus, the semiconductor device according to the present modification is manufactured.

In the present modification as well as in the semiconductor device manufacturing method according to the first embodiment, even with the pattern pitch set at various values, the DOF can be surely sufficient, and the patterns can be stably transferred.

Whether or not assist patterns are provided around the pattern 18a for forming hole is not explicitly explained here, but as illustrated in FIG. 7, the assist patterns 21 may be suitably formed around the pattern 18a. The assist patterns are provided on the reticle as illustrated in FIG. 7, whereby the required patterns can be stably formed.

(Modification 4)

Figure 17A:
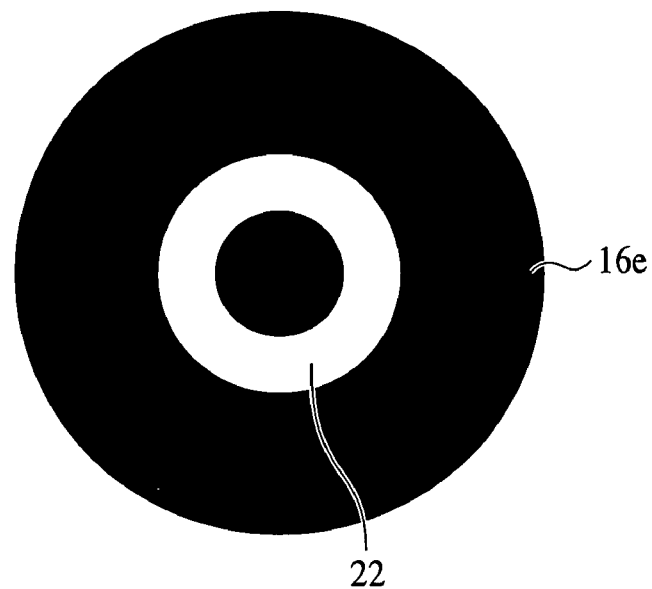
FIGS. 17A and 17B are plan views of the aperture stop used in the semiconductor device manufacturing method according to Modification 4 of the second embodiment of the present invention.
Figure 17B:
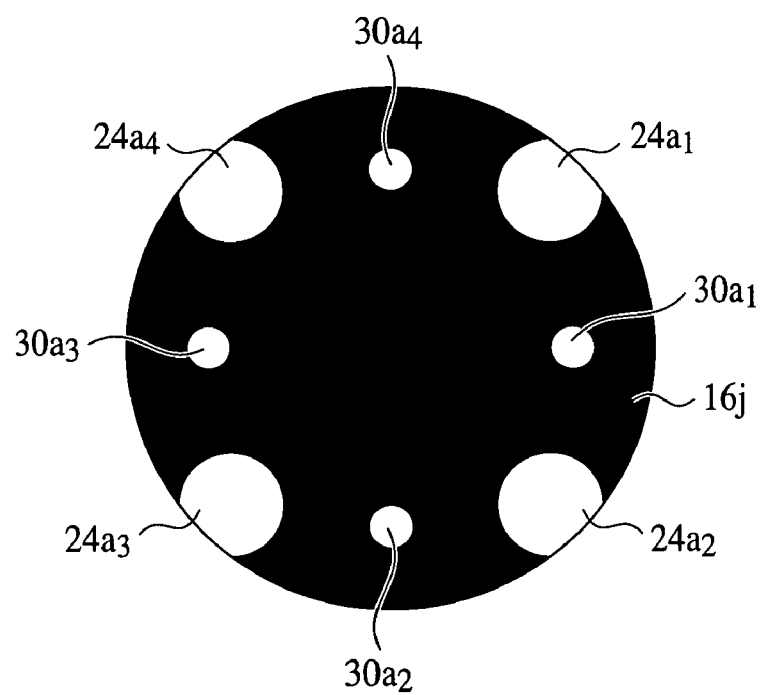

Then, the semiconductor device manufacturing method according to Modification 4 of the present embodiment will be explained with reference to FIGS. 13A to 13E, 17A and 17B. FIGS. 17A and 17B are plan views of an aperture stop used in the semiconductor device manufacturing method according to the present modification.

The semiconductor device manufacturing method according to the present modification is characterized mainly in that the aperture stop 16j for the second exposure has third apertures 30a1-30a4 formed in a smaller diameter than the second apertures 24a1-24a4.

The diameter of the third apertures 30a1-30a4 may be thus smaller than the diameter of the second apertures 24a1-24a4.

Then, the semiconductor device manufacturing method according to the present modification will be explained with reference to FIGS. 13A to 13E. FIGS. 13A to 13E are sectional views of the semiconductor device in the steps of the semiconductor device manufacturing method according to the present modification, which illustrate the method.

The aperture stop 16e illustrated in FIG. 17A is mounted on the aligner described above with reference to FIG. 1, and the patterns formed on the reticle 18 are transferred to the photoresist film 34 on the semiconductor substrate 20.

Then, the aperture stop 16j illustrated in FIG. 17B is mounted on the aligner described above with reference to FIG. 1, and the patterns formed on the reticle 18 are transferred to the photoresist film 34 on the semiconductor substrate 20 (see FIG. 13B).

Next, as illustrated in FIG. 13C, the photoresist film 34 is developed.

Next, as illustrated in FIG. 13D, the inter-layer insulation film 32 is etched with the photoresist film 34 as the mask. Thus, the patterns, as of holes, etc., are formed in the photoresist film 32.

Then, as illustrated in FIG. 13E, the photoresist film 32 is released.

Thus, the semiconductor device of the present embodiment is manufactured.

In the present modification as well as the semiconductor device manufacturing method according to the second embodiment, even with the pattern pitch set at various pitches, the DOF can be surely sufficient, and the patterns can be stably transferred.

Whether or not assist patterns are provided around the pattern 18a for forming hole is not explicitly explained here, but as illustrated in FIG. 7, the assist patterns 21 may be suitably formed around the pattern 18a. The assist patterns are provided on the reticle as illustrated in FIG. 7, whereby the required patterns can be stably formed.

A Third Embodiment

According to the semiconductor device manufacturing method according to the first and the second embodiments, even with the pattern pitch set at various values, the DOF can be surely sufficient, and patterns can be stably transferred.

Figure 22:
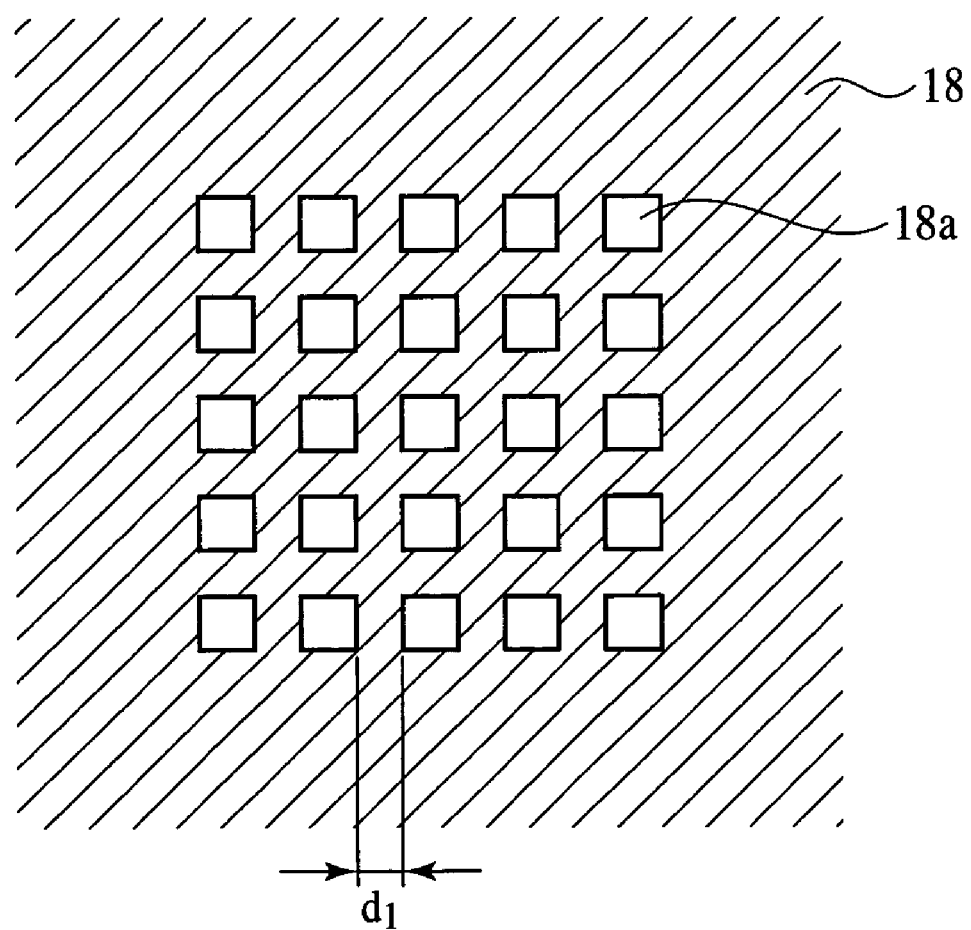
FIG. 22 is a plan view of the reticle with the patterns arranged in a square lattice.

FIG. 22 is a plan view of a reticle having patterns arranged in a square lattice. In FIG. 22, d1 represents a pitch between patterns 18a neighboring each other, i.e., a space size.

Figure 23:
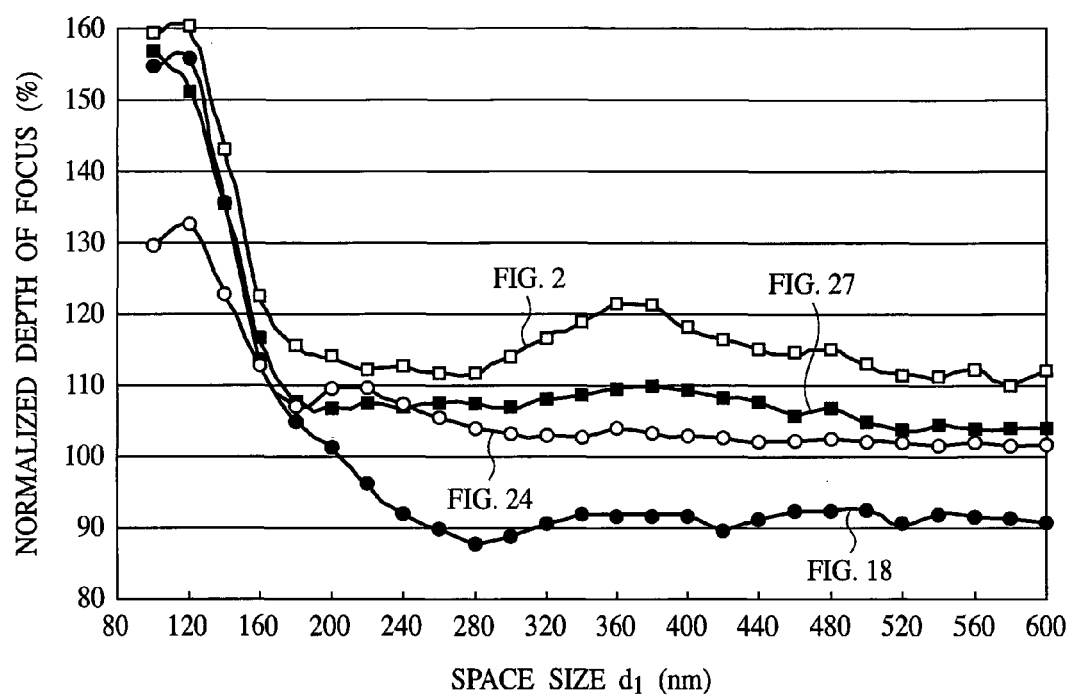
FIG. 23 is a graph of the relationship between the space size and the DOF given when the patterns arranged in a square lattice are transferred.
Figure 24:
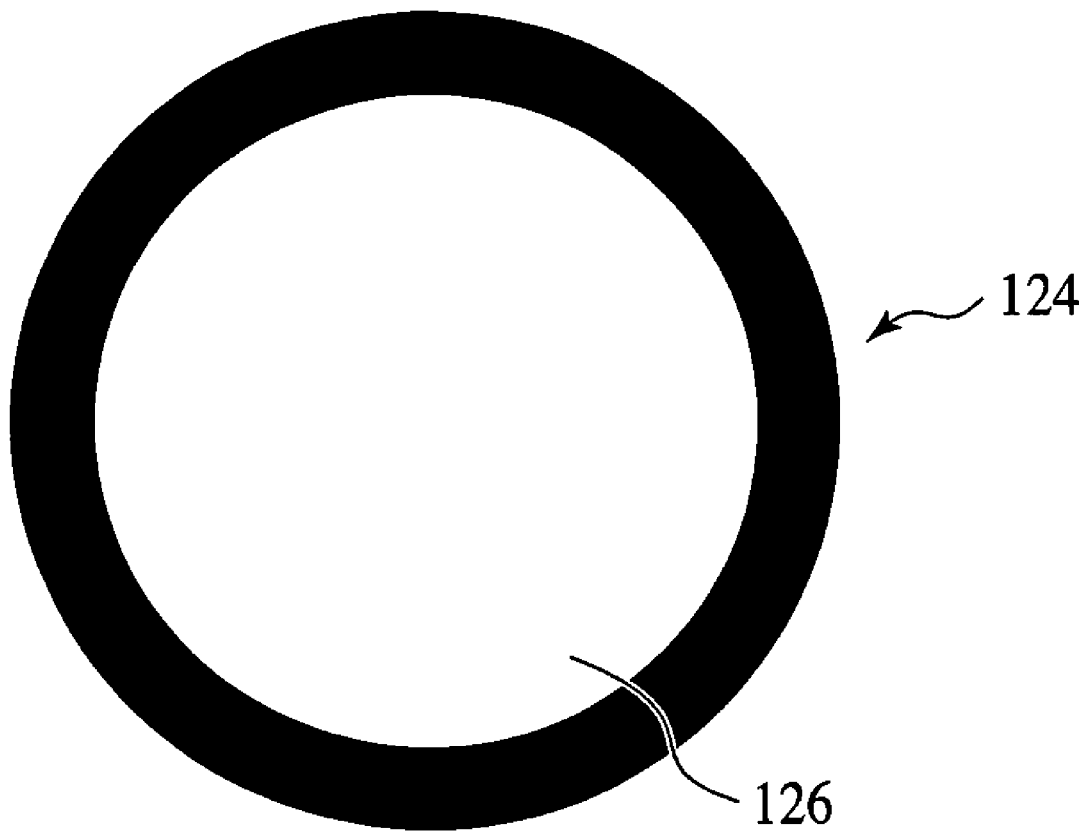
FIG. 24 is a plan view of the usual aperture stop.

FIG. 23 is a graph of the relationship between the space size d1 of patterns arranged in a square lattice to be transferred, and the DOF. In FIG. 23, the space size d1 is taken on the horizontal axis, and on the vertical axis, the normalized DOF is taken. The DOF in FIG. 23 is the values given with the exposure latitude being set at 4%. In FIG. 23, the ● marks indicate the DOF given by the exposure with the conventional annular illumination stop 116 illustrated in FIG. 18. In FIG. 23, the ○ marks indicate the DOF given by the exposure with the usual aperture stop 124 illustrated in FIG. 24. FIG. 24 is a plan view of the usual aperture stop. As illustrated in FIG. 24, a relatively large circular aperture 126 is formed in the aperture stop 124. In FIG. 23, the □ marks indicate the DOF given by the exposure with the aperture stop 16 illustrated in FIG. 2, i.e., the aperture stop 16 of the first embodiment.

As seen in comparing the ●-marked plots, the ○-marked plots and the □-marked plots with one another, when the exposure is made with the aperture stop 16 illustrated in FIG. 2, even with the space size d1 set at various values, the DOF can be surely sufficient.

However, the inventors of the present application made earnest studies and have found that when the exposure is made with the aperture stop 16 illustrated in FIG. 2, with the patterns 18a arranged oblique to the sides of the reticle 18, the DOF cannot be often surely sufficient.

Figure 25:
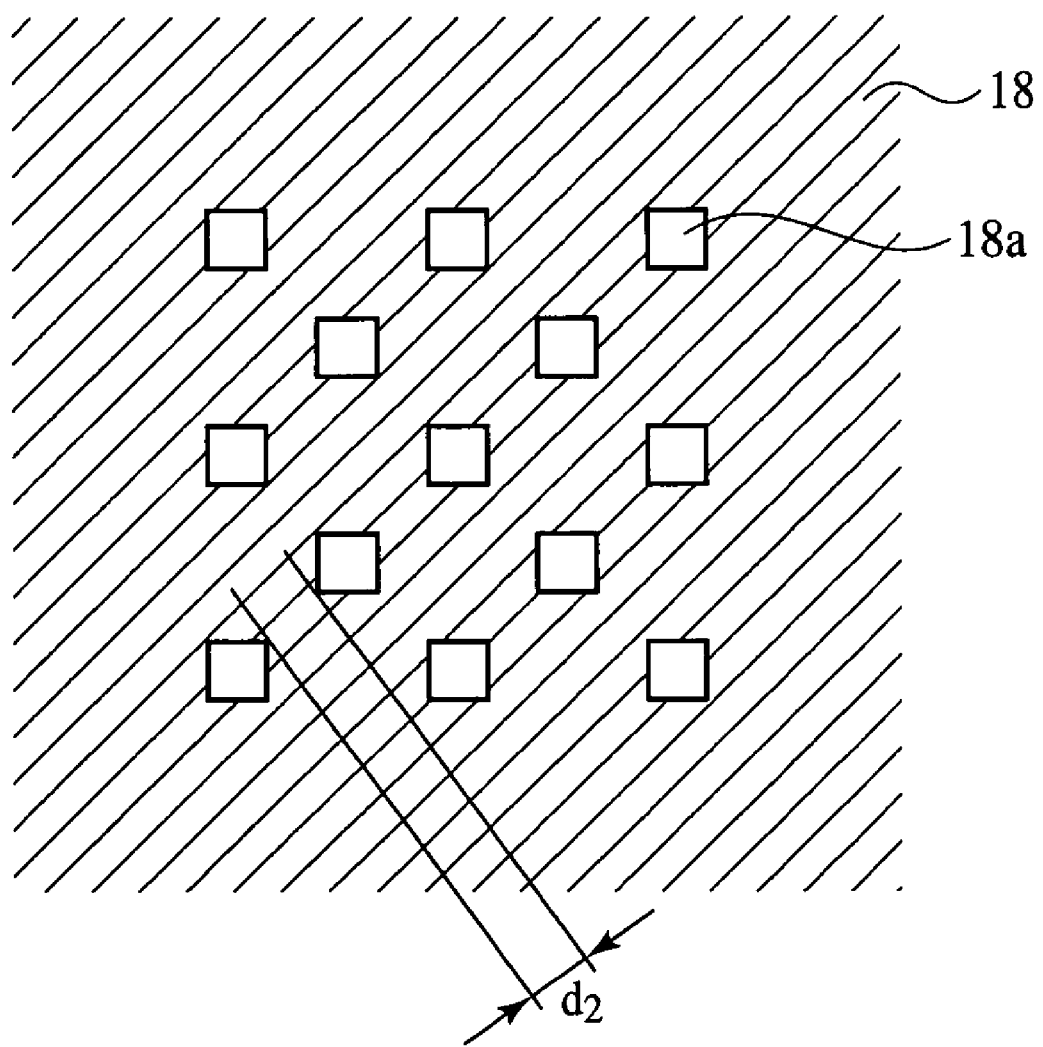
FIG. 25 is a plan view of the reticle with the patterns arranged in an oblique direction.

FIG. 25 is a plan view of the reticle having the patterns arranged oblique. In FIG. 25, the patterns are arranged at 45 degrees to the sides of the reticle 18. In FIG. 25, d2 is a pitch 18a of the patterns neighboring each other, i.e., the space size.

Figure 26:
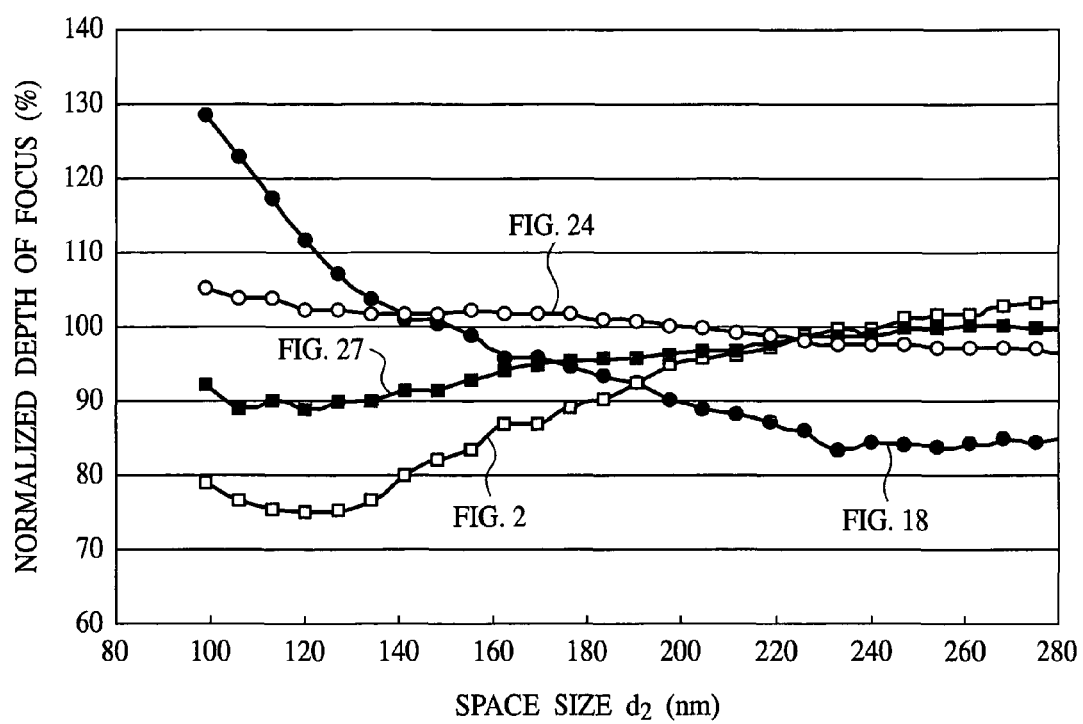
FIG. 26 is a graph of the relationship between the space size and the DOF given when the patterns arranged oblique are transferred.

FIG. 26 is a graph of the relationship between the space size d2 and the DOF in transferring the patterns arrange oblique. In FIG. 26, the space size d2 is taken on the horizontal axis, and on the vertical axis, the normalized DOF is taken. In FIG. 26, the DOF is the value given with the exposure latitude being 4%. In FIG. 26, the ● marks indicate the DOF given by the exposure with the conventional annular illumination stop 116 illustrated in FIG. 18. In FIG. 26, the ○ marks indicate the DOF given by the exposure suing the usual aperture stop 124 illustrated in FIG. 24. In FIG. 26, the □ marks indicate the DOF given by the exposure with the aperture stop 16 illustrated in FIG. 2, i.e., the aperture stop 16 of the first embodiment.

As see in comparing the ●-marked plots, the ○-marked plots and the □-marked plots with one another, when the patterns arranged oblique are transferred by using the aperture stop 16 illustrated in FIG. 2, the DOF cannot be always surely sufficient.

In transferring the patterns arrange oblique by using the aperture stop 16 illustrated in FIG. 2, the DOF cannot be sufficient, because the second apertures 24b1-24b4 arranged respectively at 45 degrees, 135 degrees, 225 degrees and 315 degrees to the center of the aperture stop 16 will be advantageous to transfer the patterns arranged in a square lattice but will be disadvantageous to transfer the patterns arranged oblique. The second apertures 24b1-24b4 which are temporarily arranged at 0 degree, 90 degrees, 180 degrees and 270 degrees to the center of the aperture stop 16 are advantageous to transfer the patterns arranged oblique but disadvantageous to transfer the patterns arranged in a square lattice.

Figure 27:
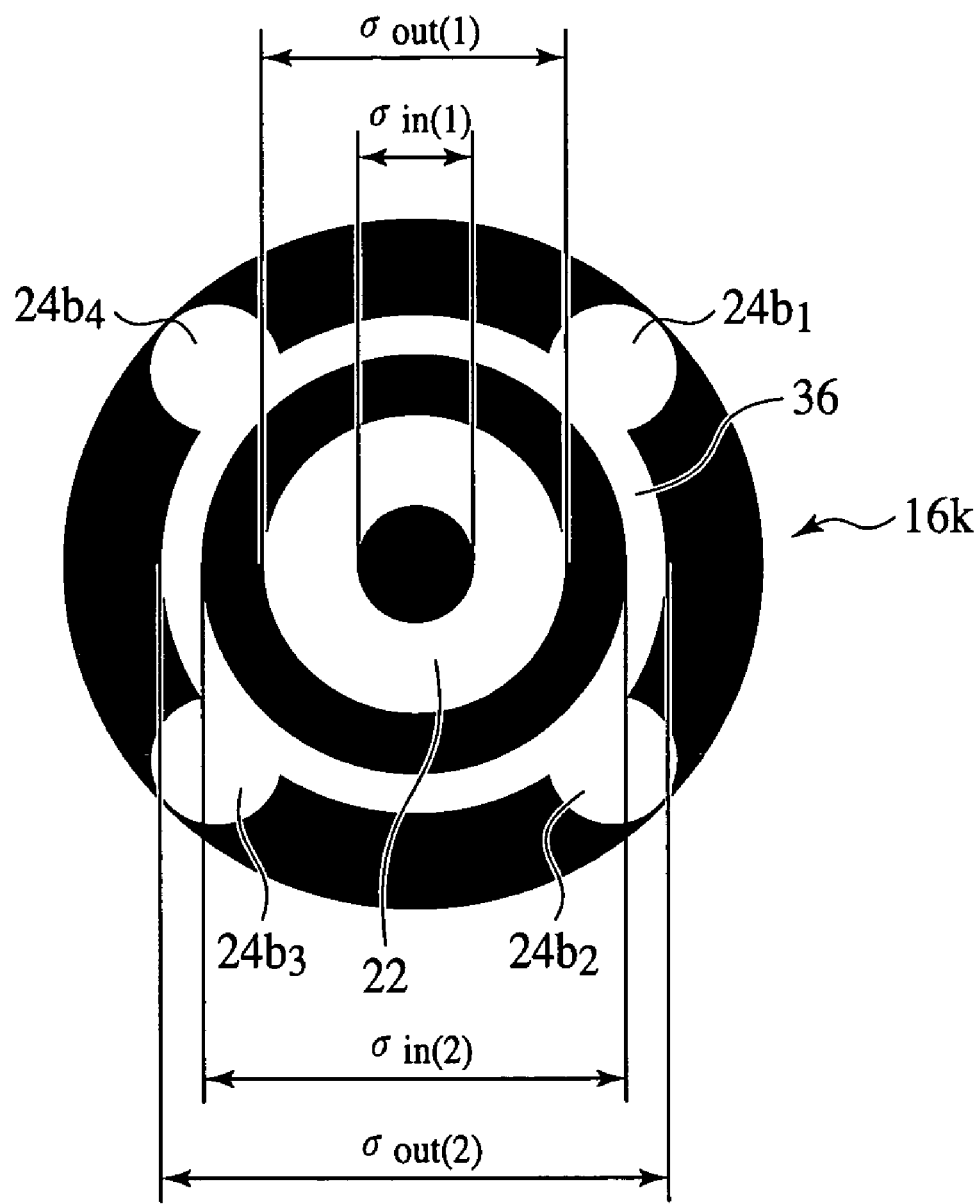
FIG. 27 is a plan view of an aperture stop used in the semiconductor device manufacturing method according to a third embodiment of the present invention.

The inventors of the present application made earnest studies and have obtained the idea that, as illustrated in FIG. 27, the third ring-shaped aperture 36 is further formed outside the first ring-shaped aperture 22. The third ring-shaped aperture 36 formed outside the first ring-shaped aperture 22 is not oriented in a specific direction, as are the second apertures 24b1-24b4 and can contribute to transferring the patterns arranged in various direction with a relatively high resolution. Thus, the patterns are transferred with the aperture stop 16k having the third ring-shaped aperture 36 further formed around the first ring-shaped aperture 22, whereby, even with the patterns 18a for forming holes arranged in various directions, the DOF can be surely sufficient, and the patterns can be stably transferred.

The semiconductor device manufacturing method according to the third embodiment of the present invention will be explained with reference to FIGS. 6A to 6E and 27. FIG. 27 is a plan view of an aperture stop used in the semiconductor device manufacturing method according to the present embodiment. The same members of the present embodiment as those of the semiconductor device manufacturing method according to the first embodiment or the second embodiment illustrated in FIGS. 1 to 17B are represented by the same reference numbers not to repeat or to simplify their explanation.

As illustrated in FIG. 27, the aperture stop 16k used in the present embodiment has the first ring-shaped aperture 22 formed at the center, the third ring-shaped aperture 36 formed around the first aperture 22, and a plurality of the second apertures 24b1-24b4 formed around the third aperture 36.

The inner sigma $\sigma_{in(2)}$ of the third aperture 36 is set larger than the outer sigma $\sigma_{out(1)}$ of the first aperture 22. In other words, the inner diameter of the third aperture 36 is set larger than the outer diameter of the first aperture 22.

The second apertures 24b1-24b4 are arranged inside the effective region of the aperture stop 16k.

The respective sizes of the aperture stop 16k are exemplified below. These sizes are normalized values with the outer diameter of the effective region of the aperture stop 16k being 1.0.

The size of the outer sigma $\sigma_{out(1)}$ of the first aperture 22 is, e.g., 0.4-0.5. The size of the inner sigma $\sigma_{in(1)}$ of the first aperture 22 is, e.g., 0.2-0.3.

The size of the outer sigma $\sigma_{out(2)}$ of the third aperture 36 is, e.g., 0.55-0.70. The inner sigma $\sigma_{in(2)}$ of the third aperture 36 is, e.g., 0.75-0.90.

The distance between the center of the aperture 16k and the centers of the second apertures 24b1-24b4 is, e.g., 0.8-0.9. The second apertures 24b1-24b4 are partially positioned in the third ring-shaped aperture 36. The apertures 24b1-24b4 are formed in, e.g., the following directions with respect to the straight line (center line) which is a straight line parallel with one of the sides of the reticle 18 and passes the center of the aperture stop 16k. For example, the angle formed by the line segment interconnecting the center of the aperture 16k and the center of the aperture 24b1, and the center line of the aperture stop 16k is set at, e.g., 45 degrees. The angle formed by the line segment interconnecting the center of the aperture stop 16k and the center of the aperture 24b2, and the center line of the aperture stop 16k is set at, e.g., 135 degrees. The angle formed by the line segment interconnecting the center of the aperture stop 16k and the center of the aperture 24b3, and the center line of the aperture stop 16k is set at, e.g., 225 degrees. The angle formed by the line segment interconnecting the center of the aperture stop 16k and the center of the aperture 24b4, and the center line of the aperture stop 16k is set at, e.g., 315 degrees.

Thus, the aperture stop 16k of the present embodiment is constituted.

Next, the semiconductor device manufacturing method according to the present embodiment will be explained with reference to FIGS. 6A to 6E.

First, as illustrated in FIGS. 6A to 6E, a semiconductor substrate 20 with an inter-layer insulation film 32, a photoresist film 34, etc. formed on is prepared.

Next, the aperture stop 16k illustrated in FIG. 27 is mounted on the aligner described above with reference to FIG. 1, and the patterns formed on the reticle 18 are transferred to the photoresist film 34 on the semiconductor substrate 20 (see FIG. 6B).

Next, as illustrated in FIG. 6C, the photoresist film 34 is developed.

Then, as illustrated in FIG. 6D, with the photoresist film 34 as the mask, the inter-layer insulation film 32 is etched. Thus, the patterns of holes, etc. are formed in the inter-layer insulation film 32.

Then, as illustrated in FIG. 6E, the photoresist film 34 is released.

Thus, the semiconductor device of the present embodiment is manufactured.

In FIG. 26, the ■ marks indicate the DOF given by transferring the obliquely arranged patterns (see FIG. 25) with the aperture stop 16k of the present embodiment illustrated in FIG. 27. As seen in comparing the □-marked plots with the ■-marked plots in FIG. 26, the use of the aperture stop 16k of the present embodiment can make the DOF sufficient even with the patterns 18a for forming the holes arranged oblique.

In FIG. 23, the ■ marks indicate the DOF given by transferring the pattern arranged in a square lattice (see FIG. 22) by using the aperture 16k of the present embodiment illustrated in FIG. 27. As seen in FIG. 23, the use of the aperture stop 16k of the present embodiment can make the DOF sufficient even when the pattern 18a for forming holes are arranged in a square lattice.

Based on the above, the use of the aperture stop 16k of the present embodiment can make the DOF sufficient even when the pattern 18a for forming holes are arranged in various directions.

As described above, according to the present embodiment, the aperture stop 16k having the third ring-shaped aperture 36 further formed around the first ring-shaped aperture 22 is used to transfer the patterns, whereby even with the patterns 18a for forming holes arranged in various directions, the DOF can be surely sufficient, and the patterns can be stably transferred.

Whether or not assist patterns are provided around the pattern 18a for forming hole is not explicitly explained here, but as illustrated in FIG. 7, the assist patterns 21 may be suitably formed around the pattern 18a. The assist patterns are provided on the reticle as illustrated in FIG. 7, whereby the required patterns can be stably formed.

(Modification 1)

Figure 28:
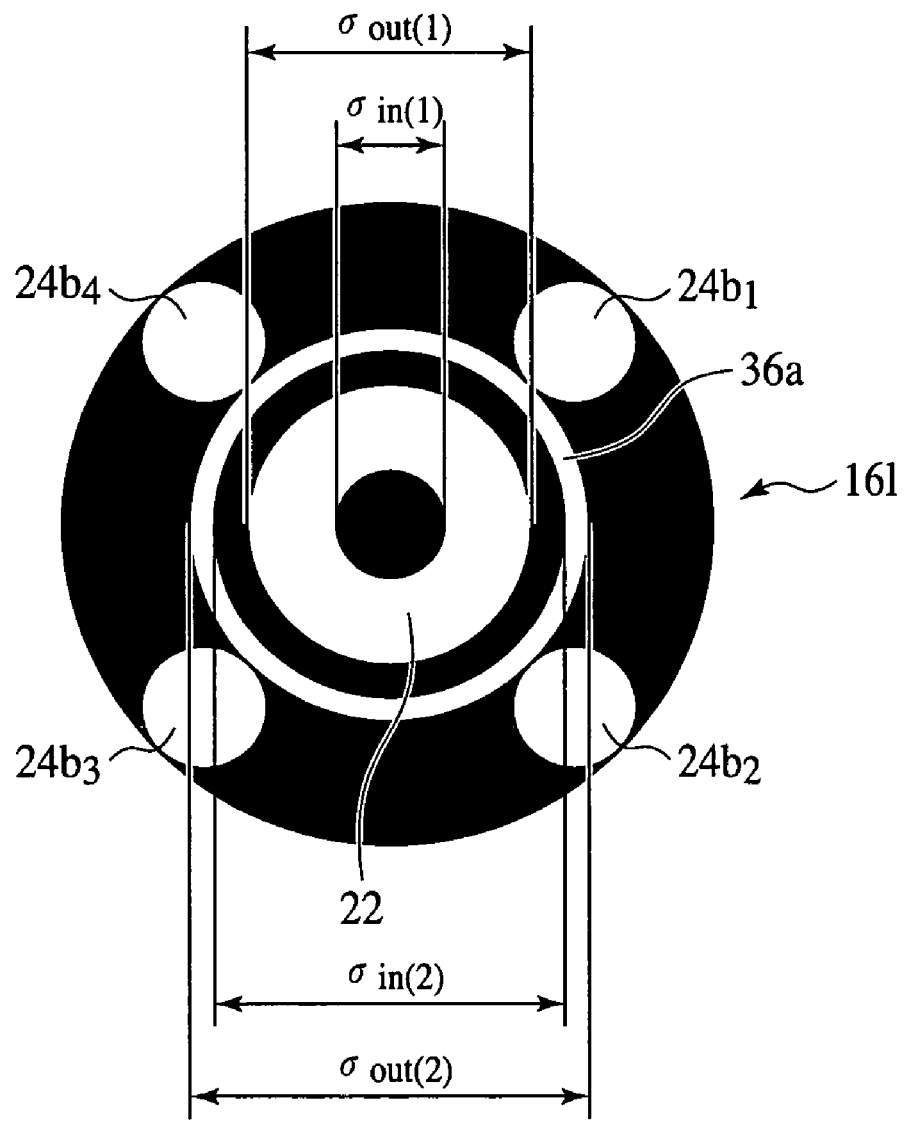
FIG. 28 is a plan view of an aperture stop used in the semiconductor device manufacturing method according to Modification 1 of the third embodiment of the present invention.
Figure 29:
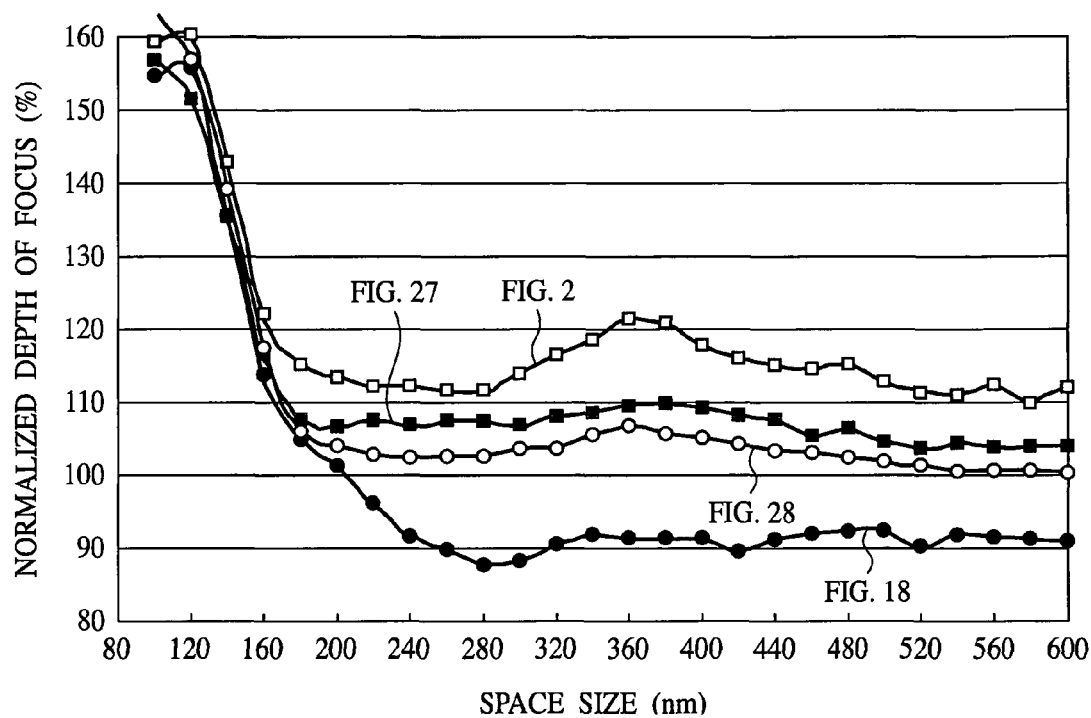
FIG. 29 is a graph (Part 1) of the relationship between the space size and the DOF given when the patterns arranged in a square lattice are transferred.
Figure 30:
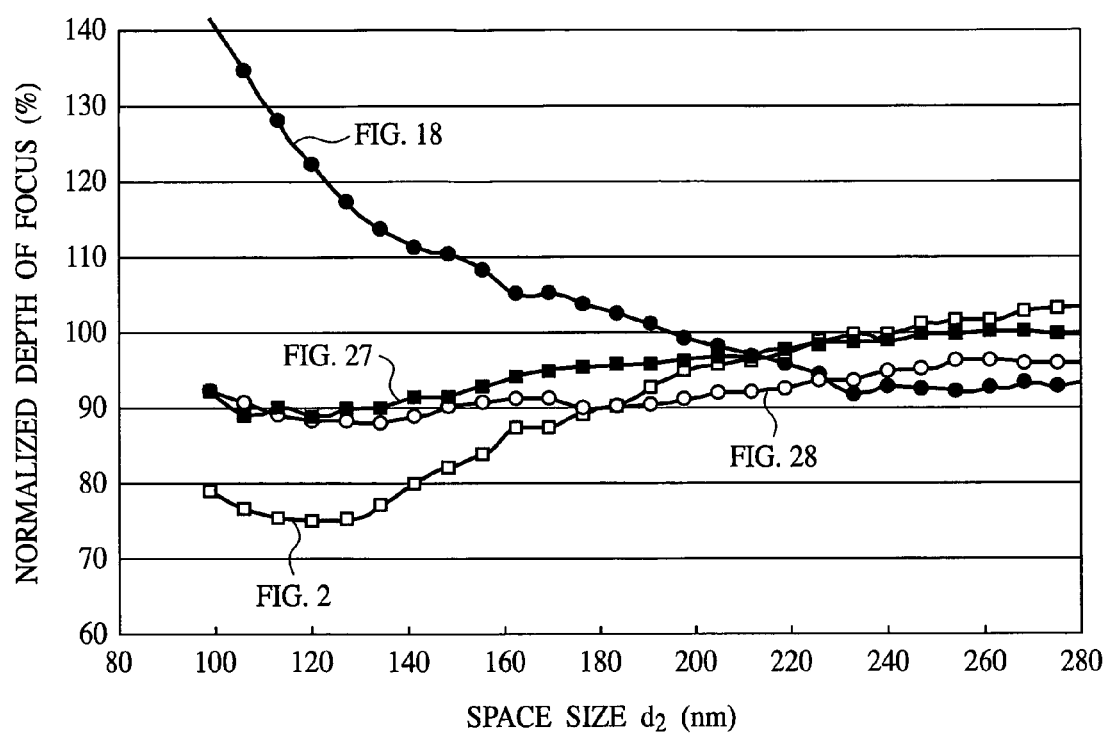
FIG. 30 is a graph (Part 1) of the relationship between the space size and the DOF given when the patterns arranged oblique are transferred.

Next, the semiconductor device manufacturing method according to Modification 1 of the present embodiment will be explained with reference to FIGS. 28 to 30. FIG. 28 is a plan view of an aperture stop used in the semiconductor device manufacturing method according to the present modification. FIG. 29 is a graph of the relationship between the space size and the DOF given when the patterns arranged in a square lattice are transferred. FIG. 30 is a graph of the relationship between the space size and the DOF given when the patterns arranged oblique are transferred.

The semiconductor device manufacturing method according to the present modification is characterized mainly in that the patterns are transferred by using the aperture stop 161 illustrated in FIG. 28. That is, the semiconductor device manufacturing method according to the present modification is characterized mainly in that the outer sigma $\sigma_{out(2)}$ of the third ring-shaped aperture 36a and the size of the inner sigma $\sigma_{in(2)}$ are smaller than those of the aperture stop 16k illustrated in FIG. 27, and the second apertures 24b1-24b4 are not positioned in the third ring-shaped aperture 36a.

The respective sizes of the aperture stop 161 are as exemplified below. These sizes are values given by normalizing the outer diameter of the effective region of the aperture stop 161 to be 1.0.

The size of the outer sigma $\sigma_{out(1)}$ of the first aperture 22 is, e.g., 0.4-0.5. The inner sigma $\sigma_{in(1)}$ of the first aperture 22 is, e.g., 0.2-0.3.

The outer sigma $\sigma_{out(2)}$ of the third aperture 36a is, e.g., 0.55-0.7. The size of the inner sigma $\sigma_{in(2)}$ of the third aperture 36a is, e.g., 0.75-0.90.

The distance between the center of the aperture stop 161 and the centers of the second apertures 24b1-24b4 are, e.g., 0.8-0.9. The second apertures 24b1-24b4 are not positioned inside the third aperture 36a but are positioned outside the third ring-shaped aperture 36a. That is, the second apertures 24b1-24b4 and the third ring-shaped aperture 36a are not superimposed on each other.

Thus, the aperture stop 161 of the present modification is constituted.

FIG. 29 is a graph of the relationship between the space size d1 and the DOF given when the patterns arranged in a square lattice are transferred. In FIG. 29, the space size is taken on the horizontal axis, and the normalized DOF is taken on the vertical axis. In FIG. 29, the DOF is values given when the exposure latitude is 4%. In FIG. 29, the ● marks indicate the DOF given by the exposure with the conventional annular illumination stop 116 illustrated in FIG. 18. In FIG. 29, the □ marks indicate the DOF given by the exposure with the aperture stop 16 illustrated in FIG. 2, i.e., the aperture stop 16 according to the first embodiment. In FIG. 29, the ■ marks indicate the DOF given by the exposure with the aperture stop 16k illustrated in FIG. 27, i.e., the aperture stop 16k of the third embodiment. In FIG. 29, the ○ marks indicate the DOF given by the exposure with the aperture stop 161 illustrated in FIG. 28, i.e., the aperture stop 161 according to the present modification.

As seen in FIG. 29, the use of the aperture stop 161 according to the present modification as well can make the DOF sufficient.

FIG. 30 is a graph of the relationship between the space size d2 and the DOF given when the patterns arrange oblique are transferred. In FIG. 30, the space size d2 is taken on the horizontal axis, and on the vertical axis, the DOF is taken. In FIG. 30, the DOF is values given when the exposure latitude is 4%. In FIG. 30, the ● marks indicate the DOF given by the exposure with the conventional annular illumination stop 116 illustrated in FIG. 18. In FIG. 30, the □ marks indicate the DOF given by the exposure with the aperture stop 16 illustrated in FIG. 2, i.e., the aperture stop 16 according to the first embodiment. In FIG. 30, the ■ marks indicate the DOF given by the exposure with the aperture stop 16k illustrated in FIG. 27, i.e., the aperture stop 16k according to the third embodiment. In FIG. 30, the ○ marks indicate the DOF given by the exposure with the aperture stop 161 illustrated in FIG. 28, i.e., the aperture stop 161 according to the present modification.

As seen in FIG. 30, the aperture stop 161 according to the present modification as well can make the DOF sufficient.

As described above, in the present modification as well the semiconductor device manufacturing method according to the third embodiment, even when the patterns 18a for forming holes are arranged in various directions, the DOF can be made sufficient, and the patterns can be stably transferred.

(Modification 2)

Figure 31:
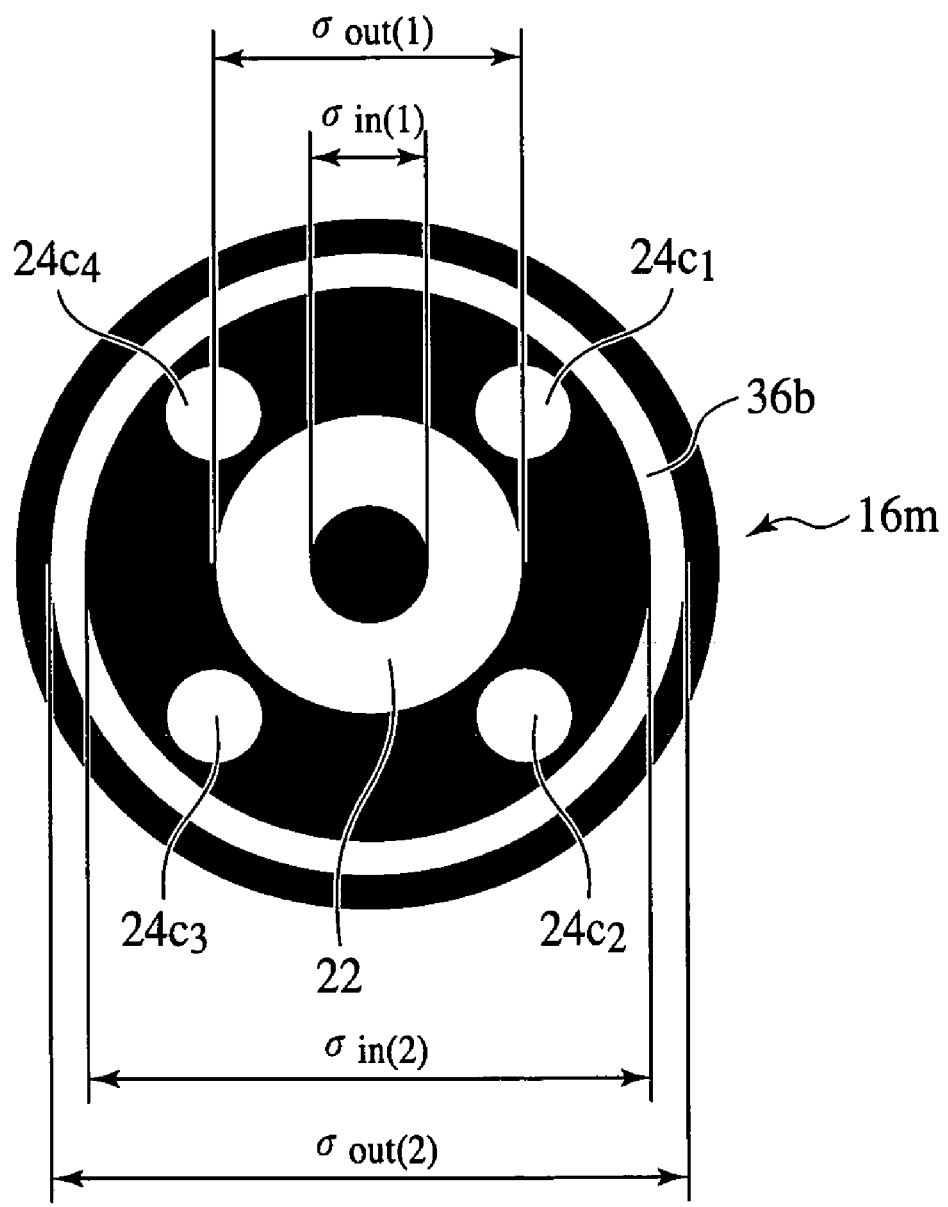
FIG. 31 is a plan view of an aperture stop used in the semiconductor device manufacturing method according to Modification 2 of the third embodiment of the present invention.
Figure 32:
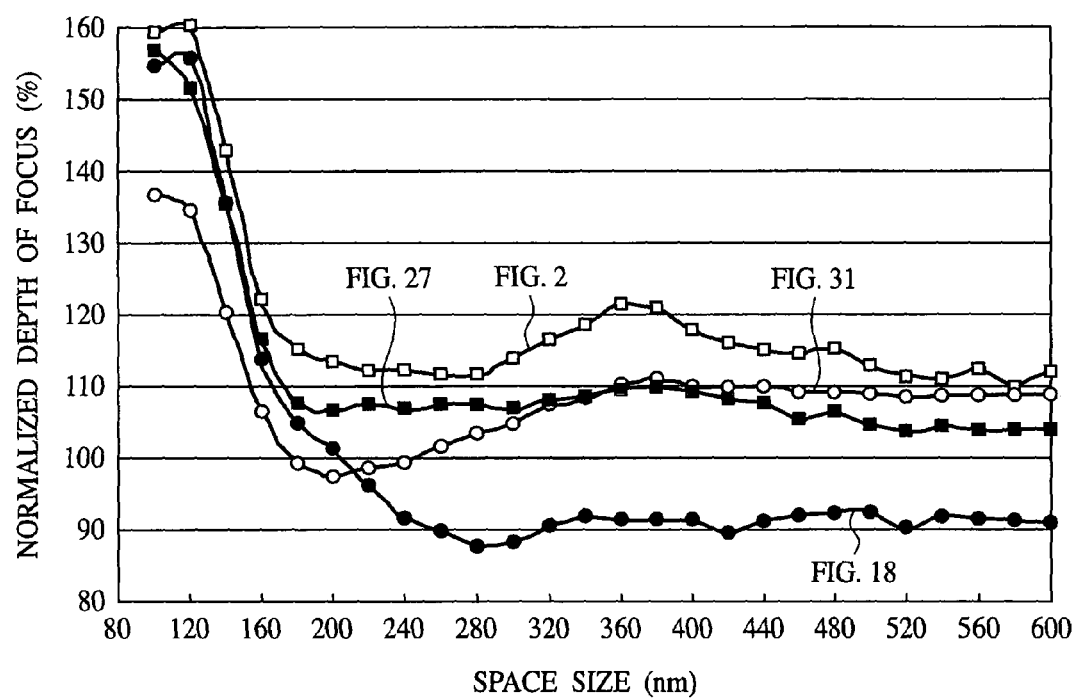
FIG. 32 is a graph (Part 2) of the relationship between the space size and the DOF given when the patterns arranged in a square lattice are transferred.
Figure 33:
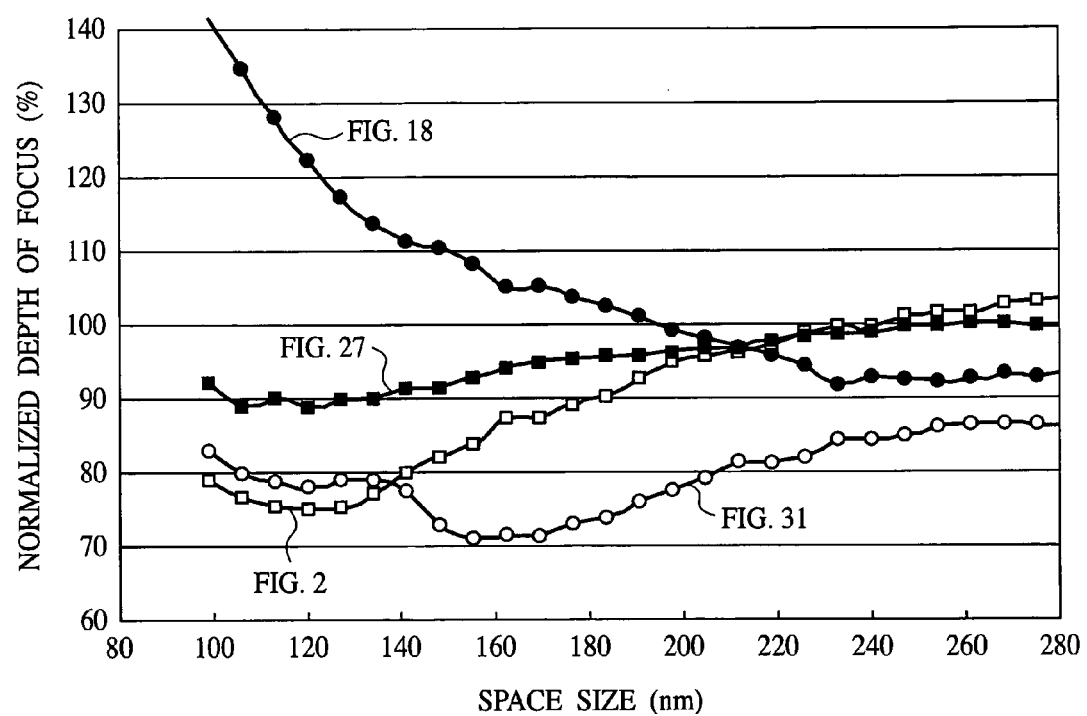
FIG. 33 is a graph (Part 2) of the relationship between the space size and the DOF given when the patterns arranged oblique are transferred.

Next, the semiconductor device manufacturing method according to Modification 2 of the present embodiment will be explained with reference to FIGS. 31 to 33. FIG. 31 is a plan view of an aperture stop used in the semiconductor device manufacturing method according to the present modification. FIG. 32 is a graph of the relationship between the space size and the DOF given when the patterns arranged in a square lattice are transferred. FIG. 33 is a graph of the relationship between the space size and the DOF given when patterns arranged oblique are transferred.

The semiconductor device manufacturing method according to the present modification is characterized mainly in that the patterns are transferred with the aperture stop 16m illustrated in FIG. 31. That is, the semiconductor device manufacturing method is characterized mainly in that the outer sigma $\sigma_{out(2)}$ of the third ring-shaped aperture 36b and the inner sigma $\sigma_{in(2)}$ of the third ring-shaped aperture 36b are set smaller than those of the aperture stop 16k illustrated in FIG. 27, and the aperture stop 16m having the second apertures 24c1-24c4 positioned inside the third aperture 36b is used to transfer the patterns.

The respective sizes of the aperture stop 16m are as exemplified below. These sizes are value given normalizing the outer diameter of the effective region of the aperture stop 16m to be 1.0.

The size of the outer sigma $\sigma_{out(1)}$ of the first aperture 22 is, e.g., 0.4-0.5. The size of the inner $\sigma_{in(1)}$ of the first aperture 22 is, e.g., 0.2-0.3.

The size of the outer sigma $\sigma_{out(2)}$ of the third aperture 36b is, e.g., 0.85-0.95. The size of the inner $\sigma_{in(2)}$ of the third aperture 36b is, e.g., 0.75-0.85.

The distance between the center of the aperture stop 16m and the centers of the second apertures 24c1-24c4 is, e.g., 0.55-0.70. The second apertures 24c1-24c4 are positioned outside the first ring-shaped aperture 22 and inside the third ring-shaped aperture 36b.

Thus, the aperture 16m of the present modification is constituted.

FIG. 32 is a graph of the relationship between the space size d1 for transferring the patterns arranged in a square lattice and the DOF. In FIG. 32, the space size d1 is taken on the horizontal axis, and on the vertical axis, the DOF is taken. In FIG. 32, the DOF is values given when the exposure latitude is 4%. In FIG. 32, the ● marks indicate the DOF given when the exposure is made with the conventional annular illumination stop 116 illustrated in FIG. 18. In FIG. 32, the □ marks indicate the DOF given when the exposure is made with the aperture stop 16 illustrated in FIG. 2, i.e., the aperture stop 16 according to the first embodiment. In FIG. 32, the ■ marks indicate the DOF given when the exposure is made with the aperture stop 16k illustrated in FIG. 27, i.e., the aperture stop 16k according to the third embodiment. In FIG. 32, the ○ marks indicate the DOF given when the exposure is made with the aperture stop 16m illustrated in FIG. 31, i.e., the aperture stop 16m according to the present modification.

As seen in FIG. 32, even with the aperture stop 16m of the present modification, the DOF can be made sufficient.

FIG. 33 is a graph of the relationship between the space size d2 for transferring the patterns arranged oblique and the DOF. In FIG. 33, the space size d2 is taken on the horizontal axis, and on the vertical axis, the normalized DOF is taken. In FIG. 33, the DOF is values given when the exposure latitude is 4%. In FIG. 33, the ● marks indicate the DOF given by the exposure with the conventional annular illumination stop 116 illustrated in FIG. 18. In FIG. 33, the □ marks indicate the DOF given by the exposure with the aperture stop 16 illustrated in FIG. 2, i.e., the aperture stop 16 according to the first embodiment. In FIG. 33, the ■ marks indicate the DOF given by the exposure with the aperture stop 16k illustrated in FIG. 27, i.e., the aperture stop 16k according to the third embodiment. In FIG. 33, the ○ marks indicate the DOF given by the exposure with the aperture stop 16m illustrated in FIG. 31, i.e., the aperture stop 16m according to the present modification As seen in FIG. 33, when the space size d2 is relatively small, the present modification can make the DOF larger than the DOF given with the aperture stop 16 illustrated in FIG. 2.

As described above, the present modification as well can surely make the DOF sufficient, and the patterns can be stably transferred.

(Modification 3)

Figure 34:
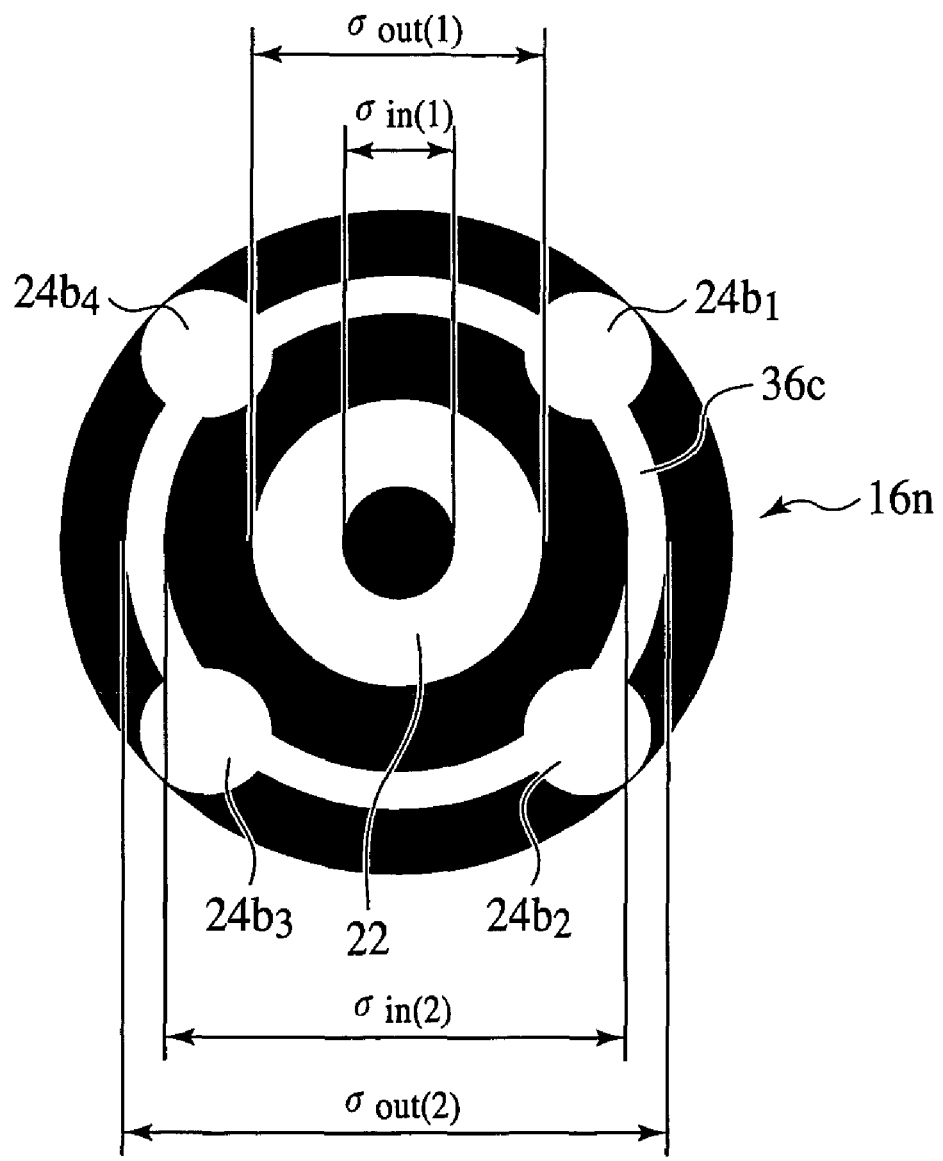
FIG. 34 is a plan view of an aperture stop used in the semiconductor device manufacturing method according to Modification 3 of the third embodiment of the present invention.
Figure 35:
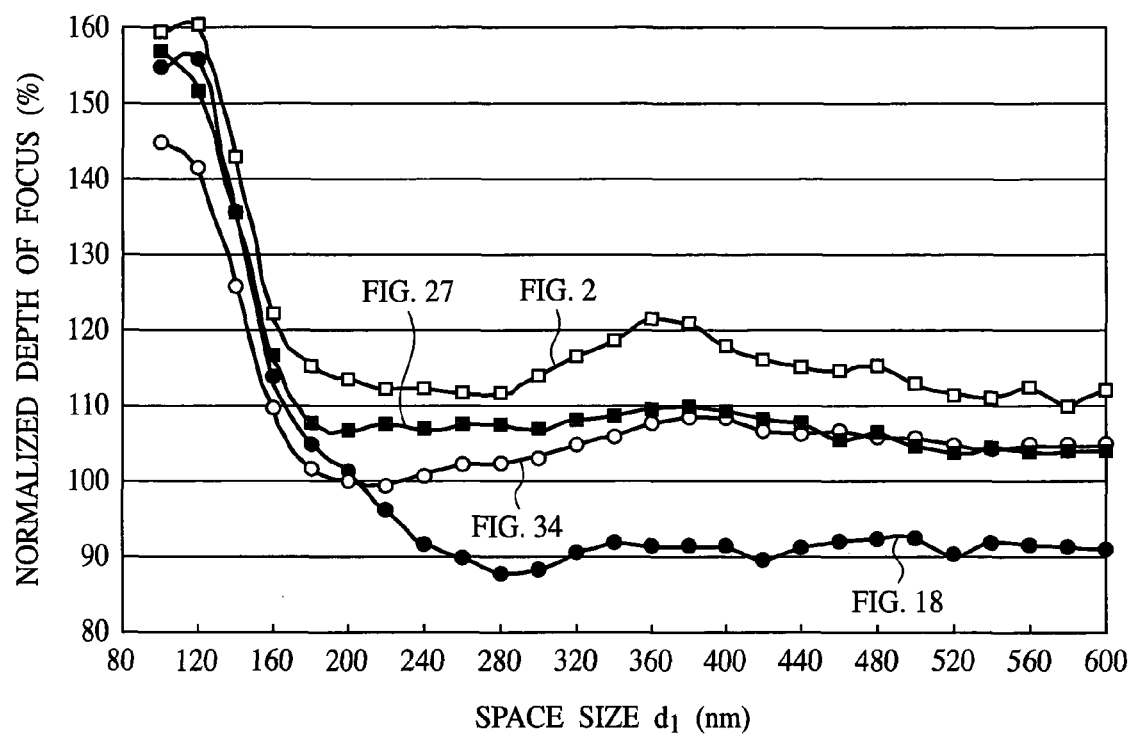
FIG. 35 is a graph (Part 3) of the relationship between the space size and the DOF given when the patterns arranged in a square lattice are transferred.
Figure 36:
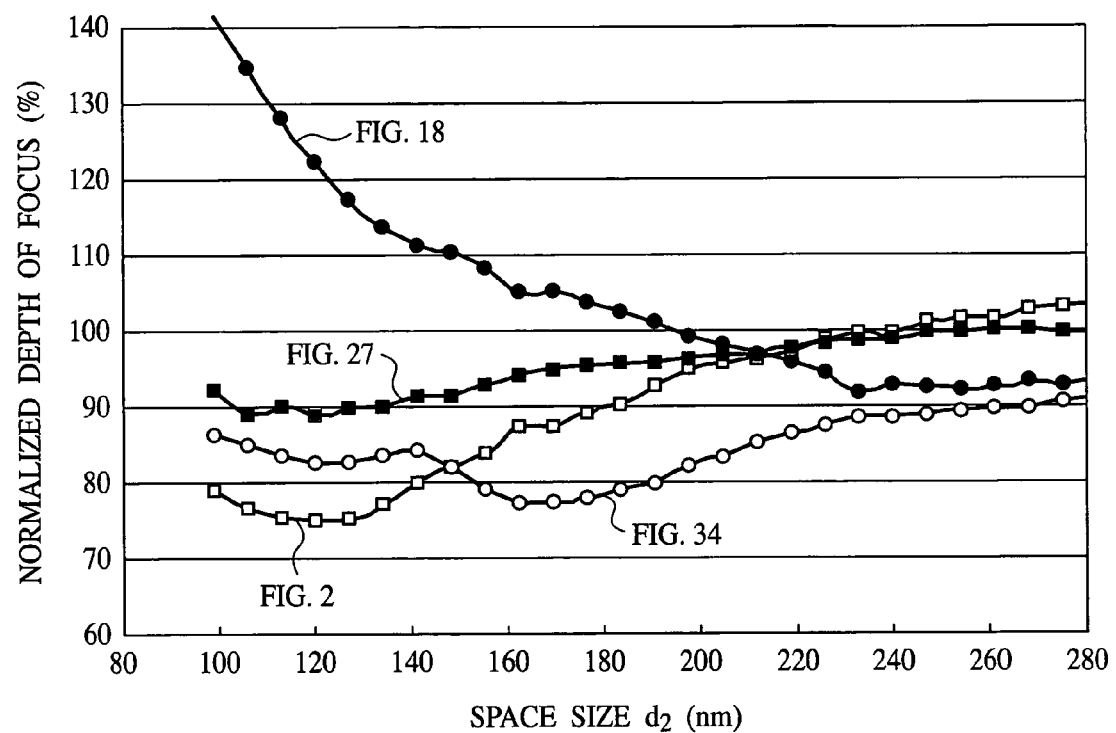
FIG. 36 is a graph (Part 3) of the relationship between the space size and the DOF given when the patterns arranged oblique are transferred.

Next, the semiconductor device manufacturing method according to Modification 3 of the present embodiment will be explained with reference to FIGS. 34 to 36. FIG. 34 is a plan view of an aperture stop used in the semiconductor device manufacturing method according to the present modification. FIG. 35 is a graph of the relationship between the space size for transferring the patterns arranged in a square lattice and the DOF. FIG. 36 is a graph of the relationship between the space size for transferring the patterns arranged oblique and the DOF.

The semiconductor device manufacturing method according to the present modification is characterized mainly in that the aperture stop 16n illustrated in FIG. 34 is used to transfer the patterns. That is, the semiconductor device manufacturing method according to the present modification is characterized mainly in that the aperture stop 16n having the size of the outer sigma $\sigma_{out(2)}$ and the size of the inner sigma $\sigma_{in(2)}$ of the third ring-shaped aperture 36c set larger than those of the aperture stop 16k illustrated in FIG. 27 and having the second apertures 24c1-24c4 partially positioned in the third ring-shaped aperture 36b is used to transfer the patterns.

The respective sizes of the aperture stop 16n are as exemplified below. These sizes are values normalized with the outer diameter of the effective region of the aperture stop 16n being 1.0.

The size of the outer sigma $\sigma_{out(1)}$ of the first aperture 22 is, e.g., 0.4-0.5. The size of the inner sigma $\sigma_{in(1)}$ of the first aperture-22 is, e.g., 0.2-0.3.

The size of the outer sigma $\sigma_{out(2)}$ of the third aperture 36c is, e.g., 0.8-0.9. The size of the inner sigma $\sigma_{in(2)}$ of the third aperture 36c is, e.g., 0.7-0.8.

The distance between the center of the aperture stop 16n and the centers of the second apertures 24b1-24b4 is, e.g., 0.8-0.9. The second apertures 24b1-24b4 are partially positioned in the third ring-shaped aperture 36c. That is, the second apertures 24b1-24b4 partially overlap the third ring-shaped aperture 36c.

Thus, the aperture stop 16n of the present modification is constituted.

FIG. 35 is a graph of the relationship between the space size d1 for transferring the patterns arranged in a square lattice and the DOF. In FIG. 35, the space size d1 is taken on the horizontal axis, and on the vertical axis, the normalized DOF is taken. In FIG. 35, the DOF is values given when the exposure latitude is 4%. In FIG. 35, the ● marks indicate the DOF given by the exposure with the conventional annular illumination stop 116 illustrated in FIG. 18. In FIG. 35, the □ marks indicate the DOF given by the exposure with the aperture stop 16 illustrated in FIG. 2, i.e., the exposure with the aperture stop 16 according to the first embodiment. In FIG. 35, the ■ marks indicate the DOF given by the exposure with the aperture stop 16k illustrated in FIG. 27, i.e., the exposure with the aperture stop 16k according to the third embodiment. In FIG. 35, the ○ marks indicate the DOF given by the exposure with the aperture stop 16n illustrated in FIG. 34, i.e., the exposure with the aperture stop 16n according to the present modification.

As seen in FIG. 35, even with the aperture stop 16n according to the present modification, the DOF can be surely sufficient.

FIG. 36 is a graph of the relationship between the space size d2 for transferring the patterns arrange oblique and the DOF. In FIG. 36, the space size d2 is taken on the horizontal axis, and on the vertical axis, the normalized DOF is taken. In FIG. 36, the DOF is values given when the exposure latitude is 4%. In FIG. 36, the ● marks indicate the DOF given by the exposure with the conventional annular illumination stop 116 illustrated in FIG. 18. In FIG. 36, the □ marks indicate the DOF given by the exposure with the aperture stop 16 illustrated in FIG. 2, i.e., the aperture stop 16 according to the first embodiment. In FIG. 36, the ■ marks indicate the DOF given by the exposure with the aperture stop 16k illustrated in FIG. 27, i.e., the exposure with the aperture stop 16k according to the third embodiment. In FIG. 36, the ○ marks indicate the DOF given by the exposure with the aperture stop 16n illustrated in FIG. 34, i.e., the exposure with the aperture stop 16n according to the present modification.

As seen in FIG. 36, when the space size d2 is relatively small, the present modification can make the DOF larger than the DOF given by the aperture stop 16 illustrated in FIG. 2.

As described above, the present modification as well can make the DOF surely sufficiently large and can stably transfer the patterns.

(Modification 4)

Figure 37:
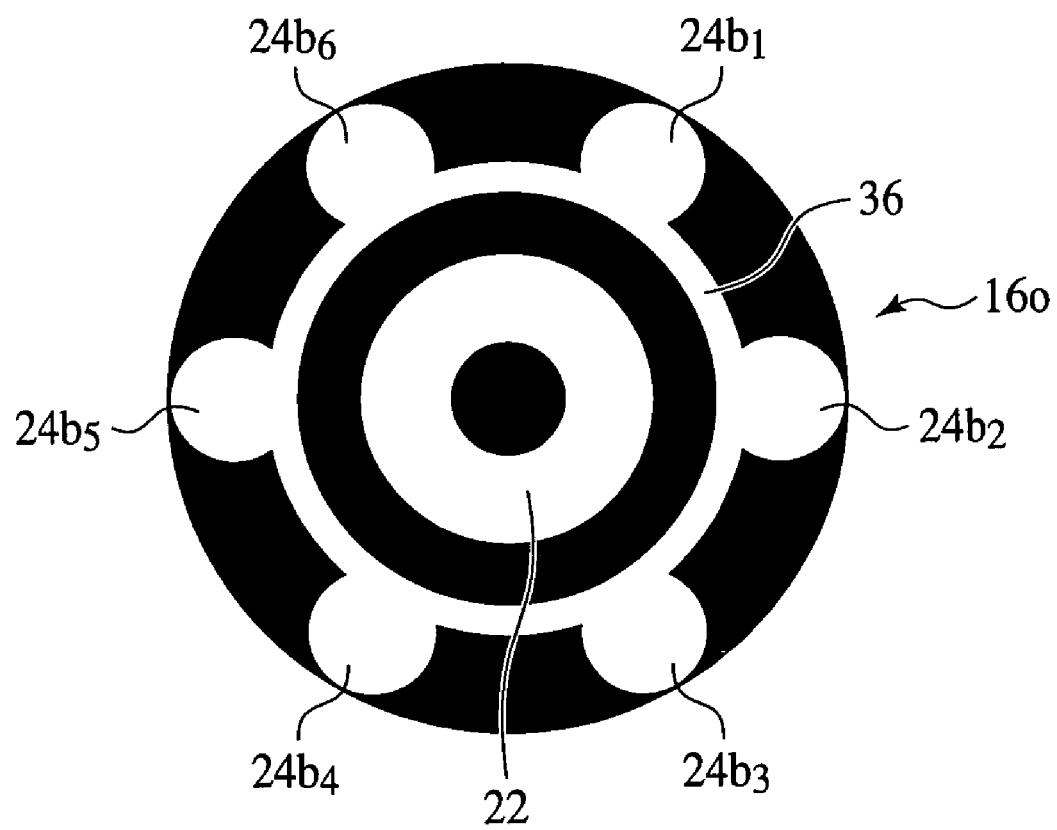
FIG. 37 is a plan view of an aperture stop used in the semiconductor device manufacturing method according to Modification 4 of the third embodiment of the present invention.

Then, the semiconductor device manufacturing method according to Modification 4 of the present embodiment will be explained. FIG. 37 is a plan view of an aperture stop used in the semiconductor device manufacturing method according to the present modification.

The semiconductor device manufacturing method according to the present modification is characterized mainly in that the patterns are transferred by using an aperture stop 16o illustrated in FIG. 37. That is, the semiconductor device manufacturing method according to the present modification is characterized mainly in that the patterns are transferred by using the aperture 16o having the second apertures 24a1-24a6 hexagonally arranged.

As illustrated in FIG. 37, the second apertures 24a1-24a6 are hexagonally formed.

The apertures 24b1-24b6 are formed in the direction as exemplified below with the straight line (center line) parallel with one of the sides of the reticle 18 and passing the center of the aperture stop 16o set as the reference. For example, the angle formed by the line segment interconnecting the center of the aperture stop 16o and the center of the aperture 24b1, and the center line of the aperture stop 16o is set at, e.g., 30 degrees. The angle formed by the line segment interconnecting the center of the aperture stop 16o and the center of the aperture 24b2, and the center line of the aperture stop 16o is set at, e.g., 90 degrees. The angle formed by the line segment interconnecting the center of the aperture stop 16o and the center of the aperture 24b3, and the center line of the aperture stop 16o is set at, e.g., 150 degrees. The angle formed by the line segment interconnecting the center of the aperture stop 16o and the center of the aperture 24b4, and the center line of the aperture stop 16o is set at, e.g., 210 degrees. The angle formed by the line segment interconnecting the center of the aperture stop 16o and the center of the aperture 24b5, and the center line of the aperture stop 16o is set at, e.g., 270 degrees. The angle formed by the line segment interconnecting the center of the aperture stop 16o and the center of the aperture 24b6, and the center line of the aperture stop 16o is set at, e.g., 330 degrees.

The second apertures 24b1-24b6 are partially positioned in the third ring-shaped aperture 36. That is, the second apertures 24b1-24b6 partially overlap the third ring-shaped aperture 36.

In the present modification as well in the semiconductor device manufacturing method according to the third embodiment, even when the patterns 18a for forming holes are arranged in various directions, the DOF can be surely sufficient, and the patterns can be stably transferred.

(Modification 5)

Figure 38:
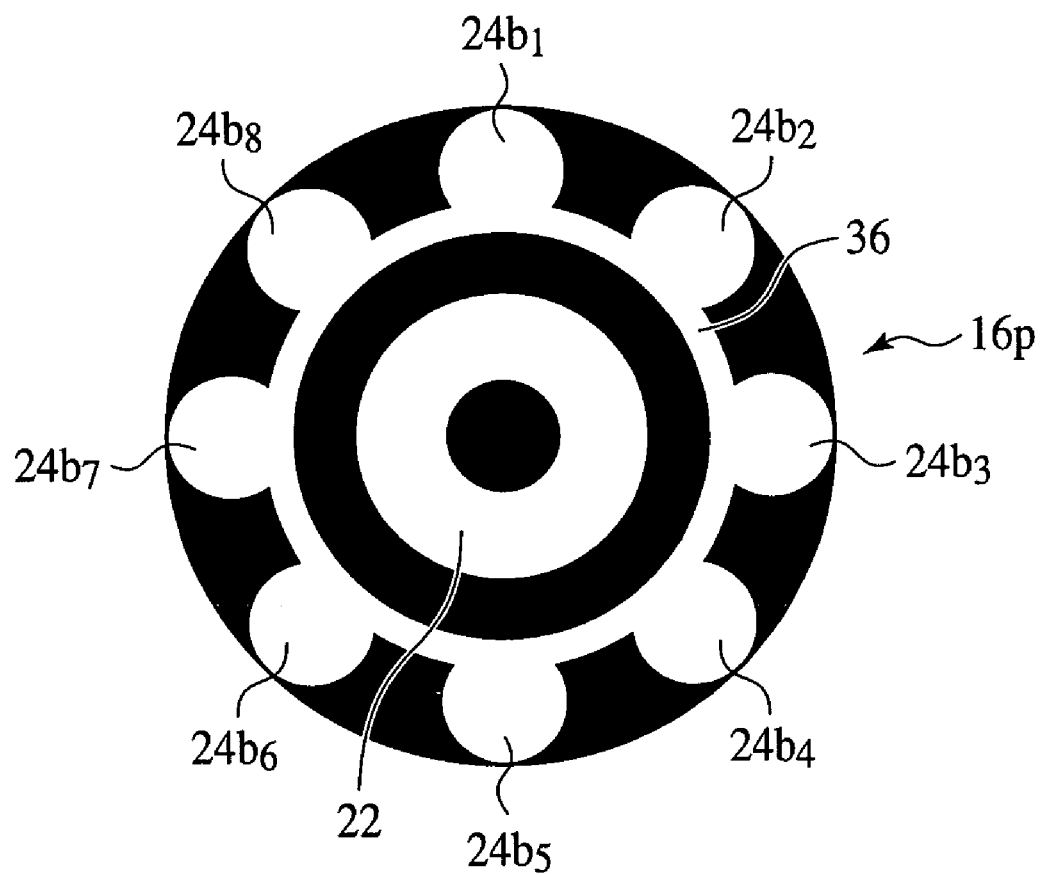
FIG. 38 is a plan view of an aperture stop used in the semiconductor device manufacturing method according to Modification 5 of the third embodiment of the present invention.

The semiconductor device manufacturing method according to Modification 5 of the present embodiment will be explained with reference to FIG. 38. FIG. 38 is a plan view of an aperture stop used in the semiconductor device manufacturing method according to the present modification.

The semiconductor device manufacturing method according to the present modification is characterized mainly in that an aperture stop 16p illustrated in FIG. 38 is used to transfer the patterns. That is, the semiconductor device manufacturing method according to the present modification is characterized mainly in that the aperture stop 16p having the second apertures 24a1-24a8 octagonally formed is used to transfer the patterns.

As illustrated in FIG. 38, the second apertures 24a1-24a8 are octagonally formed.

The apertures 24b1-24b8 are formed in the direction as exemplified below with the straight line (center line) parallel with one of the sides of the reticle 18 and passing the center of the aperture stop 16p set as the reference. For example, the angle formed by the line segment interconnecting the center of the aperture stop 16p and the center of the aperture 24b1, and the center line of the aperture stop 16p is set at, e.g., 0 degree. The angle formed by the line segment interconnecting the center of the aperture stop 16p and the center of the aperture 24b2, and the center line of the aperture stop 16p is set at, e.g., 45 degrees. The angle formed by the line segment interconnecting the center of the aperture stop 16p and the center of the aperture 24b3, and the center line of the aperture stop 16p is set at, e.g., 90 degrees. The angle formed by the line segment interconnecting the center of the aperture stop 16p and the center of the aperture 24b4, and the center line of the aperture stop 16p is set at, e.g., 135 degrees. The angle formed by the line segment interconnecting the center of the aperture stop 16p and the center of the aperture 24b5, and the center line of the aperture stop 16p is set at, e.g., 180 degrees. The angle formed by the line segment interconnecting the center of the aperture stop 16p and the center of the aperture 24b6, and the center line of the aperture stop 16p is set at, e.g., 225 degrees. The angle formed by the line segment interconnecting the center of the aperture 16p and the center of the aperture 24b7, and the center line of the aperture stop 16p is set at, e.g., 270 degrees. The angle formed by the line segment interconnecting the center of the aperture 16p and the center of the aperture 24b8, and the center line of the apertures stop 16p is set at, e.g., 315 degrees.

The second apertures 24b1-24b8 are partially positioned in the third ring-shaped aperture 36. That is, the second apertures 24b1-24b8 partially overlap the third ring-shaped aperture 36.

In the present modification as well the semiconductor device manufacturing method according to the third embodiment, even when the patterns 18a for forming holes are arranged in various directions, the DOF can be surely sufficient, and the patterns can be stably transferred.

(Modification 6)

Figure 39:
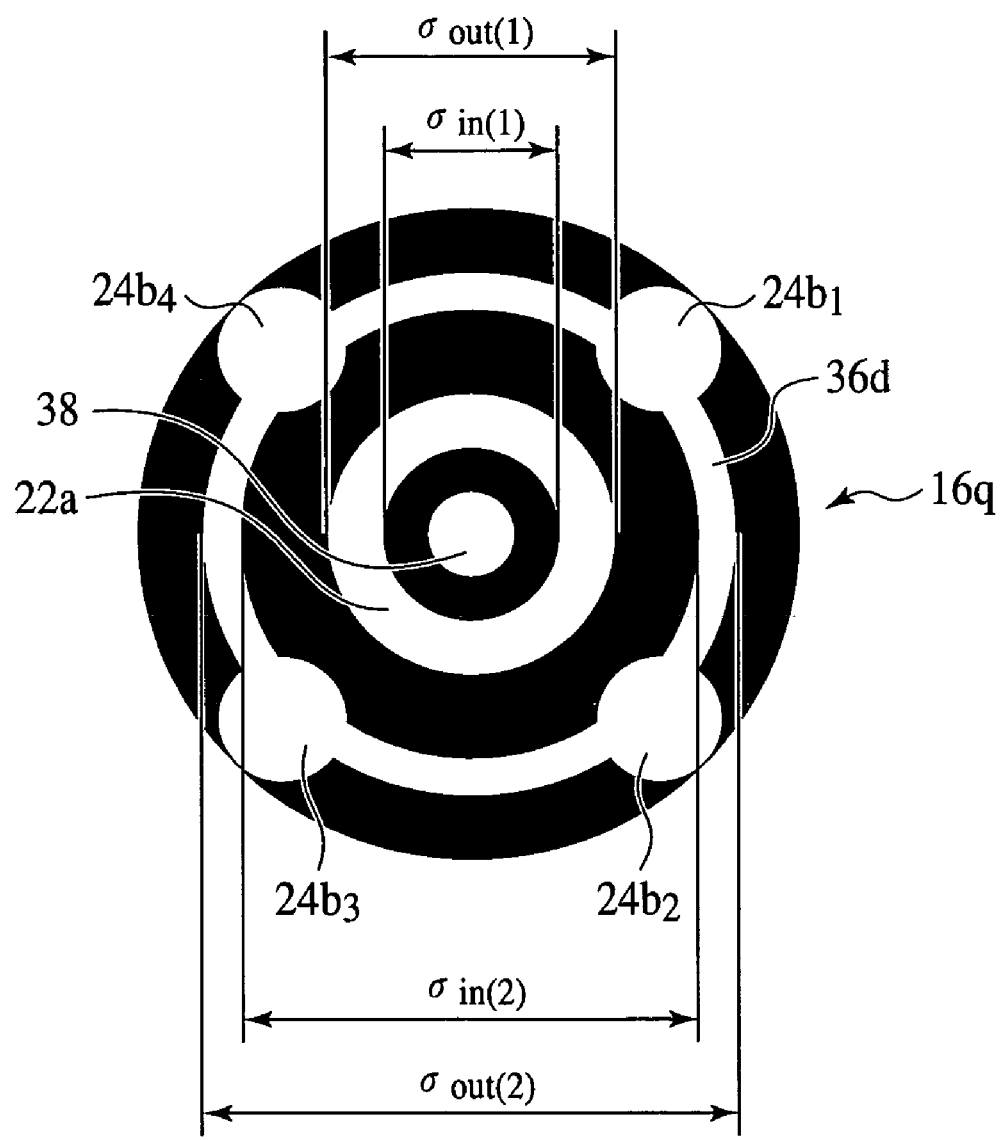
FIG. 39 is a plan view of an aperture stop used in the semiconductor device manufacturing method according to Modification 6 of the third embodiment of the present invention.

Then, the semiconductor device manufacturing method according to Modification 6 of the present embodiment will be explained with reference to FIG. 39. FIG. 39 is a plan view of an aperture stop used in the semiconductor device manufacturing method according to the present modification.

The semiconductor device manufacturing method according to the present modification is characterized mainly in that the aperture stop 16q illustrated in FIG. 39 is sued to transfer the patterns. That is, the semiconductor device manufacturing method according to the present modification is characterized mainly in that the aperture stop 16q having the fourth aperture 38 further formed in the center is used to transfer the patterns.

As illustrated in FIG. 39, the aperture 38 having a smaller diameter than the inner sigma $\sigma_{in(1)}$ of the first ring-shaped aperture 22 is formed in the center of the aperture stop 16q, i.e., inside the first ring-shaped aperture 22a. The aperture 38 contributes to transferring patterns isolated the other patterns, i.e., isolated patterns with a relatively high resolution.

The respective sizes of the aperture stop 16q are as exemplified below. These sizes are normalized with the outer diameter of the effective region of the apertures stop 16q set at 1.0.

The size of the outer sigma $\sigma_{out(1)}$ of the first aperture 22a is, e.g., 0.4-0.5. The size of the inner sigma $\sigma_{in(1)}$ of the first aperture 22a is, e.g., 0.2-0.3.

The size of the outer sigma $\sigma_{out(2)}$ of the third aperture 36d is, e.g., 0.8-0.9. The size of the inner sigma $\sigma_{in(2)}$ of the third aperture 36d is, e.g., 0.7-0.8.

The distance between the center of the aperture stop 16q and the centers of the second apertures 24b1-24b4 is, e.g., 0.8-0.9. The second apertures 24b1-24b4 are partially positioned in the third ring-shaped aperture 36d. That is, the second apertures 24b1-24b4 partially overlap the third ring-shaped aperture 36d.

The diameter of the fourth aperture 38 is, e.g., 0.1-0.25.

Thus, the aperture stop 16q of the present modification is thus formed.

In the present modification, because of the aperture 38 formed in the center of the aperture stop 16q, even when patterns are present, isolated on the reticle, patterns can be transferred with a high resolution.

A Fourth Embodiment

Figure 40A:
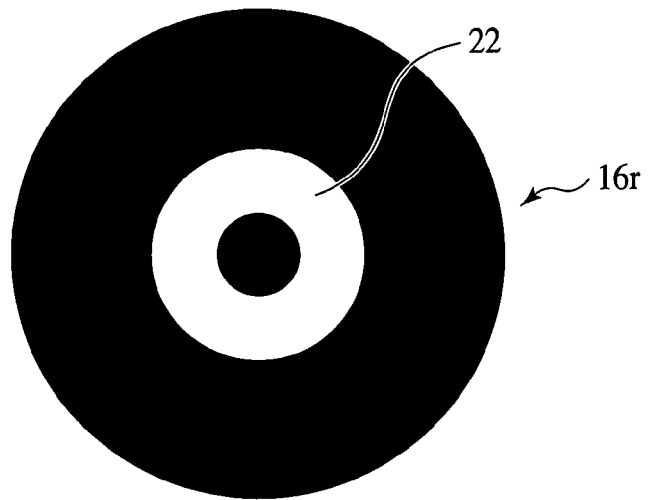
FIGS. 40A to 40C are plan views of an aperture stop used in the semiconductor device manufacturing method according to a fourth embodiment of the present invention.
Figure 40B:
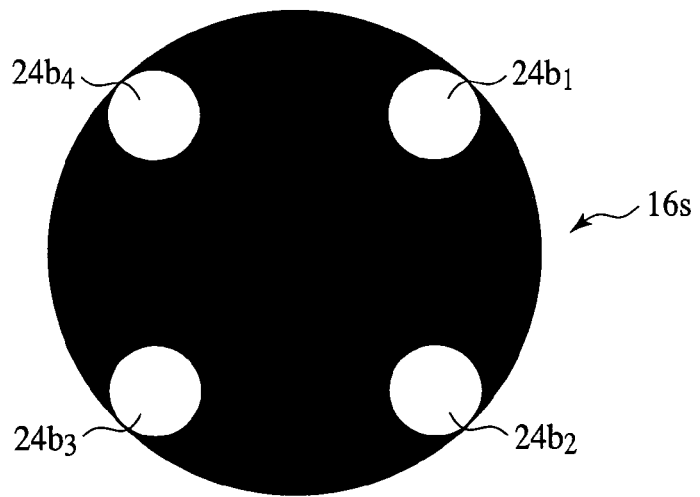
Figure 40C:
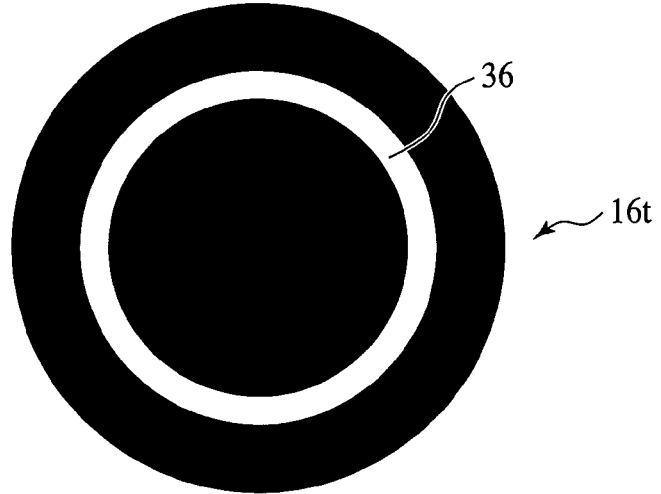

The semiconductor device manufacturing method according to a fourth embodiment of the present invention will be explained with reference to FIGS. 6A to 6E and 40A to 40C. FIG. 40 is plans view of an aperture stop used in the semiconductor device manufacturing method according to the present embodiment. The same members of the present embodiment as those of the semiconductor device manufacturing method according to the first to the third embodiments illustrated in FIGS. 1 to 39 are represented by the same reference numbers not to repeat or to simplify their explanation.

The semiconductor device manufacturing method according to the present embodiment is characterized mainly in that the first exposure is made with the first aperture stop 16r having the first ring-shaped aperture 22 formed in, then the second exposure is made with the second aperture stop 16s having apertures 24b1-24b4 formed in, and then the third exposure is made with the third aperture stop 16t having the third ring-shaped aperture stop 36 formed in.

FIG. 40A is a plan view of the first aperture stop 16r having the first ring-shaped aperture 22 formed in at the center. The first aperture stop 16r used in the present embodiment has the first ring-shaped aperture 22 formed in the center. The position, shape, etc. of the first aperture 22 of the first aperture stop 16r illustrated in FIG. 40A are the same as the position, shape, etc. of the first aperture 22 of the aperture stop 16k illustrated in FIG. 27.

FIG. 40B is a plan view of the second aperture stop 16s having the second apertures 24b1-24b4 in square directions around the center. The positions, shape, etc. of the second aperture stop 16s illustrated in FIG. 40B are the same as the position, shape, etc. of the second apertures 24b1-24b4 of the aperture stop 16k illustrated in FIG. 27.

FIG. 40C is a plan view of the third aperture stop 16t having the third ring-shaped aperture 36 formed in. The position and shape of the third aperture 36 of the third aperture stop 16t illustrated in FIG. 40C are the same as the position and shape of the aperture stop 16k illustrated in FIG. 27.

Next, the semiconductor device manufacturing method according to the present embodiment will be explained with reference to FIGS. 6A to 6E and 40A to 40C.

First, as illustrated in FIG. 6A, a semiconductor substrate 20 having an inter-layer insulation film 32, a photoresist film 34, etc. formed on is prepared.

Then, the aperture stop 16r illustrated in FIG. 40A is mounted on the aligner described above with reference to FIG. 1, and the patterns formed on the reticle 18 are transferred to the photoresist film 34 on the semiconductor substrate 20.

Next, the aperture stop 16s illustrated in FIG. 40B is mounted on the aligner described above with reference to FIG. 1, and the patterns formed on the reticle 18 are transferred to the photoresist film 34 on the semiconductor substrate 20.

Next, the aperture stop 16t illustrated in FIG. 40C is mounted on the aligner described above with reference to FIG. 1, and the patterns formed on the reticle 18 are transferred to the photoresist film 34 on the semiconductor substrate 20 (see FIG. 6B).

Next, as illustrated in FIG. 6C, the photoresist film 34 is developed.

Then, as illustrated in FIG. 6D, the inter-layer insulation film 32 is etched with the photoresist film 34 as the mask. Thus, the patterns of holes, etc. are formed in the inter-layer insulation film 32.

Then, as illustrated in FIG. 6E, the photoresist film 34 is released.

Thus, the semiconductor device of the present embodiment is fabricated.

In the semiconductor device manufacturing method according to the present embodiment, the patterns formed on the reticle 18 are exposed with the first aperture stop 16r, then exposed with the second aperture stop 16s and exposed with the third aperture stop 16t. The exposure with the first aperture stop 16r contributes to transferring patterns arranged at a medium pitch to a relatively large pitch with a relatively high resolution. The exposure with the second aperture stop 16s contributes to transferring patterns arranged at a relatively small pitch with a relatively high resolution. The exposure with the third aperture stop 16t contributes to transferring patterns arranged in various directions with a relatively high resolution. Accordingly, the present embodiment as well produces the same advantageous effect as the aperture stop 16k according to the third embodiment, and even when the patterns 18a for forming holes are arranged in various directions, the DOF can be surely sufficient, and the patterns can be stably transferred.

Whether or not assist patterns are provided around the pattern 18a for forming hole is not explicitly explained here, but as illustrated in FIG. 7, the assist patterns 21 may be suitably formed around the pattern 18a. The assist patterns are provided on the reticle as illustrated in FIG. 7, whereby the required patterns can be stably formed.

(Modification 1)

Then, the semiconductor device manufacturing method according to Modification 1 of the present embodiment will be explained with reference to FIGS. 6A to 6E, 41A and 41B.

Figure 41A:
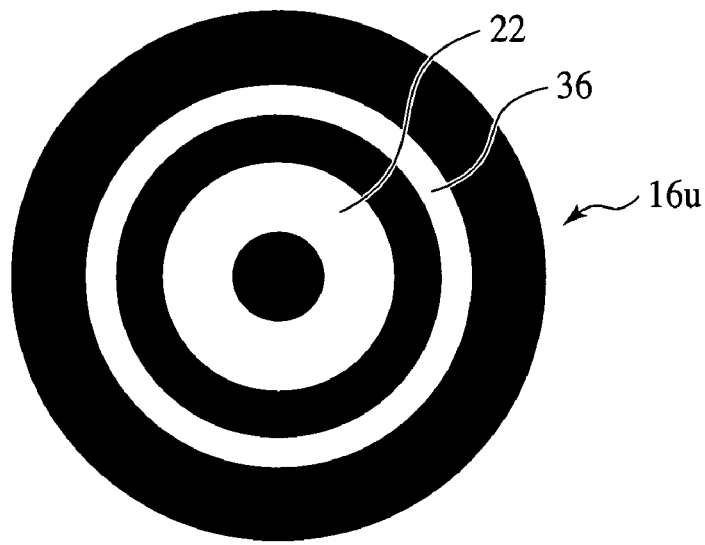
FIGS. 41A and 41B are plan views of an aperture stop used in the semiconductor device manufacturing method according to Modification 1 of the fourth embodiment of the present invention.
Figure 41B:
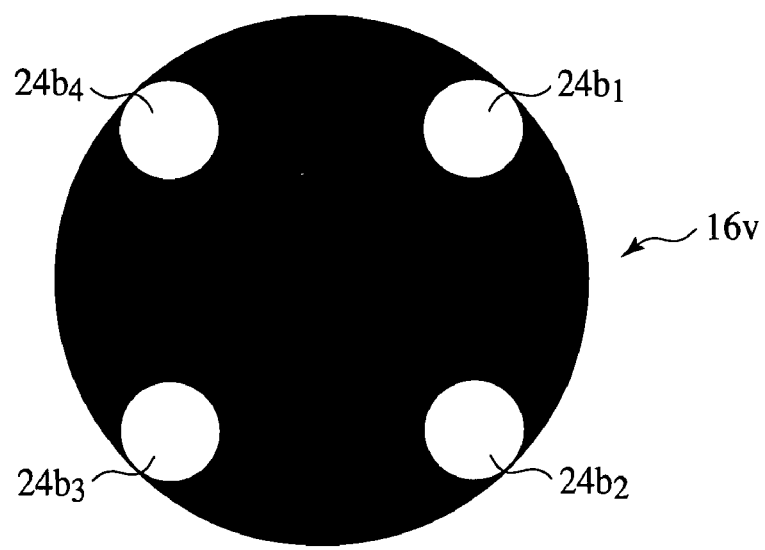

FIGS. 41A and 41B are plan views of an aperture stop used in the semiconductor device manufacturing method according to Modification 1 of the present embodiment.

The semiconductor device manufacturing method according to the present modification is characterized mainly in that the first exposure is made with the first aperture stop 16u having the first ring-shaped aperture 22 and the third ring-shaped aperture 36 formed in, and then the second exposure is made with the second aperture stop 16v having the second apertures 24b1-24b4 formed in.

FIG. 41A is a plan view of the first aperture stop 16u having the first ring-shaped aperture and the third ring-shaped aperture formed in. The first aperture 16u used in the present modification has the first ring-shaped aperture 22 formed in the center and the third ring-shaped aperture 36 formed around the first aperture 22. The positions, shapes, etc. of the first aperture 22 and the third aperture 36 of the first aperture stop 16u illustrated in FIG. 41A are the same as the positions, shapes, etc. of the first aperture 22 and the third aperture 36 of the aperture stop 16k illustrated in FIG. 27.

FIG. 41B is a plan view of the second aperture stop 16v having the second apertures 24b1-24b4 in square directions around the center. The positions, shape, etc. of the second apertures 24b1-24b4 of the second aperture stop 16v illustrated in FIG. 41B are the same as the positions, shape, etc. of the second apertures 24b1-24b4 of the aperture stop 16k illustrated in FIG. 27.

As described above, it is possible that the first exposure is made with the first aperture stop 16u having the first ring-shaped aperture 22 and the third ring-shaped aperture 36 formed in, and then the second exposure is made with the second aperture stop 16v having the apertures 24b1-24b4 formed in.

Next, the semiconductor device manufacturing method according to the present modification will be explained with reference to FIGS. 6A to 6E.

The aperture stop 16u illustrated in FIG. 41A is mounted on the aligner described above with reference to FIG. 1, and the patterns formed on the reticle 18 are transferred to the photoresist film 34 on the semiconductor substrate 20.

The aperture stop 16v illustrated in FIG. 41B is mounted on the aligner described above with reference to FIG. 1, and the patterns formed on the reticle 18 are transferred to the photoresist film 34 on the semiconductor substrate 20 (see FIG. 6B).

Then, as illustrated in FIG. 6C, the photoresist film 34 is developed.

Then, as illustrated in FIG. 6D, with the photoresist film 34 as the mask, the inter-layer insulation film 32 is etched. Thus, the patterns of holes, etc. are formed in the inter-layer insulation film 32.

Next, as illustrated in FIG. 6E, the photoresist film 34 is released.

Thus, the semiconductor device of the present modification is manufactured.

The present modification can produce the same advantageous effects as the third embodiment, in which the aperture stop 16k is used, and even when the patterns 18a for forming holes are arranged in various directions, the DOF can be surely sufficient, and the patterns can be stably transferred.

(Modification 2)

Then, the semiconductor device manufacturing method according to Modification 2 of the present embodiment will be explained with reference to FIGS. 6A to 6E, 42A and 42B.

Figure 42A:
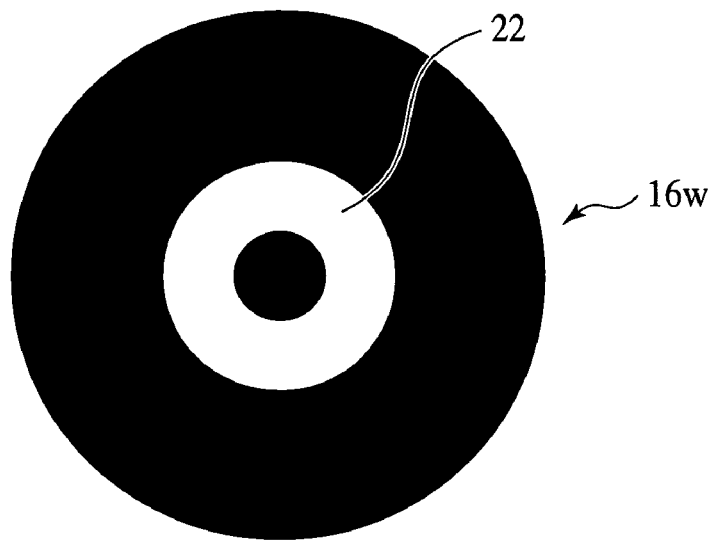
FIGS. 42A and 42B are plan views of an aperture stop used in the semiconductor device manufacturing method according to Modification 2 of the fourth embodiment of the present invention.
Figure 42B:
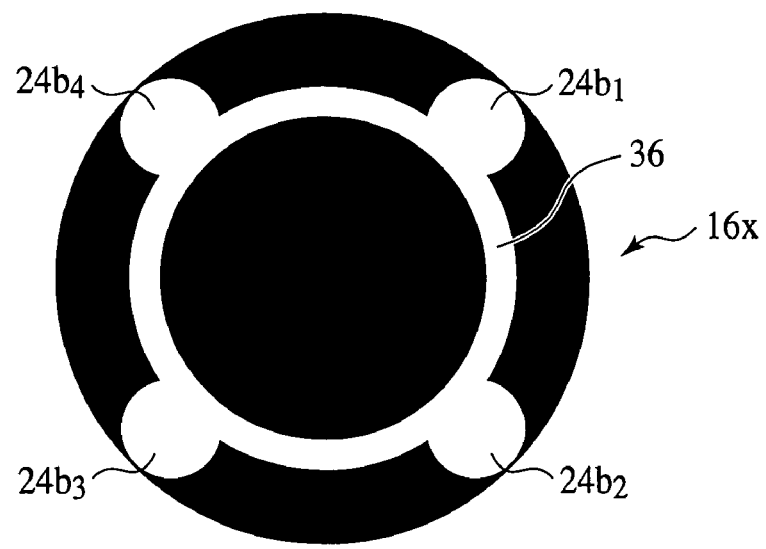

FIGS. 42A and 42B are plan views of the aperture stop used in the semiconductor device manufacturing method according to the present modification.

The semiconductor device manufacturing method according to the present modification is characterized mainly in that the first exposure is made with the first aperture stop 16w having the first ring-shaped aperture 22 formed in, and the second exposure is made with the second aperture stop 16x having the second apertures 24b1-24b4 formed in and the third ring-shaped aperture 36 formed in.

FIG. 42A is a plan view of the first aperture stop 16w having the first ring-shaped aperture 22 formed in. The first aperture stop 16w used in the present modification has the first ring-shaped aperture 22 in the center. The position, shape, etc. of the first aperture 22 of the first aperture stop 16w illustrated in FIG. 42A are the same as the position, shape, etc. of the first aperture 22 of the aperture stop 16k illustrated in FIG. 27.

FIG. 42B is a plan view of the second aperture 16x having the third ring-shaped aperture 36 formed in and the second apertures 24b1-24b4 formed in square directions around the third aperture 36. The positions, shapes, etc. of the second apertures 24b1-24b4 and the third aperture 36 of the second aperture stop 16x illustrated in FIG. 42B are the same as the positions, shape, etc. of the second apertures 24b1-24b4 and the third aperture 36 of the aperture stop 16k illustrated in FIG. 27.

As described above, it is possible that the first exposure is made with the first aperture stop 16w having the first ring-shaped aperture 22 formed in, and then the second exposure is made with the second aperture stop 16x having the apertures 24b1-24b4 and the third aperture 36 formed in.

Then, the semiconductor device manufacturing method according to the present embodiment will be explained with reference to FIGS. 6A to 6E.

The aperture stop 16w illustrated in FIG. 42A is mounted on the aligner described above with reference to FIG. 1, and the patterns formed on the reticle 18 are transferred to the photoresist film 34 on the semiconductor substrate 20.

Then, the aperture stop 16x illustrated in FIG. 42B is mounted on the aligner described above with reference to FIG. 1, and the patterns formed on the reticle 18 are transferred to the photoresist film 34 on the semiconductor device (see FIG. 6B).

Then, as illustrated in FIG. 6C, the photoresist film 34 is developed.

Next, as illustrated in FIG. 6D, with the photoresist film 34 as the mask, the inter-layer insulation film 32 is etched. Thus, the patterns of holes, etc. are formed in the inter-layer insulation film 32.

Then, as illustrated in FIG. 6E, the photoresist film 34 is released.

Thus, the semiconductor device of the present embodiment is manufactured.

The present modification can produce the same advantageous effects as the third embodiment, in which the exposure is made with the aperture stop 16k, and even when the patterns 18a for forming holes are arranged n various directions, the DOF can be surely sufficient, ad the patterns can be stably transferred.

(Modification 3)

Figure 43A:
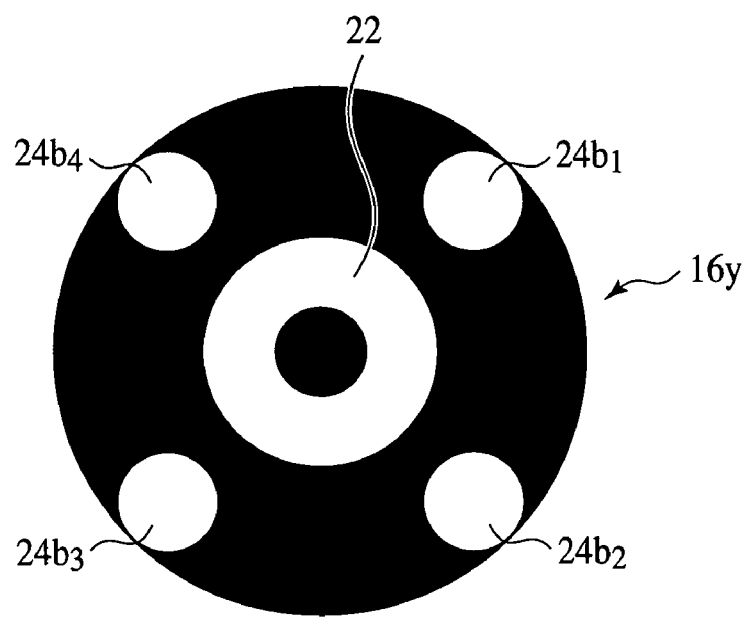
FIGS. 43A and 43B are plan views of an aperture stop used in the semiconductor device manufacturing method according to Modification 3 of the fourth embodiment of the present invention.
Figure 43B:
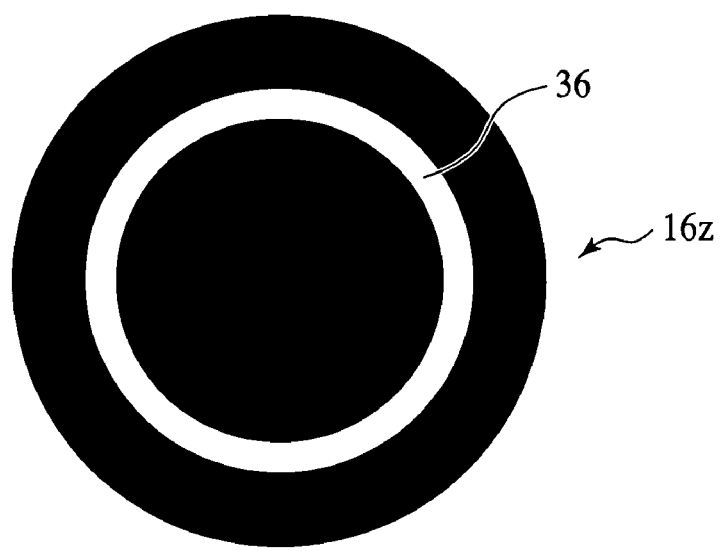

Next, the semiconductor device manufacturing method according to Modification 3 of the present embodiment will be explained with reference to FIGS. 6A to 6E, 43A and 43B. FIGS. 43A and 43B are plan views of an aperture stop used in the semiconductor device manufacturing method according to the present modification.

The semiconductor device manufacturing method according to the present modification is characterized mainly in that the first exposure is made with the first aperture stop 16y having the first aperture 22 and the second apertures 24b1-24b4 formed in, and the second exposure is made with the second aperture stop 16z having the third aperture 36 formed in.

FIG. 43A is a plan view of the first aperture stop 16y having the first aperture 22 and the second apertures 24b1-24b4 formed in. The first aperture 16y used in the present embodiment has the first ring-shaped aperture 22 formed in the center and the second apertures 124b1-24b4 arranged in square directions around the center. The positions, shapes, etc. of the first aperture 22 and the second apertures 24b1-24b4 of the first aperture stop 16y illustrated in FIG. 43A are the same as the positions, shapes, etc. of the first aperture 22 and the second apertures 24b1-24b4 of the aperture stop 16k illustrated in FIG. 27.

FIG. 43B is a plan view of the second aperture stop 16z having the third ring-shaped aperture 36 formed in. The position and shape, etc. of the third aperture 36 of the second aperture stop 16z illustrated in FIG. 43B are the same as the position, shape, etc. of the third aperture 36 of the aperture stop 16k illustrated in FIG. 27.

As described above, it is possible that the first exposure is made with the first aperture stop 16y having the first aperture 22 and the second apertures 24b1-24b4 formed in, and then the second exposure is made with the second aperture stop 16z having the third aperture 36 formed in.

Next, the semiconductor device manufacturing method according to the present embodiment will be explained with reference to FIGS. 6A to 6E.

The aperture stop 16w illustrated in FIG. 43A is mounted on the aligner described above with reference to FIG. 1, and the patterns formed on the reticle 18 are transferred to the photoresist film 34 on the semiconductor substrate 20.

Then, the aperture stop 16x illustrated in FIG. 43B is mounted on the aligner described above with reference to FIG. 1, and the patterns formed on the reticle 18 are transferred to the photoresist film 34 on the semiconductor substrate 20 (see FIG. 6B).

Next, as illustrated in FIG. 6C, the photoresist film 34 is developed.

Next, as illustrated in FIG. 6D, with the photoresist film 34 as the mask, the inter-layer insulation film 32 is etched. Thus, the patterns of holes, etc. are formed in the inter-layer insulation film 32.

Then, as illustrated in FIG. 6E, the photoresist film 34 is released.

Thus, the semiconductor device of the present embodiment is manufactured.

The present modification can produce the same advantageous effects as the third embodiment, in which the exposure is made with the aperture stop 16k, and even when the patterns 18a for forming holes are arranged in various directions, the DOF can be surely sufficient, and the patterns can be stably transferred.

A Fifth Embodiment

Figure 44:
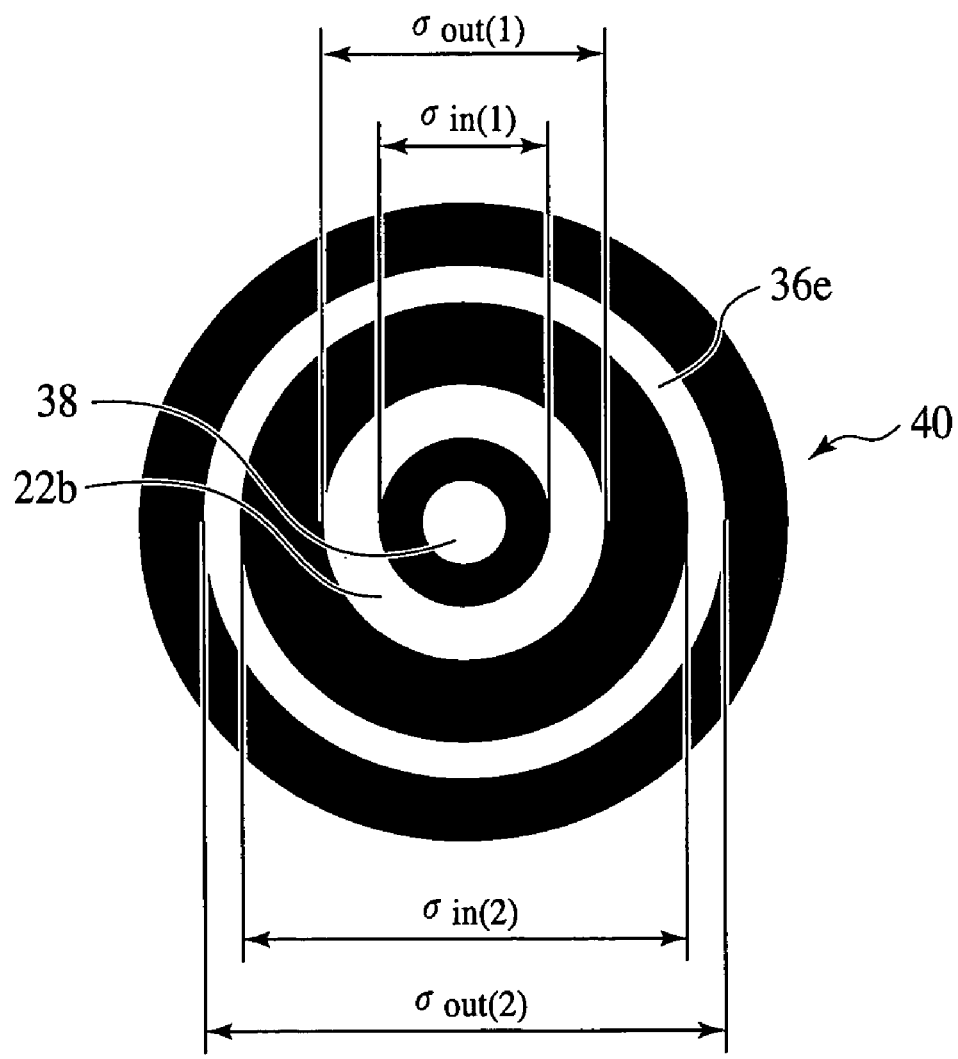
FIG. 44 is a plan view of an aperture stop used in the semiconductor device manufacturing method according to a fifth embodiment of the present invention.

The semiconductor device manufacturing method according to a fifth embodiment of the present invention will be explained with reference to FIGS. 6A to 6E and 44. FIG. 44 is a plan view of an aperture stop used in the semiconductor device manufacturing method used in the present embodiment. The same members of the present embodiment as those of the semiconductor device manufacturing method according to the first to the fourth embodiments illustrated in FIGS. 1 to 43B are represented by the same reference numbers not to repeat or to simplify their explanation.

The semiconductor device manufacturing method according to the present embodiment is characterized mainly in that an aperture stop 40 illustrated in FIG. 44 is used to transfer the patterns. That is, the semiconductor device manufacturing method according to the present embodiment is characterized mainly in that the aperture stop 40 having the first circular aperture 38 formed in the center, the second ring-shaped aperture 22b formed around the first aperture 38 and the third ring-shaped aperture 36e formed around the second ring-shaped aperture 22b is used to transfer the patterns.

As illustrated in FIG. 44, the first circular aperture 38 is formed in the center of the aperture stop 40.

Around the first aperture 38, the second ring-shaped aperture 22b is formed, surrounding the first aperture 38. The inner sigma $\sigma_{in(1)}$ of the second aperture 22b is set larger than the diameter of the first aperture 38. In other words, the inner diameter of the second aperture 22b is set larger than the outer diameter of the first aperture 38.

Around the second aperture 22b, the third ring-shaped aperture 36e is formed, surrounding the second aperture 22b. The inner sigma $\sigma_{in(2)}$ of the third aperture 36e is set larger than the outer sigma $\sigma_{out(1)}$ of the second aperture 22b. In other words, the inner diameter of the third aperture 36e is set larger than the outer diameter of the second aperture 22b.

The respective sizes of the aperture stop 40 are as exemplified below. These sizes are normalized values with the outer diameter of the effective region of the aperture stop 40 set at 1.0.

The diameter of the first aperture 38 is, e.g., 0.1-0.25.

The outer sigma $\sigma_{out(1)}$ of the second aperture 22b is, e.g., 0.4-0.5. The inner sigma $\sigma_{in(1)}$ of the second aperture 38 is, e.g., 0.2-0.3.

The outer sigma $\sigma_{out(2)}$ of the third aperture 36e is, e.g., 0.8-0.95. The inner sigma $\sigma_{in(2)}$ of the third aperture 36e is, e.g., 0.7-0.8.

Thus, the aperture stop 40 of the present embodiment is constituted.

Next, the semiconductor device manufacturing method according to the present embodiment will be explained with reference to FIGS. 6A to 6E.

First, as illustrated in FIG. 6A, a semiconductor substrate 20 having an inter-layer insulation film 32, a photoresist film 34, etc. formed on is prepared.

Then, the aperture stop 40 illustrated in FIG. 44 is mounted on the aligner described above with reference to FIG. 1, and the patterns formed on the reticle 18 are transferred to the photoresist film 34 on the semiconductor substrate 20 (see FIG. 6B).

Then, as illustrated in FIG. 6C, the photoresist film 34 is developed.

Then, as illustrated in FIG. 6D, with the photoresist film 34 as the mask, the inter-layer insulation film 32 is etched. Thus, the patterns of holes, etc. are formed in the inter-layer insulation film 32.

Then, as illustrated in FIG. 6E, the photoresist film 34 is released.

Thus, the semiconductor device of the present embodiment is manufactured.

As described above, in the semiconductor device manufacturing method according to the present embodiment, the aperture stop 40 having the first circular aperture 38 formed in the center, the second ring-shaped aperture 22b formed around the first aperture 38 and the third ring-shaped aperture 36e formed around the second ring-shaped aperture 22b is used to transfer the patterns. The first aperture 38 contributes to transferring patterns isolated from the other patterns, i.e., isolated patterns with a relatively high resolution. The second aperture 22b contributes to transferring patterns arranged at a medium pitch to a relatively large pitch with a relatively high resolution. The third aperture 36e contributes to transferring the patterns arranged at a relatively small pitch with a relatively high resolution. The third aperture 36e contributes also to transferring with a relatively high resolution the pattern arranged in various directions. Thus, according to the present embodiment, even when the patterns 18a for forming holes are set at various pitch values and in various directions, the DOF can be surely sufficient, and the patterns can be stably transferred.

Whether or not assist patterns are provided around the pattern 18a for forming hole is not explicitly explained here, but as illustrated in FIG. 7, the assist patterns 21 may be suitably formed around the pattern 18a. The assist patterns are provided on the reticle as illustrated in FIG. 7, whereby the required patterns can be stably formed.

A Sixth Embodiment

Figure 45A:
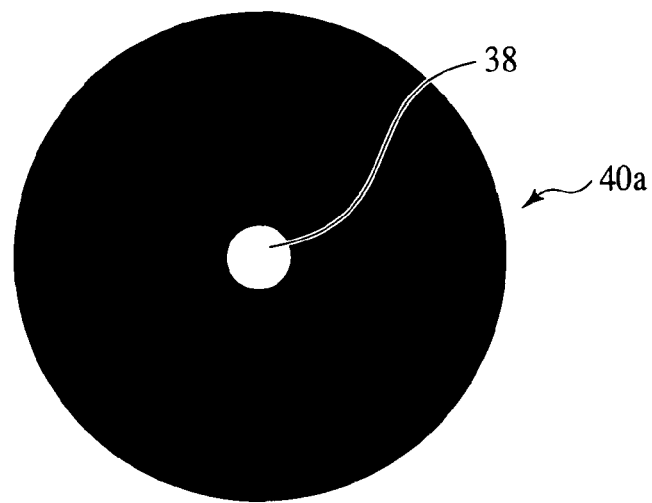
FIGS. 45A to 45C are plan views of an aperture stop used in the semiconductor device manufacturing method according to a sixth embodiment of the present invention.
Figure 45B:
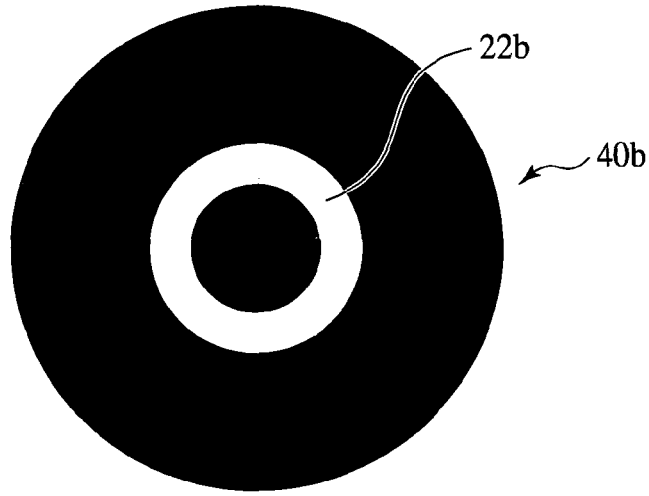
Figure 45C:
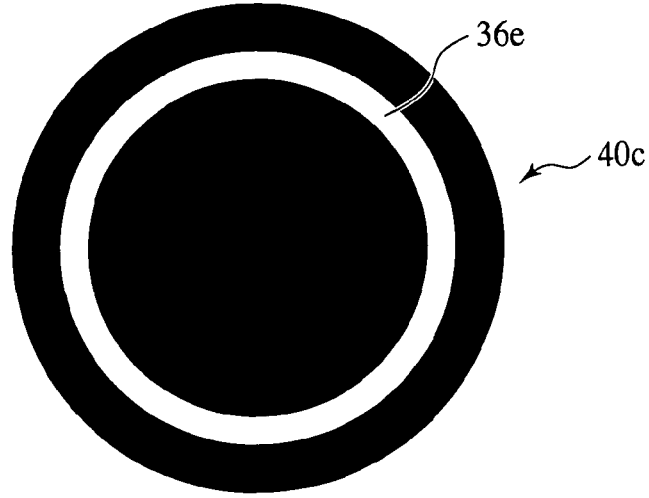

The semiconductor manufacturing method according to a sixth embodiment of the present invention will be explained with reference to FIGS. 6A to 6E and 45A to 45C. FIG. 45A to 45C are plan views of aperture stops used in the semiconductor device manufacturing method according to the present embodiment. The same members of the present embodiment as those of the semiconductor device manufacturing method according to the first to the fifth embodiments illustrated in FIGS. 1 to 44 are represented by the same reference numbers not to repeat or to simplify their explanation.

The semiconductor device manufacturing method according to the present embodiment is characterized mainly in that the first exposure is made with the first aperture stop 40r having the first circular aperture 38 formed in, then the second exposure is made with the second aperture stop 40b having the second ring-shaped aperture 22b formed in, and next the third exposure is made with the third aperture stop 40c having the third ring-shaped aperture 36e.

FIG. 45A is a plan view of the first aperture stop 40a having the first circular aperture 38 formed in the center. The first aperture stop 40a used in the present embodiment has the first circular aperture 38 formed in the center. The position, shape, etc. of the first aperture 38 of the first aperture stop 40a illustrated in FIG. 45A are the same as the position, shape, etc. of the first aperture 38 of the aperture stop 40 illustrated in FIG. 44.

FIG. 45B is a plan view of the second aperture stop 40b having the second ring-shaped aperture 22b formed in. The position, shape, etc. of the second aperture 22b of the second aperture stop 40b illustrated in FIG. 45B are the same as the position, shape, etc. of the second aperture 22b of the aperture stop 40 illustrated in FIG. 44.

FIG. 45C is a plan view of the third aperture stop 40c having the third ring-shaped aperture 36e formed in. The position, shape, etc. of the third aperture 36e of the third aperture stop 40c illustrated in FIG. 45C are the same as the position, shape, etc. of the third aperture 36e of the aperture stop 40 illustrated in FIG. 44.

Next, the semiconductor device according to the present embodiment will be explained with reference to FIGS. 6A to 6E and 45A to 45C.

First, as illustrated in FIG. 6A, a semiconductor substrate 20 having an inter-layer insulation film 32, a photoresist film 34, etc. formed on is prepared.

Next, the aperture stop 40a illustrated in FIG. 45A is mounted on the aligner described above with reference to FIG. 1, and the patterns formed on the reticle 18 are transferred to the photoresist film 34 on the semiconductor substrate 20.

Then, the aperture stop 40b illustrated in FIG. 45B is mounted on the aligner described above with reference to FIG. 1, and the patterns formed on the reticle 18 are transferred to the photoresist film 34 on the semiconductor substrate 20.

Next, the aperture stop 40c illustrated in FIG. 45C is mounted on the aligner described above with reference to FIG. 1, and the patterns formed on the reticle 18 are transferred to the photoresist film 34 on the semiconductor substrate 20 (se FIG. 6B).

Next, as illustrated in FIG. 6C, the photoresist film 34 is developed.

Next, as illustrated in FIG. 6D, with the photoresist film 34 as the mask, the inter-layer insulation film 32 is etched. Thus, the patterns, as of holes, etc., are formed in the inter-layer insulation film 32.

Then, as illustrated in FIG. 6E, the photoresist film 34 is released.

Thus, the semiconductor device of the present embodiment is manufactured.

As described above, in the semiconductor device manufacturing method according to the present embodiment, the patterns formed on the reticle 18 are exposed with the first aperture stop 40a, then exposed with the second aperture stop 40b, and then exposed with the third aperture stop 40c. The exposure with the first aperture stop 40a contributes to transferring the isolated pattern with a relatively high resolution. The exposure with the second aperture stop 40b contributes to transferring the patterns arranged at a medium pitch to a relatively large pitch with a relatively high resolution. The exposure with the third aperture stop 40c contributes to transferring the patterns arranged in various directions with a relatively high resolution. Thus, the present embodiment can produce the same advantageous effects as the exposure with the aperture stop 40 according to the fifth embodiment. That is, according to the present embodiment, even when the patterns 18a for forming holes are arrange at various pitch values and are arranged in various directions, the DOF can be surely sufficient, and the patterns can be stably transferred.

Whether or not assist patterns are provided around the pattern 18a for forming hole is not explicitly explained here, but as illustrated in FIG. 7, the assist patterns 21 may be suitably formed around the pattern 18a. The assist patterns are provided on the reticle as illustrated in FIG. 7, whereby the required patterns can be stably formed.

(Modification 1)

Figure 46A:
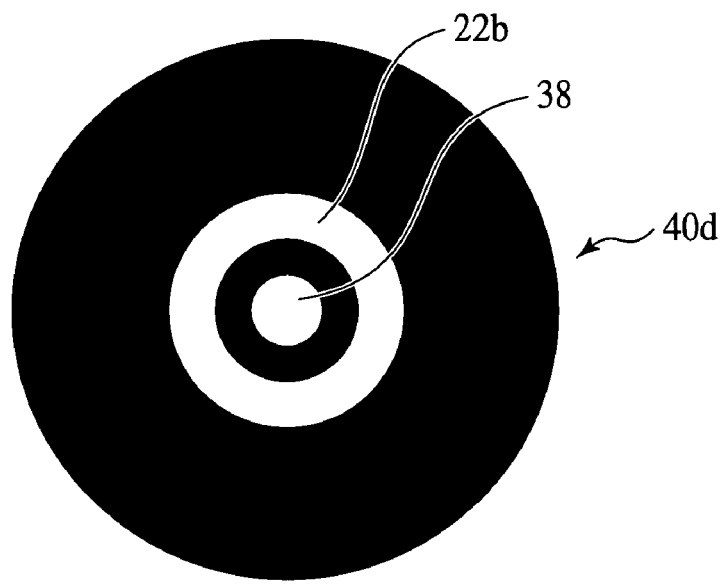
FIGS. 46A and 46B are plan views of an aperture stop used in the semiconductor device manufacturing method according to Modification 1 of the sixth embodiment of the present invention.
Figure 46B:
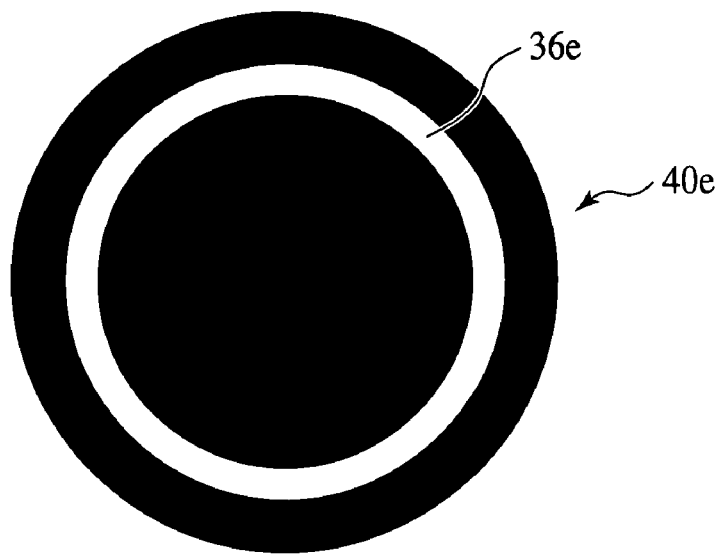

Then, the semiconductor device manufacturing method according to Modification 1 of the present embodiment will be explained with reference to FIGS. 6A to 6E, 46A and 46B. FIGS. 46A and 46B are plan views of an aperture stop used in the semiconductor device manufacturing method according to the present modification.

The semiconductor device manufacturing method according to the present modification is characterized mainly in that the first exposure is made with the first aperture stop 40d having the first aperture 38 and the second aperture 22b formed in, and then the second exposure is made with the second aperture stop 40e having the third aperture 36e formed in.

FIG. 46A is a plan view of the first aperture stop 40d having the first aperture 38 and the second aperture 22b formed in.

The first aperture stop 40*d* has the first aperture 38 formed in the center, and the second ring-shaped aperture 22*b* formed around the first aperture 38. The positions, shapes, etc. of the first aperture 38 and the second aperture 22*b* of the first aperture stop 40*d* illustrated in FIG. 46A are the same as the positions, shapes, etc. of the first aperture 38 and the second aperture 22*b* of the aperture stop 40 illustrated in FIG. 44.

FIG. 46B is a plan view of the second aperture 40*e* having the third aperture 36*e* formed in. The shape, position, etc. of the third aperture 36*e* of the second aperture stop 40*e* illustrated in FIG. 46B are the same as the position, shape, etc. of the third aperture 36*e* of the aperture stop 40 illustrated in FIG. 44.

Then, the semiconductor device manufacturing method according to the present embodiment will be explained with reference to FIGS. 6A to 6E.

Next, the aperture stop 40*d* illustrated in FIG. 46A is mounted on the aligner described above with reference to FIG. 1, and the patterns formed on the reticle 18 are transferred to the photoresist film 34 on the semiconductor substrate 20.

Next, the aperture stop 40*e* illustrated in FIG. 46B is mounted on the aligner described above with reference to FIG. 1, and the patterns formed on the reticle 18 are transferred to the photoresist film 34 on the semiconductor substrate 20 (see FIG. 6B).

Next, as illustrated in FIG. 6C, the photoresist film 34 is developed.

Next, as illustrated in FIG. 6D, with the photoresist film 34 as the mask, the inter-layer insulation film 32 is etched. Thus, the patterns, as of holes, etc., are formed in the inter-layer insulation film 32.

Then, as illustrated in FIG. 6E, the photoresist film 34 is released.

Thus, the semiconductor device according to the present modification is manufactured.

As described above, it is possible that the first exposure is made with the first aperture stop 40*a* having the first aperture 38 and the second aperture 22*b* formed in, and the second exposure is made with the second aperture stop 40*e* having the third aperture 36*e* formed in.

The present modification can produce the same advantageous effects as the fifth embodiment, in which the aperture stop 40 is used. In the present modification, even when the patterns 18*a* for forming holes are set at various pitch values and in various directions, the DOF can be surely sufficient, and the patterns can be stably transferred.

(Modification 2)

Figure 47A:
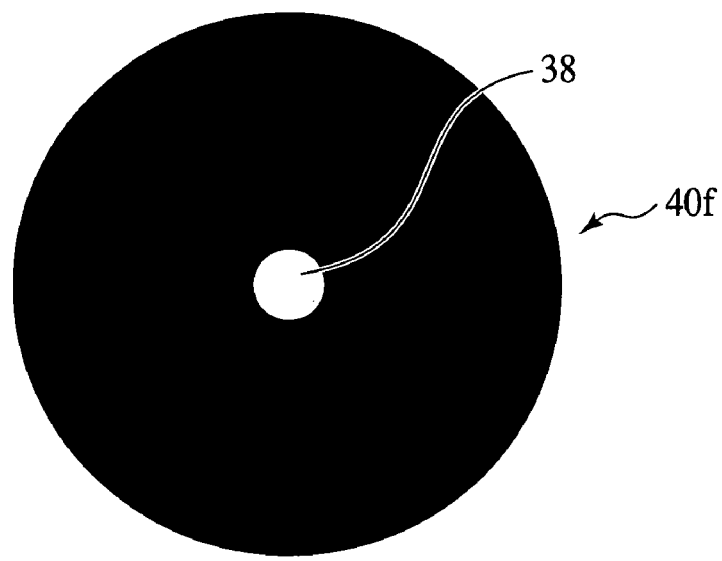
FIGS. 47A and 47B are plan views of an aperture stop used in the semiconductor device manufacturing method according to Modification 2 of the sixth embodiment of the present invention.
Figure 47B:
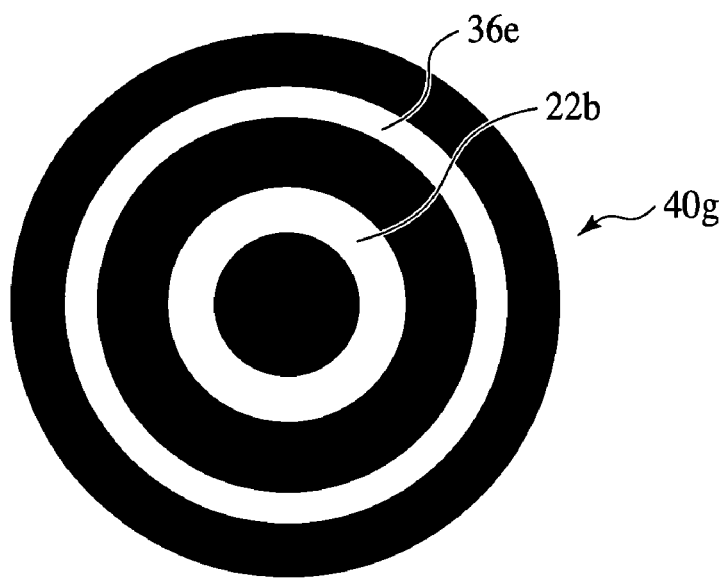

Then, the semiconductor device manufacturing method according to Modification 2 of the present embodiment will be explained with reference to FIGS. 6A to 6E, 47A and 47B. FIGS. 47A and 47B are plan views of an aperture stop used in the semiconductor device manufacturing method according to the present modification.

The semiconductor device manufacturing method according to the present modification is characterized mainly in that the first exposure is made with the first aperture stop 40*f* having the first aperture 38*f* formed in, and then, the second exposure is made with the second aperture stop 40*g* having the second aperture 22*b* and the third aperture 36*e* formed in.

FIG. 47A is a plan view of the first aperture stop 40*f* having the first aperture 38 formed in. The first aperture stop 40*f* has the first aperture 38 formed in the center. The position, shape, etc. of the first aperture 38 of the first aperture stop 40*f* illustrated in FIG. 47A are the same as the position, shape, etc. of the first aperture 38 of the aperture stop 40 illustrated in FIG. 44A.

FIG. 47B is a plan view of the second aperture stop 40*g* having the second aperture 22*b* and the third aperture 36*e* formed in. The positions, shapes, etc. of the second aperture 22*b* and the third aperture 36*e* of the second aperture stop 40*g* illustrated in FIG. 47B are the same as the positions, shapes, etc. of the second aperture 22*b* and the third aperture 36*e* of the aperture stop 40 illustrated in FIG. 44.

Then, the semiconductor device manufacturing method according to the present embodiment will be explained with reference to FIGS. 6A to 6E.

The aperture stop 40*f* illustrated in FIG. 47A is mounted on the aligner described above with reference to FIG. 1, and the patterns formed on the reticle 18 are transferred to the photoresist film 34 on the semiconductor substrate 20.

Next, the aperture stop 40*g* illustrated in FIG. 47B is mounted on the aligner described above with reference to FIG. 1, and the patterns formed on the reticle 18 are transferred to the photoresist film 34 on the semiconductor substrate 20 (see FIG. 6B).

Then, as illustrated in FIG. 6C, the photoresist film 34 is developed.

Then, as illustrated in FIG. 6D, with the photoresist film 34 as the mask, the inter-layer insulation film 32 is etched. Thus, the patterns, as of holes, etc., are formed in the inter-layer insulation film 32.

Next, as illustrated in FIG. 6E, the photoresist film 34 is released.

Thus, the semiconductor device of the present embodiment is manufactured.

As described above, it is possible that the first exposure is made with the first aperture stop 40*f* having the first aperture 38 formed in, and the second exposure is made with the second aperture stop 40*g* having the second aperture 22*b* and the third aperture 36*e* formed in.

The present modification can produce the same advantageous effects as the fifth embodiment, in which the exposure is made with the aperture stop 40. Thus, in the present modification, even when the patterns 18*a* for forming holes are formed at various pitch value and in various directions, the DOF can be surely sufficient, and the patterns can be stably transferred.

(Modification 3)

Figure 48A:
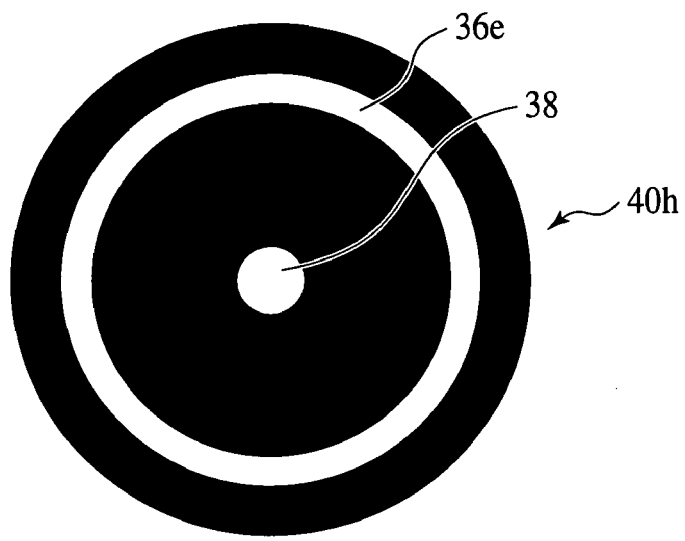
FIGS. 48A and 48B are plan views of an aperture stop used in the semiconductor device manufacturing method according to Modification 3 of the sixth embodiment of the present invention.
Figure 48B:
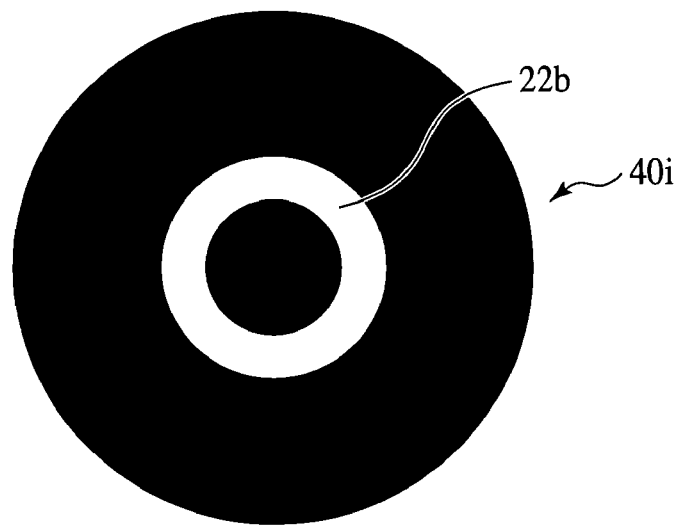

Then, the semiconductor device manufacturing method according to Modification 3 of the present embodiment will be explained with reference to FIGS. 6A to 6E, 48A and 48B. FIGS. 48A and 48B are plan views of an aperture stop used in the semiconductor device manufacturing method according to the present modification.

The semiconductor device manufacturing method according to the present modification is characterized mainly in that the first exposure is made with the first aperture stop 40*h* having the first aperture 38 and the third aperture 36*e* formed in, and then, the second exposure is made with the second aperture stop 40*i* having the second aperture 22*b* formed in.

FIG. 48A is a plan view of the first aperture stop 40*h* having the first aperture 38 and the third aperture 36*e* formed in. The first aperture stop 40*h* has the first aperture 38 and the third aperture 36*e* formed in. The positions, shapes, etc. of the first aperture 38 and the third aperture 36*e* of the first aperture stop 40*h* illustrated in FIG. 48A are the same as the positions, shapes, etc. of the first aperture 38 and the third aperture 36*e* of the aperture stop 40 illustrated in FIG. 44.

FIG. 48B is a plan view of the second aperture stop 40*i* having the second aperture 22*b* formed in. The position, shape, etc. of the second aperture 22*b* of the second aperture 40*i* illustrated in FIG. 48B are the same as the position, shape, etc. of the second aperture 22*b* of the second aperture stop 40 illustrated in FIG. 44.

Next, the semiconductor device manufacturing method according to the present embodiment will be explained with reference to FIGS. 6A to 6E.

Next, the aperture stop 40*h* illustrated in FIG. 47A is mounted on the aligner described above with reference to FIG. 1, and the patterns formed on the reticle 18 are transferred to the photoresist film 34 on the semiconductor substrate 20.

Then, the aperture stop 40*i* illustrated in FIG. 47B is mounted on the aligner described above with reference to FIG. 1, and the patterns formed on the reticle 18 are transferred to the photoresist film 34 on the semiconductor substrate 20 (see FIG. 6B).

Next, as illustrated in FIG. 6C, the photoresist film 34 is developed.

Then, as illustrated in FIG. 6D, with the photoresist film 34 as the mask, the inter-layer insulation film 32 is etched. Thus, the patterns, as of holes, etc., are formed in the inter-layer insulation film 32.

Then, as illustrated in FIG. 6E, the photoresist film 34 is released.

Thus, the semiconductor device according to the present modification is manufactured.

As described above, it is possible that the first exposure is made with the first aperture stop 40*h* having the first aperture 38 and the third aperture 36*e* formed in, and the second exposure is made with the second aperture stop 40*i* having the second aperture 22*b* formed in.

The present modification can produce the same advantageous effects as the fifth embodiment, in which the aperture stop 40 is used. Thus, in the present modification, even when the patterns 18*a* are formed at various pitch values and in various directions, the DOF can be surely sufficient, and the patterns can be stably transferred.

Modified Embodiments

The present invention is not limited to the above-described embodiments and can cover other various modifications.

For example, in the second embodiment, the first exposure is made with the aperture stop 16*e* illustrated in FIG. 12A, and the second exposure is made with the aperture stop 16*f* illustrated in FIG. 12B. However, it is possible that the aperture stop 16*f* illustrated in FIG. 12B is used for the first exposure, and the aperture stop 16*e* illustrated in FIG. 12A is used for the second exposure.

In Modification 1 of the second embodiment, the first exposure is made with the aperture stop 16*e* illustrated in FIG. 14A, and the second exposure is made with the aperture stop 16*g* illustrated in FIG. 14B. However, it is possible that the aperture stop 16*g* illustrated in FIG. 14B is used for the first exposure, and the aperture stop 16*e* illustrated in FIG. 14A is used for the second exposure.

In Modification 2 of the second embodiment, the first exposure is made with the aperture stop 16*e* illustrated in FIG. 15A, and the second exposure is made with the aperture stop 16*h* illustrated in FIG. 15B. However, it is possible that the aperture stop 16*h* illustrated in FIG. 15B may be used for the first exposure, and the aperture stop 16*e* illustrated in FIG. 15A may be used for the second exposure.

In Modification 3 of the second embodiment, the first exposure is made with the aperture stop 16*e* illustrated in FIG. 16A, and the second exposure is made with the aperture stop 16*i* illustrated in FIG. 16B. However, it is possible that the aperture stop 16*i* illustrated in FIG. 16B is used for the first exposure, and the aperture stop 16*e* illustrated in FIG. 16A is used for the second exposure.

In Modification 4 of the second embodiment, the first exposure is made with the aperture stop 16*e* illustrated in FIG. 17A, and the second exposure is made with the aperture stop 16*j* illustrated in FIG. 17B. However, it is possible that the aperture stop 16*j* illustrated in FIG. 17B is used for the first exposure, and the aperture stop 16*e* illustrated in FIG. 17A is used for the second exposure.

In the fourth embodiment, the first exposure is made with the aperture stop 16*r* illustrated in FIG. 40A, the second exposure is made with the aperture stop 16*s* illustrated in FIG. 40B, and the third exposure is made with the aperture stop 16*t* illustrated in FIG. 40C. However, it is possible that the aperture stop 16*r* illustrated in FIG. 40A is used for the first exposure, the aperture stop 16*t* illustrated in FIG. 40C is used for the second exposure, and the aperture stop 16*s* illustrated in FIG. 40B is used for the third exposure. It is possible that the aperture stop 16*s* illustrated in FIG. 40B is used for the first exposure, the aperture stop 16*r* illustrated in FIG. 40A is used for the second exposure, and the aperture stop 16*t* illustrated in FIG. 40C is used for the third exposure. It is possible that the aperture stop 16*s* illustrated in FIG. 40B is used for the first exposure, the aperture stop 16*t* illustrated in FIG. 40C is used for the second exposure, and the aperture stop 16*r* illustrated in FIG. 40A is used for the third exposure. It is possible that the aperture stop 16*t* illustrated in FIG. 40C is used for the first exposure, the aperture stop 16*r* illustrated in FIG. 40A is used for the second exposure, and the aperture stop 16*s* illustrated in FIG. 40B is used for the third exposure. It is possible that the aperture stop 16*t* illustrated in FIG. 40C is used for the first exposure, the aperture stop 16*s* illustrated in FIG. 40B is used for the second exposure, and the aperture stop 16*r* illustrated in FIG. 40A is used for the third exposure.

In the fourth embodiment, the aperture stop 16*r* has the same aperture 22 as the aperture 22 of the aperture stop 16*k* (see FIG. 27) formed in, the aperture stop 16*s* has the same apertures 24*b*1-24*b*4 as the apertures 24*b*1-24*b*4 of the aperture stop 16*k* formed in, the aperture stop 16*t* has the same aperture 36 as the aperture 36 of the aperture stop 16*k* formed in. However, it is possible that the same aperture 22 as the aperture 22 of the aperture stop 16*l* (see FIG. 28) is formed in the aperture stop 16*r*, the same apertures 24*b*1-24*b*4 as the apertures 24*b*1-24*b*4 of the aperture stop 16*l* are formed in the aperture stop 16*s*, and the same aperture 36*a* as the aperture 36*a* of the aperture stop 16*l* is formed in the aperture stop 16*t*. It is possible that the same aperture 22 as the aperture 22 of the aperture stop 16*m* (see FIG. 31) is formed in the aperture stop 16*r*, the same apertures 24*c*1-24*c*4 as the apertures 24*c*1-24*c*4 of the aperture stop 16*m* are formed in the aperture stop 16*s*, and the same aperture 36*b* as the aperture 36*b* of the aperture stop 16*m* is formed in the aperture stop 16*t*. It is possible that the same aperture 22 as the aperture 22 of the aperture stop 16*n* (see FIG. 34) is formed in the aperture stop 16*r*, the same apertures 24*b*1-24*b*4 as the apertures 24*b*1-24*b*4 of the aperture stop 16*n* are formed in the aperture stop 16*s*, and the same aperture 36*c* as the aperture 36*c* of the aperture stop 16*n* is formed in the aperture stop 16*t*. It is possible that the same aperture 22 as the aperture 22 of the aperture stop 16*o* (see FIG. 37) is formed in the aperture stop 16*r*, the same apertures 24*b*1-24*b*6 as the apertures 24*b*1-24*b*6 of the aperture stop 16*o* are formed in the aperture stop 16*s*, and the same aperture 36 as the aperture 36 of the aperture stop 16*o* is formed in the aperture stop 16*t*. It is possible that the same aperture 22 as the aperture 22 of the aperture stop 16*p* (see FIG. 38) is formed in the aperture stop 16*r*, the same apertures 24*b*1-24*b*8 as the apertures 24*b*1-24*b*8 of the aperture stop 16*p* are formed in the aperture stop 16*p*, and the same aperture 36 as the aperture 36 of the aperture stop 16*p* is formed in the aperture stop 16*t*.

In Modification 1 of the fourth embodiment, the first exposure is made with the aperture stop 16*u* illustrated in FIG. 41A, the second exposure is made with the aperture stop 16*v* illustrated in FIG. 41B. However, it is possible that the aperture 16*v* illustrated in FIG. 41B is used for the first exposure, and the aperture 16*u* illustrated in FIG. 41A is used for the second exposure.

In Modification 1 of the fourth embodiment, the same apertures 22, 36 as the apertures 22, 36 of the aperture stop 16*k* (see FIG. 27) are formed in the aperture stop 16*u*, and the same apertures 24*b*1-24*b*4 as the apertures 24*b*1-24*b*4 of the aperture stop 16*k* are formed in the aperture stop 16*v*. However, it is possible that the same apertures 22, 36*a* as the apertures 22, 36*a* of the aperture stop 16*l* (see FIG. 28) are formed in the aperture stop 16*u*, and the same apertures 24*b*1-24*b*4 as the apertures 24*b*1-24*b*4 of the aperture stop 16*l* are formed in the aperture stop 16*v*. It is possible that the same apertures 22, 36*b* as the apertures 22, 36*b* of the aperture stop 16*m* (see FIG. 31) are formed in the aperture stop 16*u*, and the same apertures 24*c*1-24*c*4 as the apertures 24*c*1-24*c*4 of the aperture stop 16*m* are formed in the aperture stop 16*v*. It is possible that the same apertures 22, 36*c* as the apertures 22, 36*c* of the aperture stop 16*n* (see FIG. 34) are formed in the aperture stop 16*u*, and the same apertures 24*b*1-24*b*4 as the apertures 24*b*1-24*b*4 of the aperture stop 16*n* are formed in the aperture stop 16*v*. It is possible that the same apertures 22, 36 as the apertures 22, 36 of the aperture stop 16*o* (see FIG. 37) are formed in the aperture stop 16*u*, and the same apertures 24*b*1-24*b*6 as the apertures 24*b*1-24*b*6 of the aperture stop 16*o* are formed in the aperture stop 16*v*. It is possible that the same apertures 22, 36 as the apertures 22, 36 of the aperture stop 16*p* (see FIG. 38) are formed in the aperture stop 16*u*, and the same apertures 24*b*1-24*b*8 as the apertures 24*b*1-24*b*8 of the aperture stop 16*p* are formed in the aperture stop 16*v*.

In Modification 2 of the fourth embodiment, the first exposure is made with the aperture stop 16*w* illustrated in FIG. 42A, and the second exposure is made with the aperture stop 16*x* illustrated in FIG. 42B. However, it is possible that the aperture stop 16*x* illustrated in FIG. 42B is used for the first exposure, and the aperture stop 16*w* illustrated in FIG. 42A is used for the second exposure.

In Modification 2 of the fourth embodiment, the same aperture 22 as the aperture 22 of the aperture stop 16*k* (see FIG. 27) is formed in the aperture stop 16*w*, and the same apertures 24*b*1-24*b*4, 36 as the apertures 24*b*1-24*b*4, 36 of the aperture stop 16*k* are formed in the aperture stop 16*x*. It is possible that the same aperture 22 as the aperture 22 of the aperture stop 16*l* (see FIG. 28) is formed in the aperture stop 16*w*, and the same apertures 24*b*1-24*b*4, 36*a* as the apertures 24*b*1-24*b*4, 36*a* of the aperture stop 16*l* are formed in the aperture stop 16*x*. It is possible that the same aperture 22 as the aperture 22 of the aperture stop 16*m* (see FIG. 31) is formed in the aperture stop 16*w*, and the same apertures 24*c*1-24*c*4, 36*b* as the apertures 24*c*1-24*c*4, 36*b* of the aperture stop 16*m* are formed in the aperture stop 16*x*. It is possible that the same aperture 22 as the aperture 22 of the aperture stop 16*n* (see FIG. 34) is formed in the aperture stop 16*w*, and the same apertures 24*b*1-24*b*4, 36*c* as the apertures 24*b*1-24*b*4, 36*c* of the aperture stop 16*n* are formed in the aperture stop 16*x*. It is possible that the same aperture 22 as the aperture 22 of the aperture stop 16*o* (see FIG. 37) is formed in the aperture stop 16*w*, and the same apertures 24*b*1-24*b*6, 36 as the apertures 24*b*1-24*b*6, 36 of the aperture stop 16*o* are formed in the aperture stop 16*x*. It is possible that the same aperture 22 as the aperture 22 of the aperture stop 16*p* (see FIG. 38) is formed in the aperture stop 16*w*, and the same apertures 24*b*1-24*b*8, 36 as the apertures 24*b*1-24*b*8, 36 of the aperture stop 16*p* are formed in the aperture stop 16*x*.

In Modification 3 of the fourth embodiment, the first exposure is made with the aperture stop 16*y* illustrated in FIG. 43A, and the second exposure is made with the aperture stop 16*z* illustrated in FIG. 43B. However, it is possible that the aperture stop 16*z* illustrated in FIG. 43B is used for the first exposure, and the aperture stop 16*y* illustrated in FIG. 43A is used for the second exposure.

In Modification 3 of the fourth embodiment, the same apertures 22, 24*b*1-24*b*4 as the apertures 22, 24*b*1-24*b*4 of the aperture stop 16*k* (see FIG. 27) are formed in the aperture stop 16*y*, and the same aperture 36 as the aperture 36 of the aperture stop 16*k* is formed in the aperture stop 16*z*. However, it is possible that the same apertures 22, 24*b*1-24*b*4 as the apertures 22, 24*b*1-24*b*4 of the aperture stop 16*l* (see FIG. 28) are formed in the aperture stop 16*y*, and the same apertures 36*a* as the aperture 36*a* of the aperture stop 16*l* is formed in the aperture stop 16*z*. It is possible that the same apertures 22, 24*c*1-24*c*4 as the apertures 22, 24*c*1-24*c*4 of the aperture stop 16*m* (see FIG. 31) are formed in the aperture stop 16*y*, and the same aperture 36*b* as the aperture 36*b* of the aperture stop 16*m* is formed in the aperture stop 16*z*. It is possible that the same apertures 22, 24*b*1-24*b*4 as the apertures 22, 24*b*1-24*b*4 of the aperture stop 16*n* (see FIG. 34) are formed in the aperture stop 16*y*, and the same aperture 36*c* as the aperture 36*c* of the aperture stop 16*n* is formed in the aperture stop 16*z*. It is possible that the same apertures 22, 24*b*1-24*b*6 as the apertures 22, 24*b*1-24*b*6 of the aperture stop 16*o* (see FIG. 37) are formed in the aperture stop 16*y*, and the aperture 36 as the aperture 36 of the aperture stop 16*o* is formed in the aperture stop 16*z*. It is possible that the same apertures 22, 24*b*1-24*b*8 as the apertures 22, 24*b*1-24*b*8 of the aperture stop 16*p* (see FIG. 38) are formed in the aperture stop 16*y*, and the same aperture 36 as the aperture 36 of the aperture stop 16*p* is formed in the aperture stop 16*z*.

In the sixth embodiment, the first exposure is made with the apertures stop 40*a* illustrated in FIG. 45A, the second exposure is made with the aperture stop 40*b* illustrated in FIG. 45B, and the third exposure is made with the aperture stop 40*c* illustrated in FIG. 45C. However, it is possible that the aperture stop 40*a* illustrated in FIG. 45A is used for the first exposure, the aperture stop 40*c* illustrated in FIG. 45C is used for the second exposure, and the aperture stop 40*b* illustrated in FIG. 45B is used for the third exposure. It is possible that the aperture stop 40*b* illustrated in FIG. 45B is used for the first exposure, the aperture stop 40*a* illustrated in FIG. 45A is used for the second exposure, and the aperture stop 40*c* illustrated in FIG. 45C is used for the third exposure. It is possible that the aperture stop 40*b* illustrated in FIG. 45B is used for the first exposure, the aperture stop 40*c* illustrated in FIG. 45C is used for the second exposure, and the aperture stop 40*a* illustrated in FIG. 45A is used for the third exposure. It is possible that the aperture stop 40*c* illustrated in FIG. 45C is used for the first exposure, the aperture stop 40*a* illustrated in FIG. 45A is used for the second exposure, and the aperture stop 40*b* illustrated in FIG. 45B is used for the third exposure. It is possible that the aperture stop 40*c* illustrated in FIG. 45C is used for the first exposure, the aperture sop 40*b* illustrated in FIG. 45B is used for the second exposure, and the aperture stop 40*a* illustrated in FIG. 45A is used for the third exposure.

In Modification 1 of the sixth embodiment, the first exposure is made with the aperture stop 40*d* illustrated in FIG.

46A, and the second exposure is made with the aperture stop 40e illustrated in FIG. 46B. However, it is possible that the aperture stop 40e illustrated in FIG. 46B is used for the first exposure, and the aperture stop 40d illustrated in FIG. 46A is used for the second exposure.

In Modification 2 of the sixth embodiment, the first exposure is made with the aperture stop 40f illustrated in FIG. 47A, and the second exposure is made with the aperture stop 40g illustrated in FIG. 47B. However, it is possible that the aperture stop 40g illustrated in FIG. 47B is used for the first exposure, and the aperture stop 40f illustrated in FIG. 47A is used for the second exposure.

In Modification 3 of the sixth embodiment, the first exposure is made with the aperture stop 40h illustrated in FIG. 48A, and the second exposure is made with the aperture stop 40i illustrated in FIG. 48B. However, it is possible that the aperture stop 40i illustrated in FIG. 48B is used for the first exposure, and the aperture stop 40h illustrated in FIG. 48A is used for the second exposure.

What is claimed is:

1. A semiconductor device manufacturing method comprising:
   transferring a pattern formed on a reticle to a semiconductor substrate by an exposure with oblique incidence illumination,
   the exposure being made with an illumination source aperture including a first annular-shaped aperture, and a plurality of second apertures formed around the first annular-shaped aperture, a circular-shaped shade region existing in the first annular-shaped aperture,
   the illumination source aperture being positioned between a light source of the oblique incidence illumination and the reticle
   wherein an area of the first annular-shaped aperture, and a total of areas of said plurality of the second apertures are substantially equal to each other.

2. The semiconductor device manufacturing method according to claim 1, wherein
   the illumination source aperture further includes a third annular-shaped aperture formed around the first annular-shaped aperture, an annular-shaped shade region existing between the first annular-shaped aperture and the third annular-shaped aperture.

3. The semiconductor device manufacturing method according to claim 1, wherein
   a number of said plurality of the second apertures is four or more.

4. The semiconductor device manufacturing method according to claim 1, wherein
   a diameter of the second apertures is smaller than an outer diameter of the first annular-shaped aperture.

5. The semiconductor device manufacturing method according to claim 1, wherein
   the second apertures are arranged inside an effective range of the illumination source aperture.

6. The semiconductor device manufacturing method according to claim 1, wherein
   the reticle further has an assist pattern arranged near the pattern.

7. A semiconductor device manufacturing method comprising:
   transferring a pattern formed on a reticle to a semiconductor substrate by an exposure with oblique incidence illumination,
   the exposure being made with an illumination source aperture including a first annular-shaped aperture, and a plurality of second apertures formed around the first annular-shaped aperture, a circular-shaped shade region existing in the first annular-shaped aperture,
   the illumination source aperture being positioned between a light source of the oblique incidence illumination and the reticle,
   wherein the second apertures are positioned partially outside an effective range of the illumination source aperture.

8. A semiconductor device manufacturing method comprising:
   transferring a pattern formed on a reticle to a semiconductor substrate by an exposure with oblique incidence illumination,
   the exposure being made with an illumination source aperture including a first annular-shaped aperture, and a plurality of second apertures formed around the first annular-shaped aperture, a circular-shaped shade region existing in the first annular-shaped aperture,
   the illumination source aperture being positioned between a light source of the oblique incidence illumination and the reticle,
   wherein third apertures are further formed respectively between said plurality of the second apertures around the first annular-shaped aperture, and
   the third apertures are partially positioned in the first annular-shaped aperture.

9. A semiconductor device manufacturing method comprising:
   transferring a pattern formed on a reticle to a semiconductor substrate by an exposure with oblique incidence illumination,
   the exposure being made with an illumination source aperture including a first annular-shaped aperture, and a plurality of second apertures formed around the first annular-shaped aperture, a circular-shaped shade region existing in the first annular-shaped aperture,
   the illumination source aperture being positioned between a light source of the oblique incidence illumination and the reticle,
   wherein third apertures are further formed respectively between said plurality of the second apertures around the first annular-shaped aperture, and
   a diameter of the third aperture is smaller than a diameter of the second aperture.

10. A semiconductor device manufacturing method comprising:
    transferring a pattern formed on a reticle to a semiconductor substrate by an exposure with oblique incidence illumination,
    the exposure being made with an illumination source aperture including a first annular-shaped aperture, and a plurality of second apertures formed around the first annular-shaped aperture, a circular-shaped shade region existing in the first annular-shaped aperture,
    the illumination source aperture being positioned between a light source of the oblique incidence illumination and the reticle,
    wherein the illumination source aperture further includes a third annular-shaped aperture formed around the first annular-shaped aperture, an annular-shaped shade region existing between the first annular-shaped aperture and the third annular-shaped aperture, and
    the second apertures are positioned outside the third aperture.

11. A semiconductor device manufacturing method comprising:
- transferring a pattern formed on a reticle to a semiconductor substrate by an exposure with oblique incidence illumination,
- the exposure being made with an illumination source aperture including a first annular-shaped aperture, and a plurality of second apertures formed around the first annular-shaped aperture, a circular-shaped shade region existing in the first annular-shaped aperture,
- the illumination source aperture being positioned between a light source of the oblique incidence illumination and the reticle,
- wherein the illumination source aperture further includes a third annular-shaped aperture formed around the first annular-shaped aperture, an annular-shaped shade region existing between the first annular-shaped aperture and the third annular-shaped aperture, and
- the second apertures are partially positioned in the third aperture.

12. A semiconductor device manufacturing method comprising:
- transferring a pattern formed on a reticle to a semiconductor substrate by an exposure with oblique incidence illumination,
- the exposure being made with an illumination source aperture including a first annular-shaped aperture, and a plurality of second apertures formed around the first annular-shaped aperture, a circular-shaped shade region existing in the first annular-shaped aperture,
- the illumination source aperture being positioned between a light source of the oblique incidence illumination and the reticle,
- wherein the illumination source aperture further includes a third annular-shaped aperture formed around the first annular-shaped aperture, an annular-shaped shade region existing between the first annular-shaped aperture and the third annular-shaped aperture, and
- the second apertures are positioned inside the third aperture.

13. A semiconductor device manufacturing method comprising:
- transferring a pattern formed on a reticle to a semiconductor substrate by an exposure with oblique incidence illumination,
- the exposure being made with an illumination source aperture including a first annular-shaped aperture, and a plurality of second apertures formed around the first annular-shaped aperture, a circular-shaped shade region existing in the first annular-shaped aperture,
- the illumination source aperture being positioned between a light source of the oblique incidence illumination and the reticle,
- wherein the illumination source aperture further includes a third annular-shaped aperture formed around the first annular-shaped aperture, an annular-shaped shade region existing between the first annular-shaped aperture and the third annular-shaped aperture, and
- the illumination source aperture further includes a fourth aperture formed inside the first annular-shaped aperture.

* * * * *